United States Patent
Sakui et al.

(10) Patent No.: US 11,776,620 B2
(45) Date of Patent: Oct. 3, 2023

(54) MEMORY DEVICE INCLUDING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 196 days.

(21) Appl. No.: 17/478,282

(22) Filed: Sep. 17, 2021

(65) Prior Publication Data

US 2022/0208254 A1 Jun. 30, 2022

Related U.S. Application Data

(63) Continuation of application No. PCT/JP2020/048952, filed on Dec. 25, 2020.

(51) Int. Cl.
G11C 11/4096 (2006.01)
H10B 12/00 (2023.01)

(52) U.S. Cl.
CPC .......... *G11C 11/4096* (2013.01); *H10B 12/50* (2023.02)

(58) Field of Classification Search
CPC . G11C 11/4096; G11C 11/404; G11C 11/406; G11C 11/4076; G11C 11/4091; H10B 12/50; H10B 12/00; H01L 29/66666
(Continued)

(56) References Cited

U.S. PATENT DOCUMENTS 7,279,742 B2 * 10/2007 Gruning-Von Schwerin ............... H10B 12/053
257/329
2003/0111681 A1 6/2003 Kawanaka
(Continued)

FOREIGN PATENT DOCUMENTS

| JP | 02-188966 A | 7/1990 |
| JP | 03-171768 A | 7/1991 |
| JP | 3957774 B2 | 8/2007 |

OTHER PUBLICATIONS

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (Apr. 2007), 7 pages.

(Continued)

Primary Examiner — Michael T Tran
(74) Attorney, Agent, or Firm — Crowell & Moring LLP

(57) ABSTRACT

A semiconductor base material stands on a substrate in a vertical direction or extends in a horizontal direction. Between first and second impurity layers disposed at the ends of the semiconductor base material, first and second gate insulating layers and first and second gate conductor layers are disposed around the semiconductor base material. A memory write operation is performed where voltages are applied to the first and second impurity layers and the first and second gate conductor layers to cause an impact ionization phenomenon to occur in a channel region, and among generated groups of electrons and positive holes, the group of electrons are discharged from the channel region and some of the group of positive holes are retained in the channel region. A memory erase operation is performed where the retained group of positive holes are discharged via any of or both of the first and second impurity layers.

24 Claims, 46 Drawing Sheets

(58) Field of Classification Search
USPC .................................. 365/189.011, 230.05
See application file for complete search history.

(56) References Cited

U.S. PATENT DOCUMENTS

| | | | |
|---|---|---|---|
| 2006/0049444 A1 | 3/2006 | Shino | |
| 2008/0137394 A1 | 6/2008 | Shimano et al. | |
| 2008/0173936 A1* | 7/2008 | Yoon ................. | H01L 29/66666 257/E27.06 |
| 2008/0212366 A1 | 9/2008 | Ohsawa | |
| 2010/0213539 A1* | 8/2010 | Masuoka ............ | H01L 27/1203 257/329 |
| 2010/0308466 A1* | 12/2010 | Takesako ............. | H10B 12/482 257/773 |
| 2016/0049422 A1* | 2/2016 | Kim ....................... | H10B 43/27 257/329 |
| 2017/0263681 A1* | 9/2017 | Toriyama ............. | H10N 70/882 |
| 2019/0378841 A1* | 12/2019 | Bae ....................... | H01L 23/528 |
| 2020/0075077 A1* | 3/2020 | Kim ....................... | G11C 11/39 |
| 2021/0193661 A1* | 6/2021 | Lee ....................... | H10B 12/00 |
| 2021/0265426 A1* | 8/2021 | Nakamura ............ | H10N 70/011 |
| 2022/0068957 A1* | 3/2022 | Yeh ....................... | H10B 43/27 |
| 2022/0320092 A1* | 10/2022 | Chiang ................. | H01L 27/0928 |
| 2022/0328249 A1* | 10/2022 | Yokoyama ............ | H01L 27/101 |
| 2023/0018059 A1* | 1/2023 | Tang ................. | H01L 29/66666 |
| 2023/0107258 A1* | 4/2023 | Lee ................... | H01L 29/78642 257/288 |
| 2023/0110504 A1* | 4/2023 | Zhu ................... | H01L 29/78642 257/295 |

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578, (1991).

H. Chung, H. Kim, H. Kim, K. Kim, S. Kim, K. Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase change Memmory," Proceeding of IEEE, vol. 98, No. 12, Dec., pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electrons," IEEE Electron Device Letter, vol. 31, No. 5, pp. 405-407 (2010).

J. Wan, L. Royer, A. Zaslavsky, and S. Cristoloveanu: "A Compact Capacitor-Less High-Speed DRAM Using Field Effect-Controlled Charge Regeneration," Electron Device Letters, vol. 33, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng, Y. He, G. Du, X. Liu and X. Zhang: "Experimental investigation of self heating effect (SHE) in multiple-fin SOI FinFETs," Semicond. Sci. Technol. 29 (2014) 115021 (7pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

* cited by examiner

Vb: Built-in Voltage 0.7V

FIG. 2D

| | SIGNAL LINE | APPLIED VOLTAGE |
|---|---|---|
| "0" ERASING | BIT LINE BL | $V_{SS}$ (e.g. 0V) |
| | SOURCE LINE SL | $V_{ERA}$ (e.g. -3V) |
| | PLATE LINE PL | $V_{ErasePL}$ (e.g. 2V) |
| | WORD LINE WL | $V_{SS}$ (e.g. 0V) |
| | FLOATING BODY FB | $V_{ERA} + V_b$ (e.g. -3V + 0.7V = -2.3V) |

Vb: BUILT-IN VOLTAGE OF PN JUNCTION 0.7V

INVERSION LAYER IS FORMED IN "1" WRITE MEMORY CELL. AS A RESULT, ELECTRIC FIELD FROM PL IS BLOCKED.

AS "1" IS WRITTEN, THRESHOLD VOLTAGES Vth OF PL AND WL TRANSISTORS DECREASE, POSITIVE FEEDBACK OCCURS, AND WRITING IS ACCELERATED.

FIG. 31

| | SIGNAL LINE | APPLIED VOLTAGE |
|---|---|---|
| "1" WRITING | BIT LINE BL | $V_{ProgBL}$ (e.g. 3V) |
| | SOURCE LINE SL | $V_{SS}$ (e.g. 0V) |
| | PLATE LINE PL | $V_{ProgPL}$ (e.g. 2V) |
| | WORD LINE WL | $V_{ProgWL}$ (e.g. 5V) |
| | FLOATING BODY FB | Vb (e.g. 0.7V) |

Vb: BUILT-IN VOLTAGE OF PN JUNCTION 0.7V

FIG. 4D

| SELECTION /NON-SELECTION | SIGNAL LINE | APPLIED VOLTAGE |
|---|---|---|
| READING | BIT LINE BL | $V_{ReadBL}$ (e.g. 1V) |
| | SOURCE LINE SL | $V_{SS}$ (e.g. 0V) |
| | PLATE LINE PL | $V_{ReadPL}$ (e.g. 2V) |
| | WORD LINE WL | $V_{ReadWL}$ (e.g. 2V) |
| | FLOATING BODY FB "1" | Vb (e.g. 0.7V) |
| | FLOATING BODY FB "0" | $V_{ERA}$ + Vb (e.g. -3V+0.7V = -2.3V) |

Vb: BUILT-IN VOLTAGE OF PN JUNCTION 0.7V $$C_{FB} = C_{PL} + C_{WL} + C_{BL} + C_{SL}$$

$$\Delta V_{FB} = V_{FB2} - V_{FB1}$$
$$= \frac{C_{WL}}{C_{PL} + C_{WL} + C_{BL} + C_{SL}} \times V_{ReadWL} \quad (1)$$

FIG. 5B

| | SIGNAL LINE | APPLIED VOLTAGE |
|---|---|---|
| "1" WRITING | BIT LINE BL | $V_{ProgBL}$ (e.g. 3V) |
| | SOURCE LINE SL | $V_{SS}$ (e.g. 0V) |
| | PLATE LINE PL | $V_{ProgPL}$ (e.g. 5V) |
| | WORD LINE WL | $V_{ProgWL}$ (e.g. 2V) |
| | FLOATING BODY FB | Vb (e.g. 0.7V) |

Vb: BUILT-IN VOLTAGE OF PN JUNCTION 0.7V

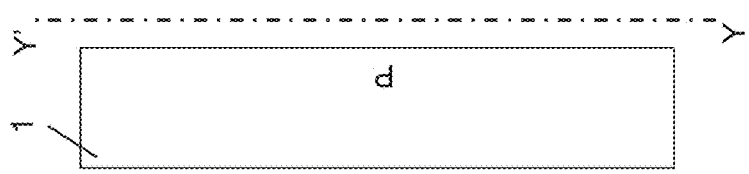
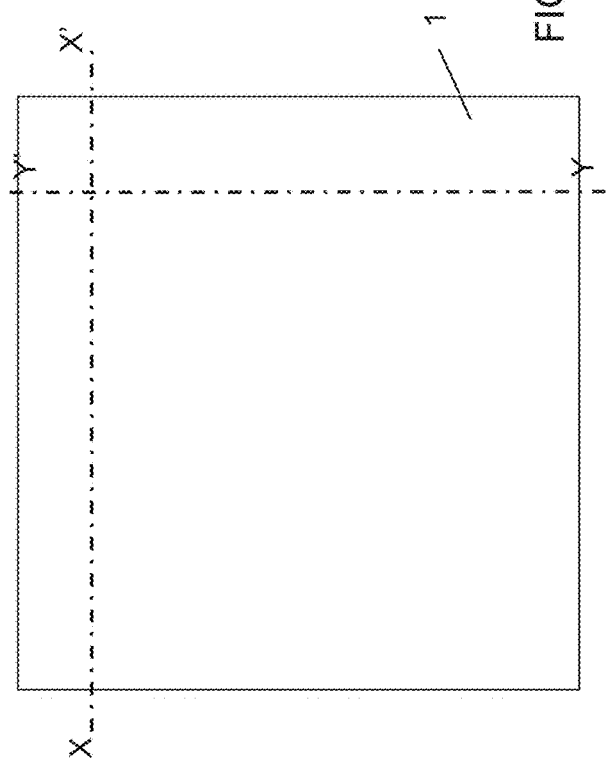
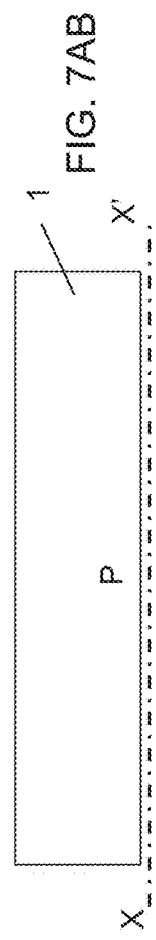

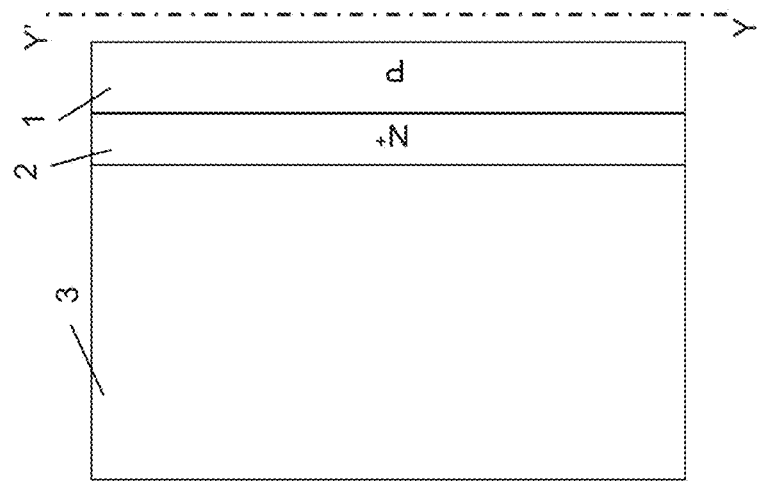
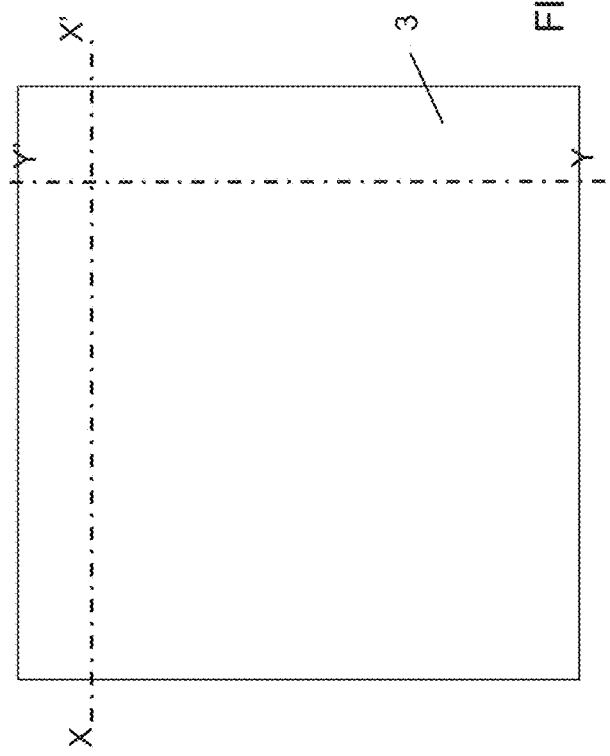
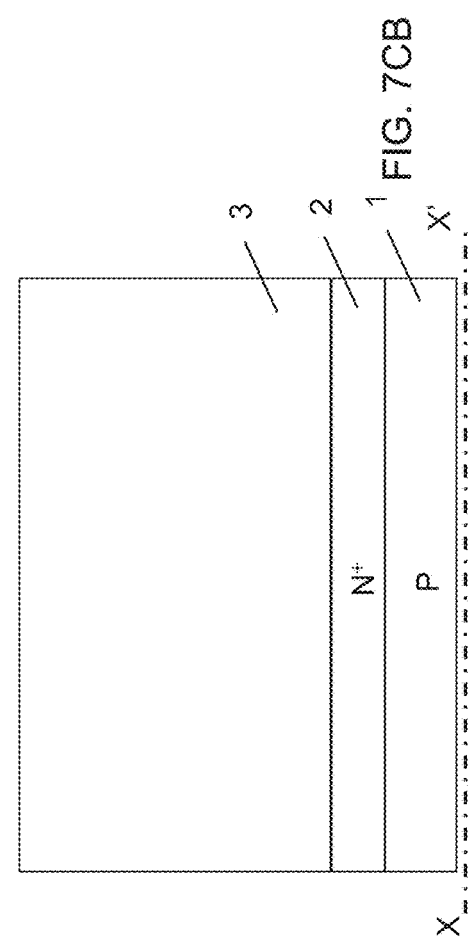
FIG. 7CA
FIG. 7CB
FIG. 7CC

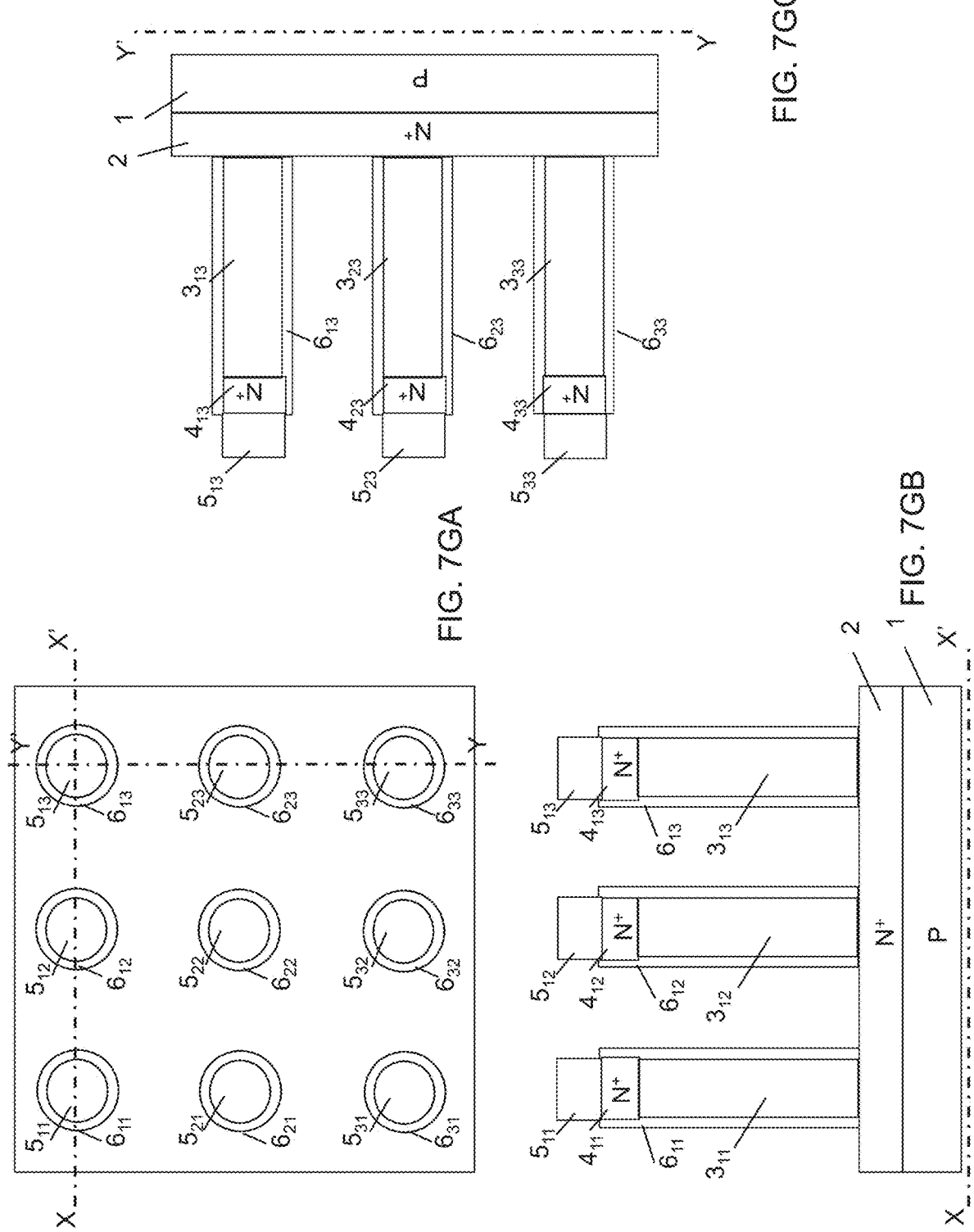

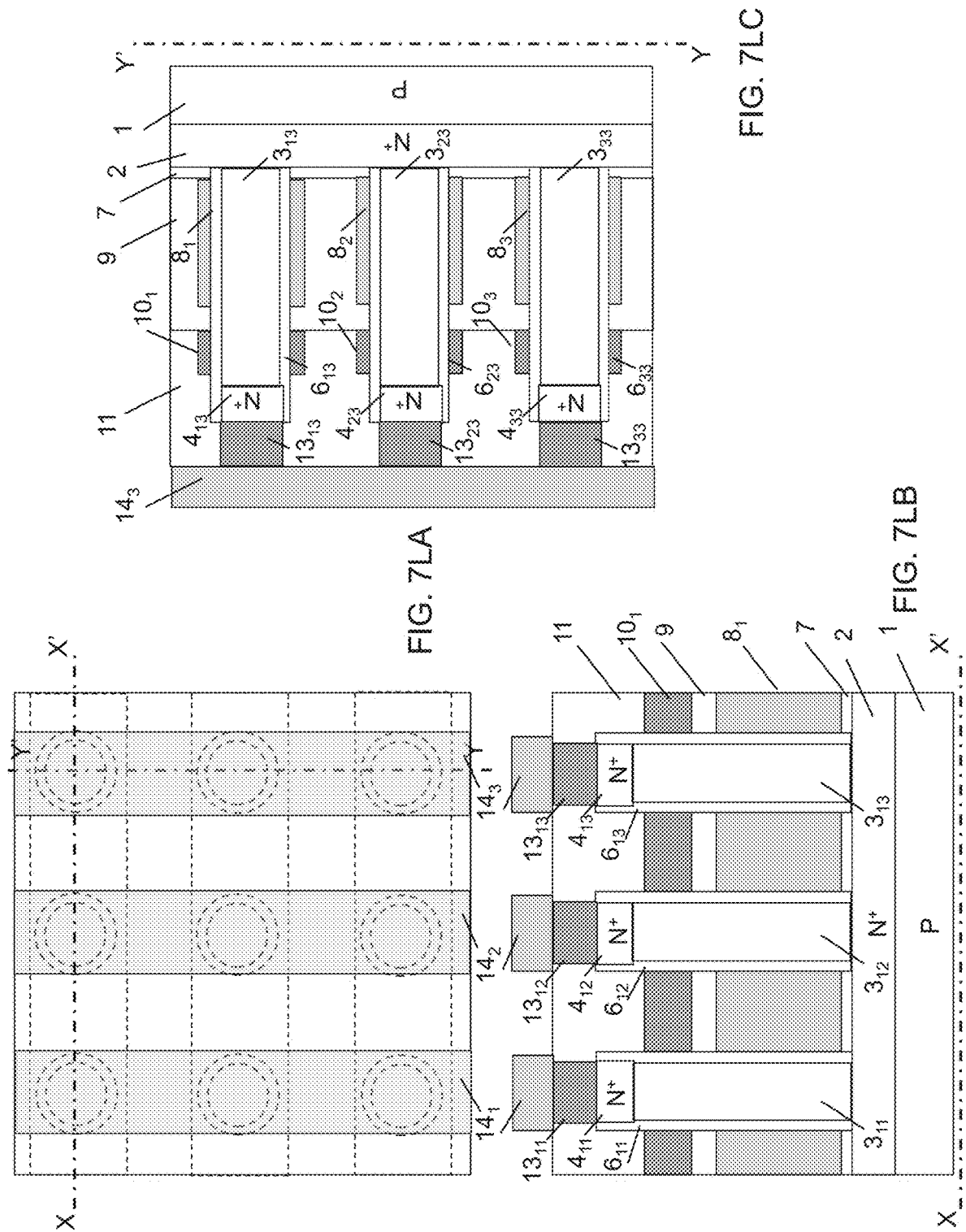

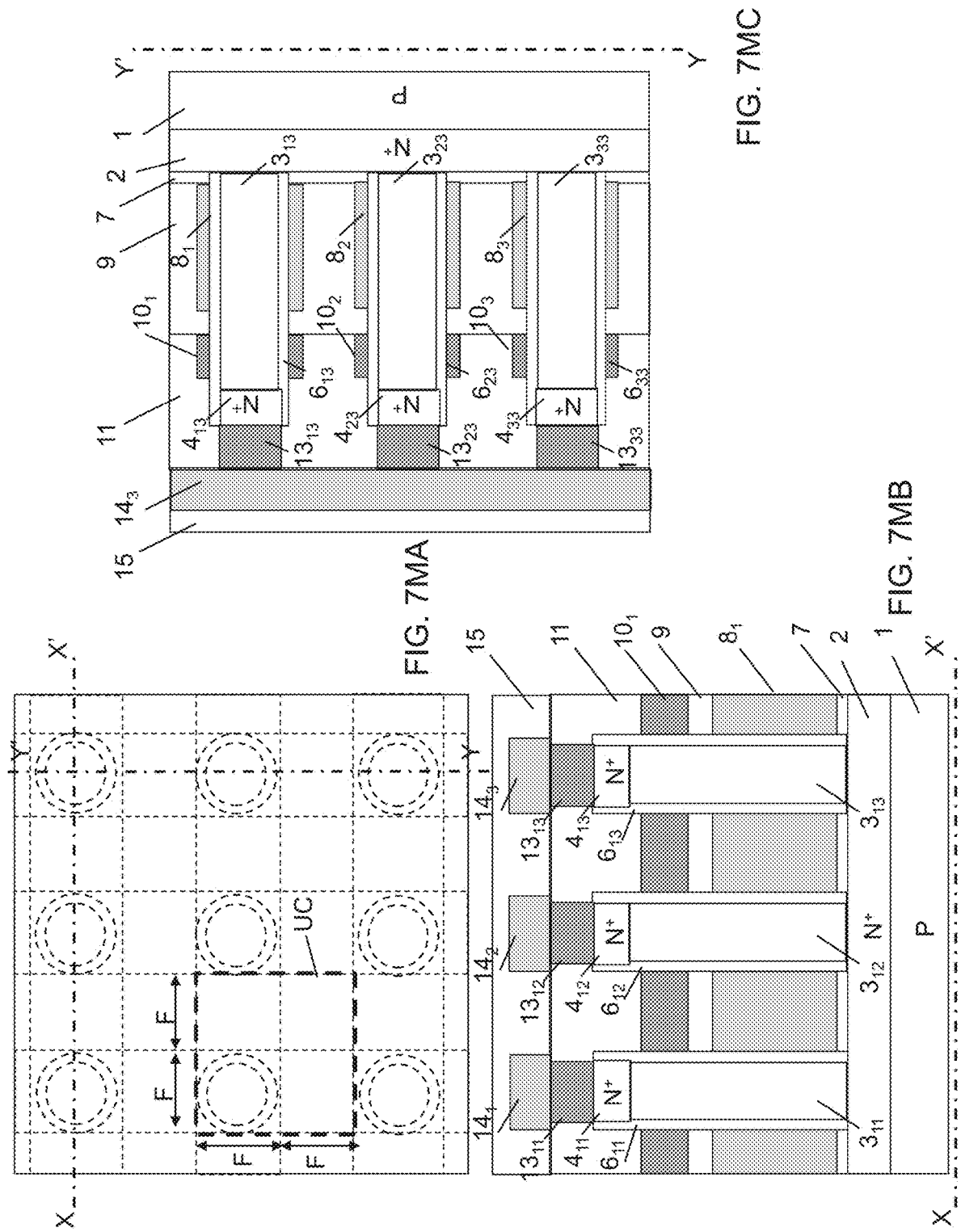

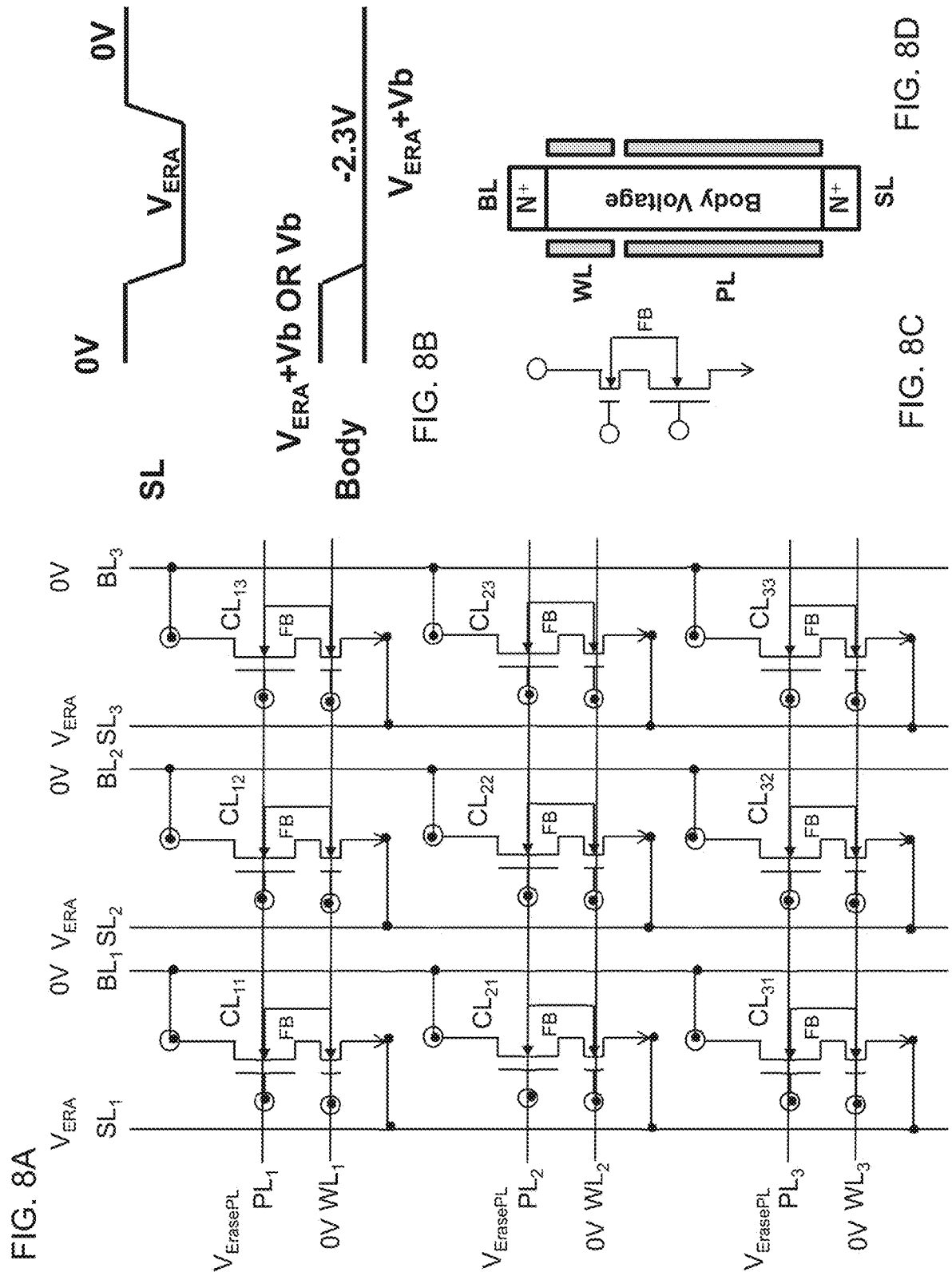

FIG. 8E

| SELECTION/NON-SELECTION | SIGNAL LINE | APPLIED VOLTAGE |
|---|---|---|
| "0" ERASE BLOCK | BIT LINE BL | $V_{SS}$ (e.g. 0V) |
| | SOURCE LINE SL | $V_{ERA}$ (e.g. -3V) |
| | PLATE LINE PL | $V_{ErasePL}$ (e.g. 2V) |
| | WORD LINE WL | $V_{SS}$ (e.g. 0V) |
| | FLOATING BODY FB | $V_{ERA} + V_b$ (e.g. -3V+0.7V = -2.3V) |
| NON-ERASE BLOCK (RECORDED-DATA MAINTAINED BLOCK) | BIT LINE BL | $V_{SS}$ (e.g. 0V) |
| | SOURCE LINE SL | $V_{SS}$ (e.g. 0V) |
| | PLATE LINE PL | $V_{ErasePL}$ (e.g. 3V) |
| | WORD LINE WL | $V_{SS}$ (e.g. 0V) |
| | FLOATING BODY FB | $V_{SS}$ (e.g. 0V) |

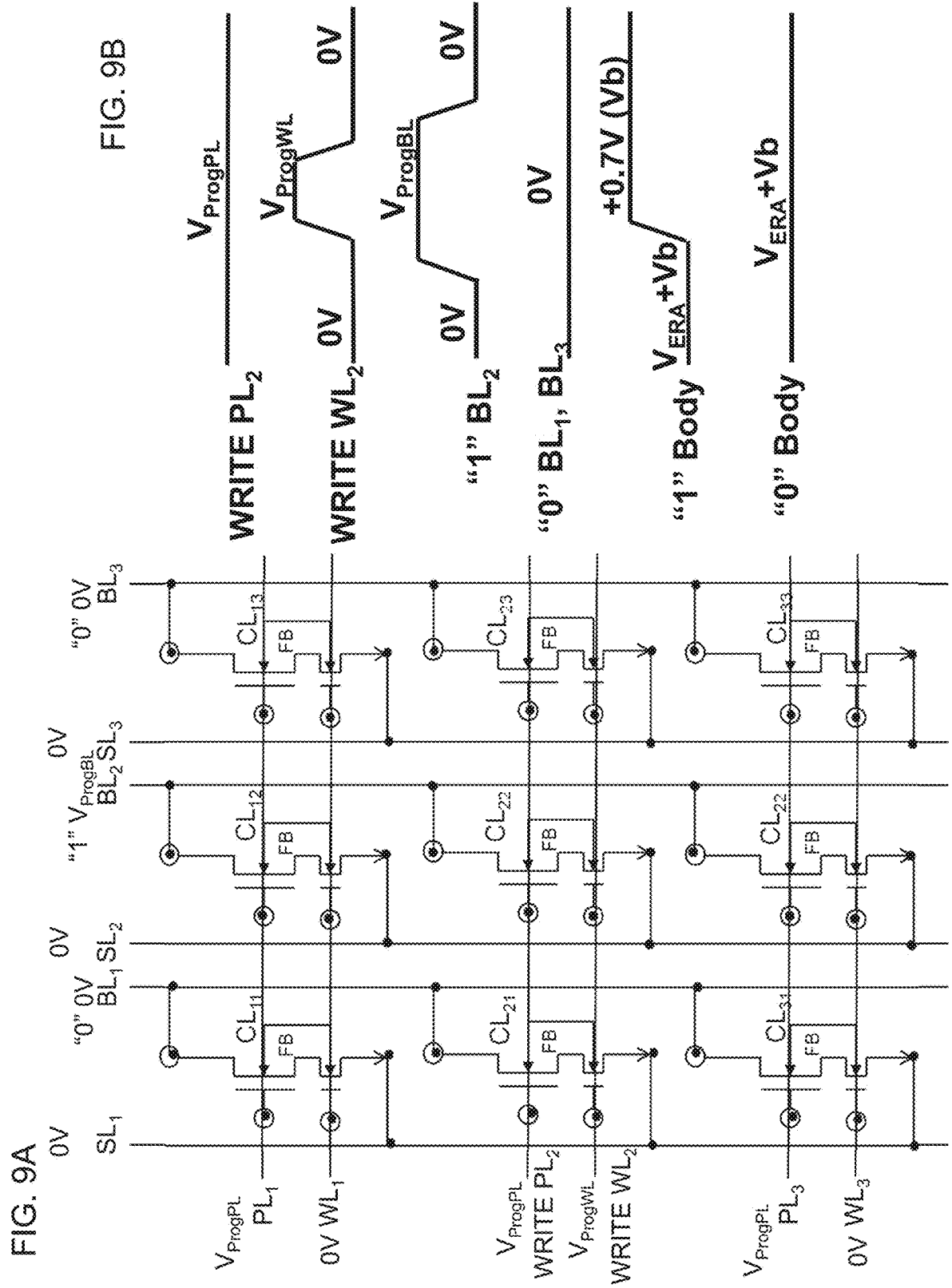

FIG. 9C

| SELECTION /NON-SELECTION | SIGNAL LINE | APPLIED VOLTAGE |
|---|---|---|
| "1" WRITE PAGE | BIT LINE BL | $V_{ProgBL}$ (e.g. 3V) |
| | SOURCE LINE SL | $V_{SS}$ (e.g. 0V) |
| | PLATE LINE PL | $V_{ProgPL}$ (e.g. 2V) |
| | WORD LINE WL | $V_{ProgWL}$ (e.g. 5V) |
| | FLOATING BODY FB | Vb (e.g. 0.7V) |
| NON-WRITE PAGE ("0" MAINTAINED PAGE) | BIT LINE BL | $V_{SS}$ (e.g. 0V) |
| | SOURCE LINE SL | $V_{SS}$ (e.g. 0V) |
| | PLATE LINE PL | $V_{ProgPL}$ (e.g. 2V) |
| | WORD LINE WL | $V_{SS}$ (e.g. 0V) |
| | FLOATING BODY FB | $V_{SS}$ (e.g. 0V) |

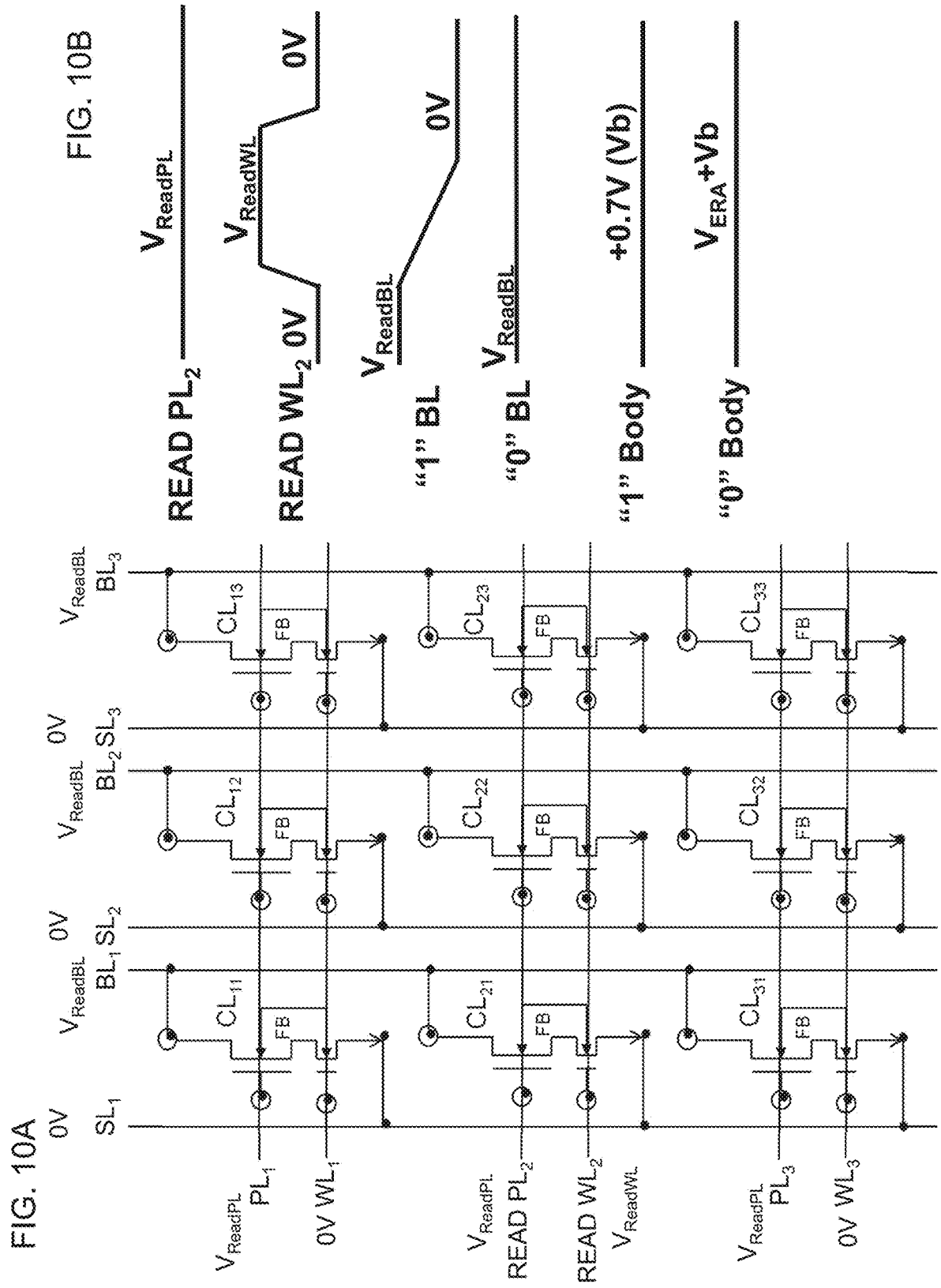

FIG. 10C

| SELECTION /NON-SELECTION | SIGNAL LINE | APPLIED VOLTAGE |
|---|---|---|
| READ PAGE | BIT LINE BL | $V_{ReadBL}$ (e.g. 1V) |
| | SOURCE LINE SL | $V_{SS}$ (e.g. 0V) |
| | PLATE LINE PL | $V_{ReadPL}$ (e.g. 2V) |
| | WORD LINE WL | $V_{ReadWL}$ (e.g. 2V) |
| | FLOATING BODY FB "1" | Vb (e.g. 0.7V) |
| | FLOATING BODY FB "0" | $V_{ERA}$ + Vb (e.g. -3V+0.7V = -2.3V) |
| NON-READ PAGE | BIT LINE BL | $V_{SS}$ (e.g. 0V) |
| | SOURCE LINE SL | $V_{SS}$ (e.g. 0V) |
| | PLATE LINE PL | $V_{ReadPL}$ (e.g. 2V) |
| | WORD LINE WL | $V_{SS}$ (e.g. 0V) |
| | FLOATING BODY FB "1" | Vb (e.g. 0.7V) |
| | FLOATING BODY FB "0" | $V_{ERA}$ + Vb (e.g. -3V+0.7V = -2.3V) |

FIG. 11C

| SELECTION/NON-SELECTION | SIGNAL LINE | APPLIED VOLTAGE |
|---|---|---|
| REFRESHED BLOCK | BIT LINE BL | $V_{RefreshBL}$ (e.g. 3V) |
| | SOURCE LINE SL | $V_{SS}$ (e.g. 0V) |
| | PLATE LINE PL | $V_{RefreshPL}$ (e.g. 2V) |
| | WORD LINE WL | $V_{RefreshWL}$ (e.g. 3V) |
| | FLOATING BODY FB "1" | Vb (e.g. 0.7V) |
| | FLOATING BODY FB "0" | $V_{ERA}$ + Vb (e.g. -3V+0.7V = -2.3V) |
| NON-REFRESHED BLOCK | BIT LINE BL | $V_{SS}$ (e.g. 0V) |
| | SOURCE LINE SL | $V_{SS}$ (e.g. 0V) |
| | PLATE LINE PL | $V_{RefreshPL}$ (e.g. 2V) |
| | WORD LINE WL | $V_{SS}$ (e.g. 0V) |
| | FLOATING BODY FB "1" | Vb (e.g. 0.7V) |
| | FLOATING BODY FB "0" | $V_{ERA}$ + Vb (e.g. -3V+0.7V = -2.3V) |

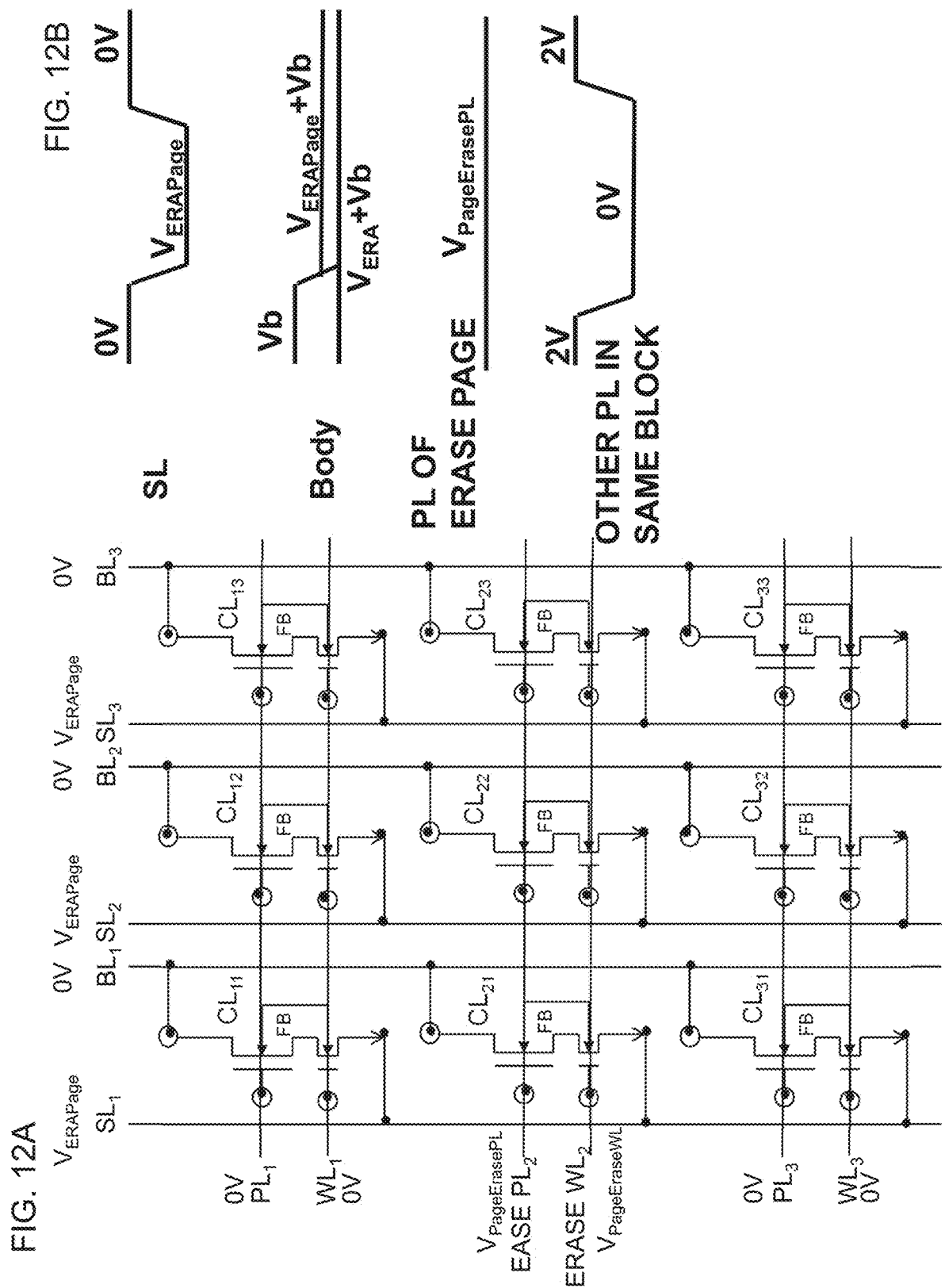

FIG. 12C

| SELECTION/NON-SELECTION | SIGNAL LINE | APPLIED VOLTAGE |
|---|---|---|
| ERASE PAGE | BIT LINE BL | $V_{SS}$ (e.g. 0V) |
| | SOURCE LINE SL | $V_{ERAPage}$ (e.g. -1V) |
| | PLATE LINE PL | $V_{PageErasePL}$ (e.g. 2V) |
| | WORD LINE WL | $V_{PageEraseWL}$ (e.g. 0V) |
| | FLOATING BODY FB | $V_{ERAPage} + Vb$ (e.g. -1V+0.7V = -0.3V) |
| NON-ERASE PAGE IN SAME BLOCK | BIT LINE BL | $V_{ERAPage}$ (e.g. -1V) |
| | SOURCE LINE SL | $V_{SS}$ (e.g. 0V) |
| | PLATE LINE PL | $V_{SS}$ (e.g. 0V) |
| | WORD LINE WL | $V_{SS}$ (e.g. 0V) |
| | FLOATING BODY FB "1" | $Vb$ (e.g. 0.7V) |
| | FLOATING BODY FB "0" | $V_{ERA} + Vb$ (e.g. -3V+0.7V = -2.3V) |

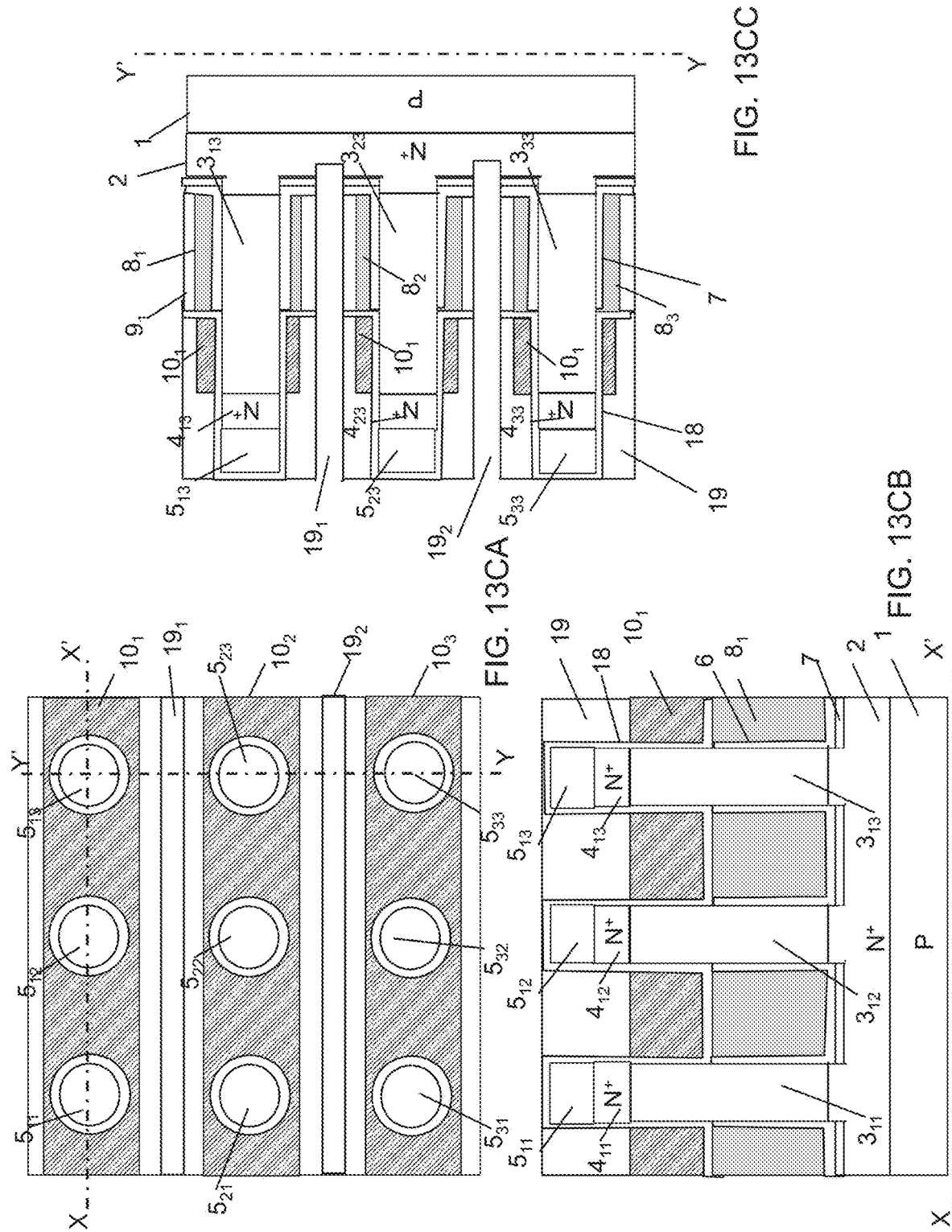

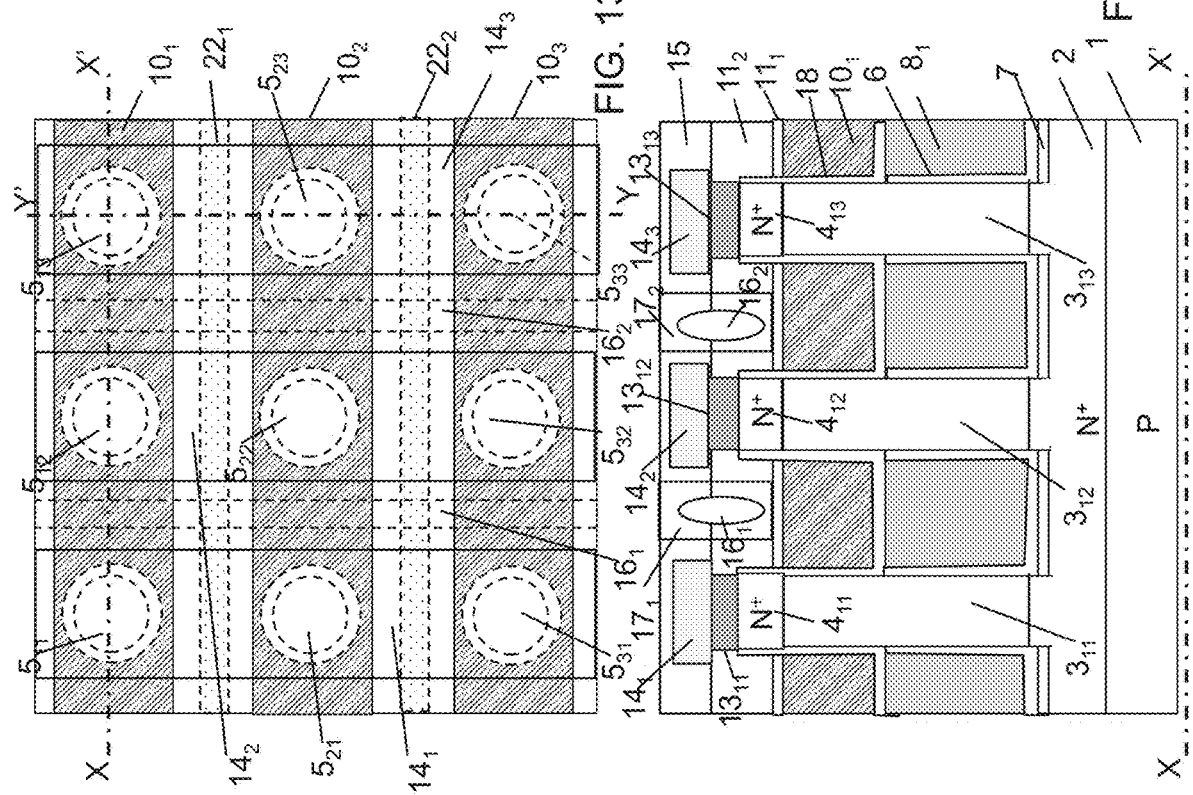

$$C_{FB} = C_{WL} + C_{BL} + C_{SL} \quad \text{EXPRESSION (2)}$$

$$\Delta V_{FB} = V_{FB2} - V_{FB1}$$
$$= \frac{C_{WL}}{C_{WL} + C_{BL} + C_{SL}} \times V_{ProgWL} \quad \text{EXPRESSION (3)}$$

$$\beta = \frac{C_{WL}}{C_{WL} + C_{BL} + C_{SL}} \quad \text{EXPRESSION (4)}$$

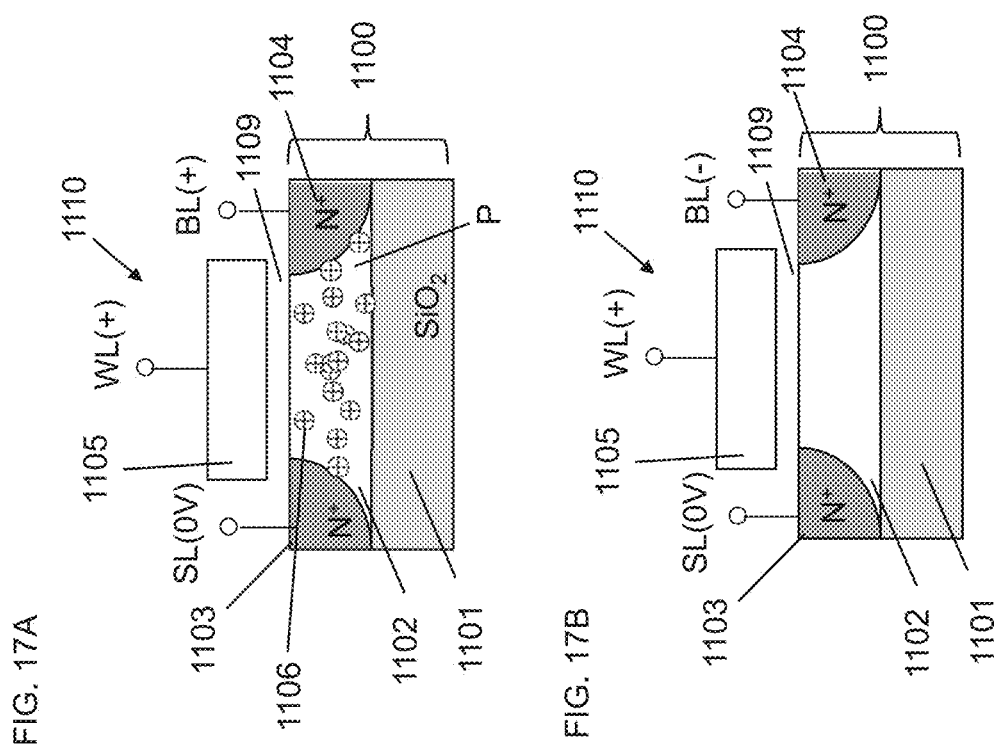

//‍
MEMORY DEVICE INCLUDING SEMICONDUCTOR ELEMENT

RELATED APPLICATIONS

The present application is a continuation application of PCT/JP2020/048952, filed Dec. 25, 2020, the entire contents of which are incorporated herein by reference.

BACKGROUND OF THE INVENTION

1. Field of the Invention

The present invention relates to a memory device including a semiconductor element.

2. Description of the Related Art

Recently, there has been a demand for highly integrated and high-performance memory devices in development of Large Scale Integration (LSI) technology.

Typical planar metal oxide semiconductor (MOS) transistors have a channel that extends in a horizontal direction along the upper surface of the semiconductor substrate. In contrast, surrounding gate transistors (SGTs) have a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991), which are incorporated herein by these references). Accordingly, the density of semiconductor devices can be made higher with SGTs than with planar MOS transistors. Such SGTs can be used as selection transistors to implement highly integrated memories, such as a dynamic random access memory (DRAM) (see, for example, H. Chung, H. Kim, H. Kim, K. Kim, S. Kim, K. Dong, J. Kim, Y. C. Oh, Y. Hwang, H. Hong, G. Jin, and C. Chung: "Novel 4F² DRAM Cell with Vertical Pillar Transistor (VPT)", 2011 Proceeding of the European Solid-State Device Research Conference, (2011), which is incorporated herein by this reference) to which a capacitor is connected, a phase change memory (PCM) (see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010), which is incorporated herein by this reference) to which a resistance change element is connected, a resistive random access memory (RRAM) (see, for example, W. K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007), which is incorporated herein by this reference), and a magneto-resistive random access memory (MRAM) (see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015), which is incorporated herein by this reference) that changes the resistance by changing the orientation of a magnetic spin with a current. Further, there exists, for example, a DRAM memory cell (see, for example, M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electrons", IEEE Electron Device Letter, Vol. 31, No. 5, pp. 405-407 (2010) and Japanese Unexamined Patent Application Publication No. 3-171768, which are incorporated herein by these references) constituted by a single MOS transistor and including no capacitor. The present application relates to a dynamic flash memory that can be constituted only by a MOS transistor and including no resistance change element or capacitor.

FIGS. 15A to 15D illustrate a write operation of a DRAM memory cell constituted by a single MOS transistor and including no capacitor described above, FIGS. 16A and 16B illustrate problems in the operation, and FIGS. 17A to 17C illustrate a read operation (see J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Design of a Capacitorless 1T-DRAM Cell Using Gate-Induced Drain-Leakage (GIDL) Current for Low-Power and High-Speed Embedded Memory", IEEE IEDM (2006), which are incorporated herein by these references). FIG. 15A illustrates a "1" write state. Here, the memory cell is formed of a silicon-on-insulator (SOI) substrate 1100, is constituted by a source N⁺ layer 1103 to which a source line SL is connected, a drain N⁺ layer 1104 to which a bit line BL is connected, a gate conductor layer 1105 to which a word line WL is connected, and a floating body 1102 of a MOS transistor 1110a, and includes no capacitor. The single MOS transistor 1110a constitutes the DRAM memory cell. Directly under the floating body 1102, a SiO₂ layer 1101 of the SOI substrate 1100 is in contact with the floating body 1102. To write "1" to the memory cell constituted by the single MOS transistor 1110a, the MOS transistor 1110a is operated in the linear region. That is, a channel 1107 for electrons extending from the source N⁺ layer 1103 has a pinch-off point 1108 and does not reach the drain N⁺ layer 1104 to which the bit line BL is connected. When a high voltage is applied to both the bit line BL connected to the drain N⁺ layer 1104 and the word line WL connected to the gate conductor layer 1105, and the MOS transistor 1110a is operated with the gate voltage that is about one-half of the drain voltage, the electric field intensity becomes maximum at the pinch-off point 1108 that is in the vicinity of the drain N⁺ layer 1104. As a result, accelerated electrons that flow from the source N⁺ layer 1103 toward the drain N⁺ layer 1104 collide with the Si lattice, and with kinetic energy lost at the time of collision, electron-positive hole pairs are generated (impact ionization phenomenon). Most of the generated electrons (not illustrated) reach the drain N⁺ layer 1104. Further, a small proportion of the electrons that are very hot jump over a gate oxidation film 1109 and reach the gate conductor layer 1105. Simultaneously, positive holes 1106 are generated with which the floating body 1102 is charged. In this case, the generated positive holes 1106 contribute to an increase in the majority carriers because the floating body 1102 is P-type Si. When the floating body 1102 is filled with the generated positive holes 1106 and the voltage of the floating body 1102 becomes higher than the voltage of the source N+ layer 1103 by Vb or more, further generated positive holes 1106 are discharged to the source N+ layer 1103. Here, Vb is the built-in voltage of the PN junction between the source N+ layer 1103 and the floating body 1102 of the P layer and is equal to about 0.7 V. FIG. 15B illustrates a state where the floating body 1102 is charged to saturation with the generated positive holes 1106.

Now, a "0" write operation of a memory cell 1110b is described with reference to FIG. 15C. For the common selected word line WL, the memory cell 1110a to which "1" is written and the memory cell 1110b to which "0" is written at random are present. FIG. 15C illustrates a state of a rewrite from a "1" write state to a "0" write state. To write "0", the voltage of the bit line BL is set to a negative bias, and the PN junction between the drain N+ layer 1104 and the floating body 1102 of the P layer is forward biased. As a result, the positive holes 1106 in the floating body 1102 generated in advance in the previous cycle flow into the drain N+ layer 1104 that is connected to the bit line BL. When the write operation ends, the two memory cells are in states such that the memory cell 1110a (FIG. 15B) is filled with the generated positive holes 1106 and in the memory cell 1110b, the generated positive holes 1106 are discharged (FIG. 15C). The potential of the floating body 1102 of the memory cell 1110a filled with the positive holes 1106 becomes higher than the potential of the floating body 1102 in which generated positive holes are not present. Therefore, the threshold voltage of the memory cell 1110a becomes lower than the threshold voltage of the memory cell 1110b. This is illustrated in FIG. 15D.

Now, problems in the operation of the memory cell constituted by the single MOS transistor are described with reference to FIGS. 16A and 16B. As illustrated in FIG. 16A, the capacitance $C_{FB}$ of the floating body 1102 is equal to the sum of a capacitance $C_{WL}$ between the gate conductor layer 1105 to which the word line WL is connected and the floating body 1102, the junction capacitance $C_{SL}$ of the PN junction between the source N+ layer 1103 to which the source line SL is connected and the floating body 1102, and the junction capacitance $C_{BL}$ of the PN junction between the drain N+ layer 1104 to which the bit line BL is connected and the floating body 1102 and is expressed as follows.

$$C_{FB}=C_{WL}+C_{BL}+C_{SL} \quad (1)$$

Therefore, a change in the word line voltage $V_{WL}$ at the time of writing affects the voltage of the floating body 1102 that functions as a storage node (contact point) of the memory cell. This is illustrated in FIG. 16B. When the word line voltage $V_{WL}$ rises from 0 V to $V_{ProgWL}$ at the time of writing, the voltage $V_{FB}$ of the floating body 1102 rises from $V_{FB1}$, which is a voltage in the initial state before the word line voltage changes, to $V_{FB2}$ due to capacitive coupling with the word line WL. The voltage change amount $\Delta V_{FB}$ is expressed as follows.

$$\Delta V_{FB}=V_{FB2}-V_{FB1}=C_{WL}/(C_{WL}+C_{BL}+C_{SL})\times V_{ProgWL} \quad (2)$$

Here, $C_{WL}/(C_{WL}+C_{BL}+C_{SL})$ is expressed as follows.

$$\beta=C_{WL}/(C_{WL}+C_{BL}+C_{SL}) \quad (3)$$

β is called a coupling ratio. In such a memory cell, contribution of $C_{WL}$ is large and, for example, $C_{WL}:C_{BL}:C_{SL}$=8:1:1 holds. This results in β=0.8. When the voltage of the word line WL changes, for example, from 5 V at the time of writing to 0 V after writing, the floating body 1102 receives amplitude noise of 5 V×β=4 V due to capacitive coupling between the word line WL and the floating body 1102. Accordingly, a sufficient margin is not provided to the potential difference between the "1" potential and the "0" potential of the floating body 1102 at the time of writing, which is a problem.

FIGS. 17A and 17B illustrate a read operation where FIG. 17A illustrates a "1" write state and FIG. 17B illustrates a "0" write state. In actuality, however, even when Vb is set to the floating body 1102 to write "1", when the voltage of the word line WL returns to 0 V after the end of writing, the voltage of the floating body 1102 is lowered to a negative bias. When "0" is written, the voltage of the floating body 1102 is lowered to a further negative bias, and it is difficult to provide a sufficiently large margin to the potential difference between the "1" potential and the "0" potential at the time of writing. Therefore, there has been difficulty in commercially introducing a DRAM memory cell actually including no capacitor. Further, there exist memory devices in which one memory cell including two MOS transistors is formed on an SOI (Silicon on Insulator) layer (see, for example, US2008/0137394 A1 and US2003/0111681 A1, which are incorporated herein by these references). In these devices, an N+ layer that functions as a source or a drain and that separates the floating body channels of the two MOS transistors from each other is formed so as to be in contact with an insulating layer. The N+ layer is in contact with the insulating layer, and therefore, the floating body channels of the two MOS transistors are electrically separated from each other. Accordingly, the voltages of the separated floating body channels in which a group of positive holes, which are signal charges, are stored change to a large degree as expressed by expression (2) when a pulse voltage is applied to the gate electrode of each of the MOS transistors. Accordingly, there has been a problem that it is difficult to provide a sufficiently large margin to the potential difference between the "1" potential and the "0" potential at the time of writing.

SUMMARY OF THE INVENTION

In a memory device that is a capacitor-less single-transistor DRAM (gain cell), capacitive coupling between the word line and the floating SGT body is strong. When the potential of the word line is changed at the time of data reading or at the time of data writing, the change is transmitted as direct noise to the SGT body, which is a problem. This causes a problem of erroneous reading or erroneous writing of storage data and makes it difficult to commercially introduce a capacitor-less single-transistor DRAM (gain cell).

To address the above-described issues, a semiconductor memory device according to an aspect of the present invention includes: a semiconductor base material that stands on a substrate in a vertical direction or that extends in a horizontal direction along the substrate; a first impurity layer and a second impurity layer that are disposed at respective ends of the semiconductor base material; a first gate insulating layer that partially or entirely surrounds a side surface of the semiconductor base material between the first impurity layer and the second impurity layer and that is in contact with or in close vicinity to the first impurity layer; a second gate insulating layer that partially or entirely surrounds a side surface of the semiconductor base material, that is connected to the first gate insulating layer, and that is in contact with or in close vicinity to the second impurity layer; a first gate conductor layer that covers the first gate insulating layer; a second gate conductor layer that covers the second gate insulating layer; a first insulating layer that is disposed between the first gate conductor layer and the second gate conductor layer; a first wiring conductor layer that is connected to the first impurity layer; a second wiring conductor layer that is connected to the second impurity layer; a third wiring conductor layer that is connected to the first gate conductor layer; and a fourth wiring conductor layer that is connected to the second gate conductor layer, in which the semiconductor base material includes a channel semiconductor layer constituted by a first channel semiconductor layer that is covered by the first gate insulating layer and a second channel semiconductor layer that is covered by the second gate insulating layer, the channel semiconductor layer has a side surface that is entirely surrounded by the first gate insulating layer and the second gate insulating layer or by an insulating material layer including the first gate insulating layer and the second gate insulating layer, voltages applied to the first wiring conductor layer, the second wiring conductor layer, the third wiring conductor layer, and the fourth wiring conductor layer are controlled to perform a memory write operation by performing an operation of causing an impact ionization phenomenon to occur in a first boundary region between the first channel semiconductor layer and the second channel semiconductor layer, a second boundary region between the first impurity layer and the first channel semiconductor layer, or a third boundary region between the second impurity layer and the second channel semiconductor layer by a current that flows between the first impurity layer and the second impurity layer, performing an operation of discharging, among a generated group of electrons and a generated group of positive holes, the group of electrons via the first impurity layer or the second impurity layer, and performing an operation of partially or entirely leaving the group of positive holes in any of or both of the first channel semiconductor layer and the second channel semiconductor layer, and the voltages applied to the first wiring conductor layer, the second wiring conductor layer, the third wiring conductor layer, and the fourth wiring conductor layer are controlled to perform a memory erase operation by removing a group of remaining positive holes among the group of positive holes via one of or both of the first impurity layer and the second impurity layer.

A first inversion layer is formed in an outer periphery portion of the first channel semiconductor layer surrounded by the first wiring conductor layer to operate a corresponding region in a saturation region and to form a pinch-off point at an end of the first inversion layer close to the second channel semiconductor layer, a second inversion layer is formed in an outer periphery portion of the second channel semiconductor layer surrounded by the second wiring conductor layer to operate a corresponding region in a linear region, and the second inversion layer functions as a drain as a whole to cause the impact ionization phenomenon to occur in the first boundary region.

The memory erase operation is performed to keep a first PN junction between the first impurity layer and the first channel semiconductor layer and a second PN junction between the second impurity layer and the second channel semiconductor layer in a reverse bias state.

The first wiring conductor layer is a source line, the second wiring conductor layer is a bit line, and one of the third wiring conductor layer and the fourth wiring conductor layer is a word line and the other is a first driving control line, and voltages are applied to the source line, the bit line, the first driving control line, and the word line to selectively perform the memory erase operation or the memory write operation.

The second wiring conductor layer is orthogonal to the third wiring conductor layer and the fourth wiring conductor layer in plan view.

A first gate capacitance between the first gate conductor layer and the first channel semiconductor layer is larger than a second gate capacitance between the second gate conductor layer and the second channel semiconductor layer.

The first gate capacitance is made larger than the second gate capacitance by any of or a combination of any of making a first channel length of the first gate conductor layer longer than a second channel length of the second gate conductor layer, making the first gate insulating layer thinner than the second gate insulating layer, and making a relative dielectric constant of the first gate insulating layer larger than a relative dielectric constant of the second gate insulating layer.

The first impurity layer and the second impurity layer are N-type semiconductor layers, and the first channel semiconductor layer and the second channel semiconductor layer are P-type semiconductor layers or neutral semiconductor layers, when the memory erase operation is started, the memory erase operation is performed by a positive-hole discharge operation in which a voltage of the second impurity layer becomes lower than a voltage of the second channel semiconductor layer, a second PN junction between the second impurity layer and the second channel semiconductor layer formed by the second impurity layer and the second channel semiconductor layer becomes forward biased, and the group of positive holes are removed from the second channel semiconductor layer to the second impurity layer, and by a subsequent discharged-positive-hole-group discharge stop operation in which the voltage of the second impurity layer becomes higher than the voltage of the second channel semiconductor layer, the second PN junction becomes reverse biased, and discharge of the group of positive holes stops.

When the memory write operation is started, the group of positive holes generated by the impact ionization phenomenon are stored in the first channel semiconductor layer and the second channel semiconductor layer, the stored group of positive holes cause a decrease in a threshold voltage of a first MOS transistor region of the first gate conductor layer and a threshold voltage of a second MOS transistor region of the second gate conductor layer, and the voltage of any of the first gate conductor layer and the second gate conductor layer is decreased in accordance with the decrease.

When the memory write operation is started, the group of positive holes generated by the impact ionization phenomenon are stored in the first channel semiconductor layer and the second channel semiconductor layer, the stored group of positive holes cause a decrease in a first threshold voltage of a first MOS transistor region and a second threshold voltage of a second MOS transistor region of the second gate conductor layer, the decrease produces an effect of increasing a current flowing from the second impurity layer to the first impurity layer, and the effect causes positive feedback to occur in the memory write operation to perform writing.

In the memory write operation and in a memory read operation, an inversion layer is formed in an outer periphery portion of the first channel semiconductor layer or the second channel semiconductor layer surrounded by the first gate conductor layer or the second gate conductor layer connected to the driving control line.

The semiconductor base material is formed perpendicular to the substrate, and in the vertical direction, the semiconductor memory device includes: the first impurity layer on top of the substrate; the first channel semiconductor layer on top of the first impurity layer; the second channel semiconductor layer on top of the first channel semiconductor layer; the second impurity layer on top of the second channel semiconductor layer; the first gate insulating layer surrounding the first channel semiconductor layer; the second gate insulating layer surrounding the second channel semiconductor layer; the first gate conductor layer surrounding the first gate insulating layer; the second gate conductor layer surrounding the second gate insulating layer; and the first insulating layer between the first gate conductor layer and the second gate conductor layer.

The first gate insulating layer and the second gate insulating layer are formed of the same material.

The first gate insulating layer and the second gate insulating layer are formed of different material layers, and the first insulating layer and the second gate insulating layer are formed of the same material layer.

The semiconductor memory device further includes a first insulating material layer that has a first hole or does not have the first hole and that is disposed adjacent to the first gate conductor layer and the second gate conductor layer and extends in the vertical direction relative to the substrate.

The first insulating material layer is formed of a low-dielectric-constant material.

The semiconductor memory device further includes a second insulating material layer that has a second hole or does not have the second hole and that is disposed adjacent to any of or both of the first wiring conductor layer and the second wiring conductor layer.

The second insulating material layer is formed of a low-dielectric-constant material.

The semiconductor memory device further includes a first conductor layer that is disposed on a bottom of the first insulating material layer and that is connected to the first impurity layer and extends in the horizontal direction.

The semiconductor memory device further includes: a first impurity well layer formed in the substrate; and a second impurity well layer formed in the first impurity well layer, in which the semiconductor base material stands on the second impurity well layer so as to be perpendicular to the substrate or extends in the horizontal direction.

The substrate is a P-type semiconductor, the first impurity well layer is an N-type semiconductor, and the second impurity well layer is a P-type semiconductor, and a negative bias is applied to the second impurity well layer that is a P-type semiconductor when the memory erase operation is performed.

The first gate conductor layer is divided into a plurality of portions, and the same driving voltage is applied or different driving voltages are applied to the plurality of portions synchronously or asynchronously.

The second gate conductor layer is divided into a plurality of portions, and the same driving voltage is applied or different driving voltages are applied to the plurality of portions synchronously or asynchronously.

BRIEF DESCRIPTION OF THE DRAWINGS

FIG. 2D is a diagram for explaining the erase operation mechanism of the memory device including an SGT according to the first embodiment;

FIG. 3I is a diagram for explaining the write operation mechanism of the memory device including an SGT according to the first embodiment;

FIG. 4D is a diagram for explaining the read operation mechanism of the memory device including an SGT according to the first embodiment;

FIG. 5B is a diagram for explaining the write operation mechanism of the memory device including an SGT according to the second embodiment;

FIGS. 7AA, 7AB and 7AC show a plan view and cross-section structural views for explaining a production method for a memory device including SGTs according to a fourth embodiment;

FIGS. 7CA, 7CB and 7CC show a plan view and cross-section structural views for explaining the production method for a memory device including SGTs according to the fourth embodiment;

FIGS. 7GA, 7GB and 7GC show a plan view and cross-section structural views for explaining the production method for a memory device including SGTs according to the fourth embodiment;

FIGS. 7IA, 7IB and 7IC show a plan view and cross-section structural views for explaining the production method for a memory device including SGTs according to the fourth embodiment;

FIGS. 7LA, 7LB and 7LC show a plan view and cross-section structural views for explaining the production method for a memory device including SGTs according to the fourth embodiment;

FIGS. 7MA, 7MB and 7MC show a plan view and cross-section structural views for explaining the production method for a memory device including SGTs according to the fourth embodiment;

FIG. 8A includes a circuit block diagram or a timing operation waveform diagram for explaining a block erase operation of a memory device including SGTs according to a fifth embodiment;

FIG. 8B includes a circuit block diagram or a timing operation waveform diagram for explaining the block erase operation of a memory device including SGTs according to the fifth embodiment;

FIG. 8C includes a circuit block diagram or a timing operation waveform diagram for explaining the block erase operation of a memory device including SGTs according to the fifth embodiment;

FIG. 8D includes a circuit block diagram or a timing operation waveform diagram for explaining the block erase operation of a memory device including SGTs according to the fifth embodiment;

FIG. 8E includes a circuit block diagram or a timing operation waveform diagram for explaining the block erase operation of a memory device including SGTs according to the fifth embodiment;

FIG. 9A includes a circuit block diagram or a timing operation waveform diagram for explaining a page write operation of a memory device including SGTs according to a sixth embodiment;

FIG. 9B includes a circuit block diagram or a timing operation waveform diagram for explaining the page write operation of a memory device including SGTs according to the sixth embodiment;

FIG. 9C includes a circuit block diagram or a timing operation waveform diagram for explaining the page write operation of a memory device including SGTs according to the sixth embodiment;

FIG. 10A includes a circuit block diagram or a timing operation waveform diagram for explaining a page read operation of a memory device including SGTs according to a seventh embodiment;

FIG. 10B includes a circuit block diagram or a timing operation waveform diagram for explaining the page read operation of a memory device including SGTs according to the seventh embodiment;

FIG. 10C includes a circuit block diagram or a timing operation waveform diagram for explaining the page read operation of a memory device including SGTs according to the seventh embodiment;

FIG. 11C includes a circuit block diagram or a timing operation waveform diagram for explaining the block refresh operation of a memory device including SGTs according to the eighth embodiment;

FIG. 12A includes a circuit block diagram or a timing operation waveform diagram for explaining a page erase operation of a memory device including SGTs according to a ninth embodiment;

FIG. 12B includes a circuit block diagram or a timing operation waveform diagram for explaining the page erase operation of a memory device including SGTs according to the ninth embodiment;

FIG. 12C includes a circuit block diagram or a timing operation waveform diagram for explaining the page erase operation of a memory device including SGTs according to the ninth embodiment;

FIGS. 13CA, 13CB and 13CC show a plan view and cross-section structural views for explaining the production method for a memory device including SGTs according to the tenth embodiment;

FIGS. 13EA, 13EB and 13EC show a plan view and cross-section structural views for explaining the production method for a memory device including SGTs according to the tenth embodiment;

FIG. 17A is a diagram illustrating a read operation of a DRAM memory cell including no capacitor in the related art;

FIG. 17B is a diagram illustrating the read operation of a DRAM memory cell including no capacitor in the related art; and FIG. 17C is a diagram illustrating the read operation of a DRAM memory cell including no capacitor in the related art.

DETAILED DESCRIPTION OF THE PREFERRED EMBODIMENTS

Hereinafter, a memory device (hereinafter called a dynamic flash memory) and a production method therefor according to embodiments of the present invention will be described with reference to the drawings.

First Embodiment

The structure and operation mechanisms of a dynamic flash memory cell according to a first embodiment of the present invention are described with reference to FIG. 1 to FIG. 4H. The structure of the dynamic flash memory cell is described with reference to FIG. 1. A data erase mechanism of the dynamic flash memory cell is described with reference to FIGS. 2A to 2D, a data write mechanism thereof is described with reference to FIGS. 3A to 3J, and a data read mechanism thereof is described with reference to FIGS. 4A to 4H.

Figure 1:
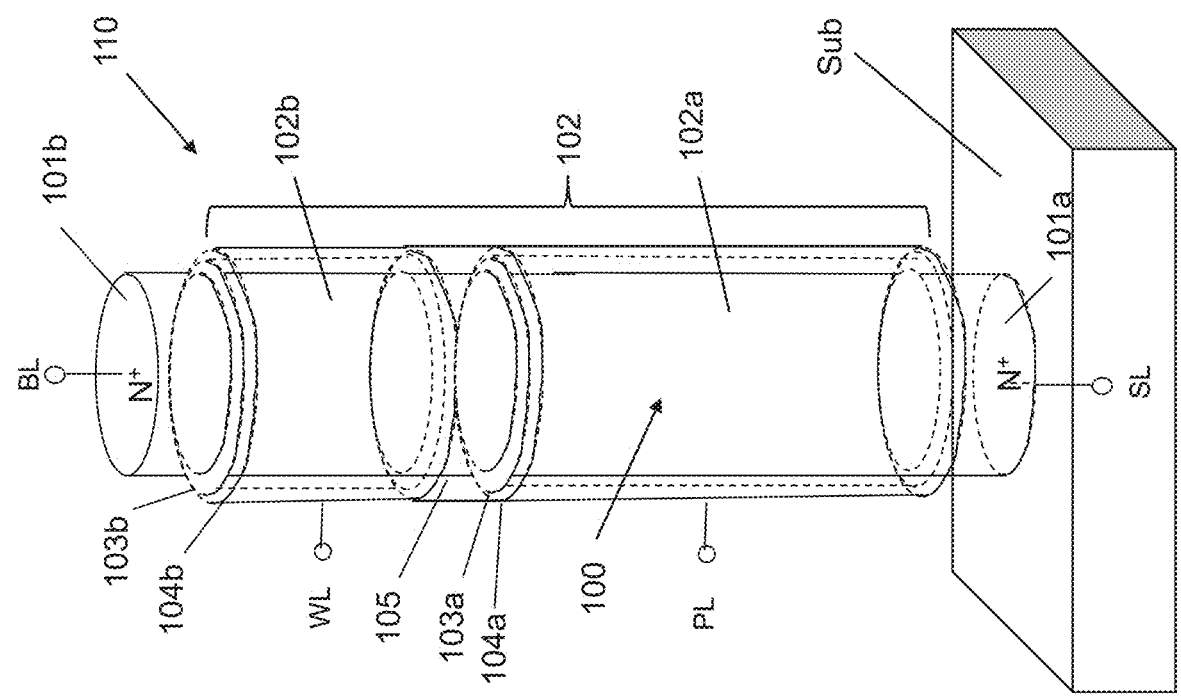
FIG. 1 is a structural diagram of a memory device including an SGT according to a first embodiment.

FIG. 1 illustrates the structure of the dynamic flash memory cell according to the first embodiment of the present invention. On the top and the bottom of a Si pillar 100 (hereinafter, a silicon semiconductor pillar is referred to as "silicon pillar") (which is an example of "semiconductor base material" in the claims) of a P or i (intrinsic) conductivity type formed on a substrate Sub (which is an example of "substrate" in the claims), $N^+$ layers 101a and 101b (hereinafter, a semiconductor region that contains a donor impurity in high concentrations is referred to as "$N^+$ layer") (which are examples of "first impurity layer" and "second impurity layer" in the claims), one of which functions as the source and the other functions as the drain, are formed respectively. A portion of the Si pillar 100 between the $N^+$ layers 101a and 101b that function as the source and the drain functions as a channel region 102. Around the channel region 102, a first gate insulating layer 103a (which is an example of "first gate insulating layer" in the claims) and a second gate insulating layer 103b (which is an example of "second gate insulating layer" in the claims) are formed. The first gate insulating layer 103a and the second gate insulating layer 103b are in contact with or in close vicinity to the $N^+$ layers 101a and 101b that function as the source and the drain respectively. Around the first gate insulating layer 103a and the second gate insulating layer 103b, a first gate conductor layer 104a (which is an example of "first gate conductor layer" in the claims) and a second gate conductor layer 104b (which is an example of "second gate conductor layer" in the claims) are formed respectively. The first gate conductor layer 104a and the second gate conductor layer 104b are isolated from each other by an insulating layer 105 (which is an example of "first insulating layer" in the claims). The channel region 102 (which is an example of "channel semiconductor layer" in the claims), which is a portion of the Si pillar 100 between the $N^+$ layers 101a and 101b, is constituted by a first channel Si layer 102a (which is an example of "first channel semiconductor layer" in the claims) surrounded by the first gate insulating layer 103a and a second channel Si layer 102b (which is an example of "second channel semiconductor layer" in the claims) surrounded by the second gate insulating layer 103b. Accordingly, the $N^+$ layers 101a and 101b that function as the source and the drain, the channel region 102, the first gate insulating layer 103a, the second gate insulating layer 103b, the first gate conductor layer 104a, and the second gate conductor layer 104b constitute a dynamic flash memory cell 110. The $N^+$ layer 101a that functions as the source is connected to a source line SL (which is an example of "source line" in the claims), the $N^+$ layer 101b that functions as the drain is connected to a bit line BL (which is an example of "bit line" in the claims), the first gate conductor layer 104a is connected to a plate line PL (which is an example of "first driving control line" in the claims), and the second gate conductor layer 104b is connected to a word line WL (which is an example of "word line" in the claims). Desirably, the structure is such that the gate capacitance of the first gate conductor layer 104a to which the plate line PL is connected is larger than the gate capacitance of the second gate conductor layer 104b to which the word line WL is connected.

In FIG. 1, to make the gate capacitance of the first gate conductor layer 104a to which the plate line PL is connected larger than the gate capacitance of the second gate conductor layer 104b to which the word line WL is connected, the gate length of the first gate conductor layer 104a is made longer than the gate length of the second gate conductor layer 104b. Alternatively, instead of making the gate length of the first gate conductor layer 104a longer than the gate length of the second gate conductor layer 104b, the thicknesses of the respective gate insulating layers may be made different such that the thickness of the gate insulating film of the first gate insulating layer 103a is thinner than the thickness of the gate insulating film of the second gate insulating layer 103b. Alternatively, the dielectric constants of the materials of the respective gate insulating layers may be made different such that the dielectric constant of the gate insulating film of the first gate insulating layer 103a is higher than the dielectric constant of the gate insulating film of the second gate insulating layer 103b.

Figure 2C:
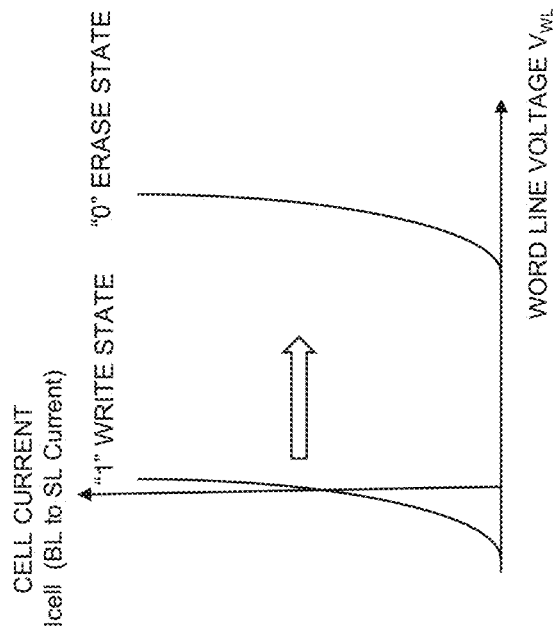
FIG. 2C is a diagram for explaining the erase operation mechanism of the memory device including an SGT according to the first embodiment.
Figure 2A:
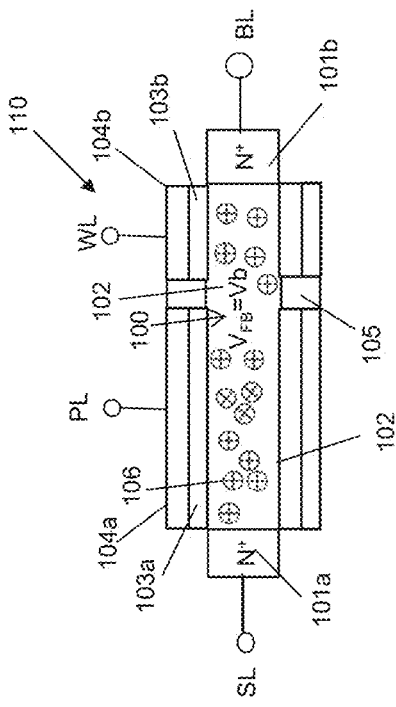
FIG. 2A is a diagram for explaining an erase operation mechanism of the memory device including an SGT according to the first embodiment.
Figure 2B:
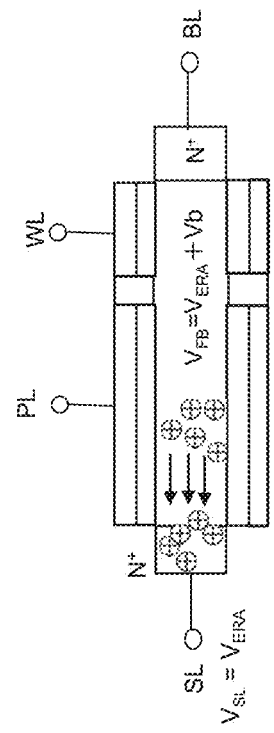
FIG. 2B is a diagram for explaining the erase operation mechanism of the memory device including an SGT according to the first embodiment.

With reference to FIGS. 2A to 2D, the erase operation mechanism is described. The channel region 102 between the N+ layers 101a and 101b is electrically isolated from the substrate Sub and functions as a floating body. FIG. 2A illustrates a state where a group of positive holes 106 that are generated by impact ionization in the previous cycle and are majority carriers in the channel region 102 are stored in the channel region 102 before an erase operation. As illustrated in FIG. 2B, at the time of an erase operation, the voltage of the source line SL is set to a negative voltage $V_{ERA}$. Here, $V_{ERA}$ is equal to, for example, −3 V. As a result, regardless of the value of the initial potential of the channel region 102, the PN junction between the N+ layer 101a to which the source line SL is connected and which functions as the source and the channel region 102 is forward biased. As a result, the group of positive holes 106 generated by impact ionization in the previous cycle and stored in the channel region 102 are drawn into the N+ layer 101a that is the source, and the potential $V_{FB}$ of the channel region 102 becomes $V_{FB}=V_{ERA}+Vb$. Here, Vb represents the built-in voltage of the PN junction and is equal to about 0.7 V. Therefore, in a case of $V_{ERA}=−3$ V, the potential of the channel region 102 is equal to −2.3 V. This value represents the state of the potential of the channel region 102 in an erase state. Accordingly, when the potential of the channel region 102 that is a floating body becomes a negative voltage, the threshold voltage of the N-channel MOS transistor region 110 increases due to a substrate bias effect. Accordingly, as illustrated in FIG. 2C, the threshold voltage of the second gate conductor layer 104b to which the word line WL is connected increases. This erase state of the channel region 102 is assigned to logical storage data "0". FIG. 2D illustrates example voltage conditions for respective main node contact points in the above-described erase operation.

Figure 3C:
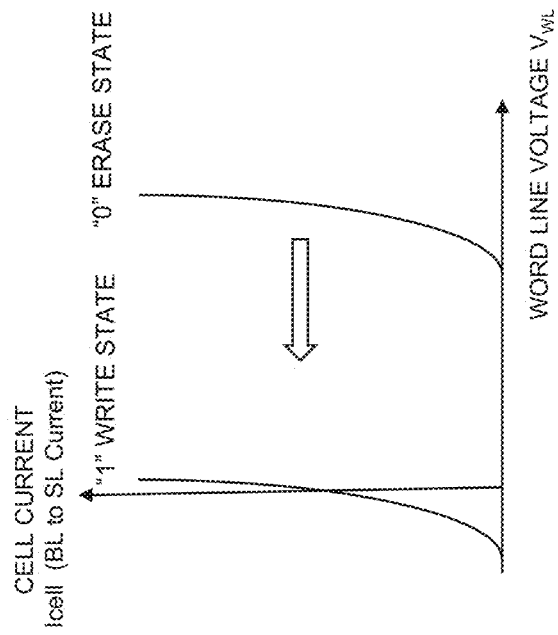
FIG. 3C is a diagram for explaining the write operation mechanism of the memory device including an SGT according to the first embodiment.
Figure 3A:
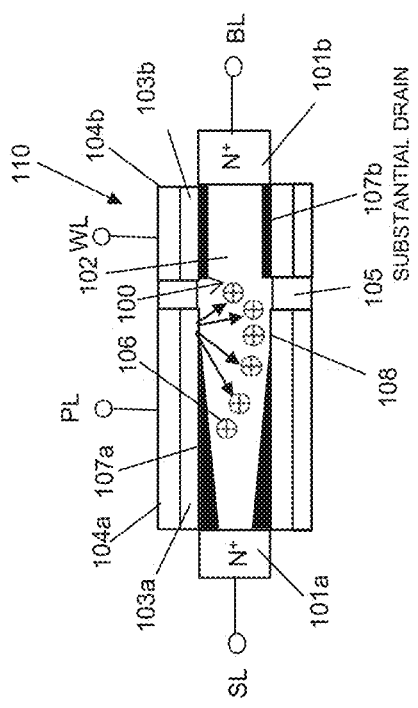
FIG. 3A is a diagram for explaining a write operation mechanism of the memory device including an SGT according to the first embodiment.
Figure 3B:
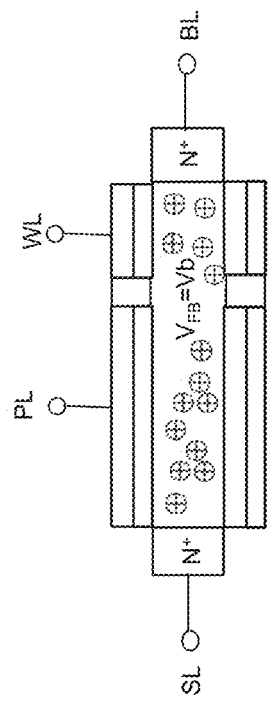
FIG. 3B is a diagram for explaining the write operation mechanism of the memory device including an SGT according to the first embodiment.

FIGS. 3A to 3C illustrate a write operation of the dynamic flash memory cell according to the first embodiment of the present invention. As illustrated in FIG. 3A, for example, 0 V is applied to the N+ layer 101a to which the source line SL is connected, for example, 3 V is applied to the N+ layer 101b to which the bit line BL is connected, for example, 2 V is applied to the first gate conductor layer 104a to which the plate line PL is connected, and, for example, 5 V is applied to the second gate conductor layer 104b to which the word line WL is connected. As a result, as illustrated in FIG. 3A, an inversion layer 107a in a ring form is formed on the inner periphery of the first gate conductor layer 104a to which the plate line PL is connected, and a first N-channel MOS transistor region including the first gate conductor layer 104a is operated in the saturation region. As a result, in the inversion layer 107a on the inner periphery of the first gate conductor layer 104a to which the plate line PL is connected, a pinch-off point 108 is present. On the other hand, a second N-channel MOS transistor region including the second gate conductor layer 104b to which the word line WL is connected is operated in the linear region. As a result, an inversion layer 107b in which a pinch-off point is not present is formed on the entire inner periphery of the second gate conductor layer 104b to which the word line WL is connected. The inversion layer 107b that is formed on the entire inner periphery of the second gate conductor layer 104b to which the word line WL is connected substantially functions as the drain of the second N-channel MOS transistor region including the second gate conductor layer 104b. As a result, the electric field becomes maximum in a boundary region (which is an example of "first boundary region" in the claims) of the channel region 102 between the first N-channel MOS transistor region including the first gate conductor layer 104a and the second N-channel MOS transistor region including the second gate conductor layer 104b that are connected in series, and an impact ionization phenomenon occurs in this region. This region is a source-side region when viewed from the second N-channel MOS transistor region including the second gate conductor layer 104b to which the word line WL is connected, and therefore, this phenomenon is called a source-side impact ionization phenomenon. Due to this source-side impact ionization phenomenon, electrons flow from the N+ layer 101a to which the source line SL is connected toward the N+ layer 101b to which the bit line BL is connected. The accelerated electrons collide with lattice Si atoms, and electron-positive hole pairs are generated by the kinetic energy. Although some of the generated electrons flow into the first gate conductor layer 104a and the second gate conductor layer 104b, most of the generated electrons flow into the N+ layer 101b to which the bit line BL is connected (not illustrated). The generated group of positive holes 106 are majority carriers in the channel region 102, with which the channel region 102 is charged to a positive bias (FIG. 3B). To the N+ layer 101a to which the source line SL is connected, 0 V is applied, and therefore, the channel region 102 is charged up to the built-in voltage Vb (about 0.7 V) of the PN junction between the N+ layer 101a to which the source line SL is connected and the channel region 102. When the channel region 102 is charged to a positive bias, the threshold voltages of the first N-channel MOS transistor region and the second N-channel MOS transistor region decrease due to a substrate bias effect. Accordingly, as illustrated in FIG. 3C, the threshold voltage of the second N-channel MOS transistor region to which the word line WL is connected decreases. This write state of the channel region 102 is assigned to logical storage data "1".

At the time of the write operation, electron-positive hole pairs may be generated by an impact ionization phenomenon in a second boundary region between the first impurity layer and the first channel semiconductor layer or in a third boundary region between the second impurity layer and the second channel semiconductor layer instead of the above-described boundary region, and the channel region 102 may be charged with the generated group of positive holes 106. Point of view at low voltage operation and light shielding effect, usage of the impact ionization at the boundary between the first N-channel MOS transistor and the second N-channel MOS transistor is preferable. At the time of "1" writing, electron-positive hole pairs may be generated by using a gate-induced drain leakage (GIDL) current, and the floating body FB may be filled with the generated group of positive holes (see E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-697, April 2006, which is incorporated herein by this reference).

Figure 3E:
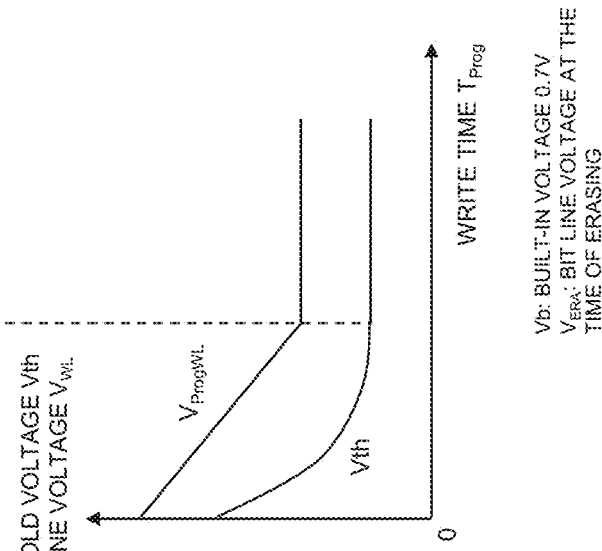
FIG. 3E is a diagram for explaining the write operation mechanism of the memory device including an SGT according to the first embodiment.
Figure 3F:
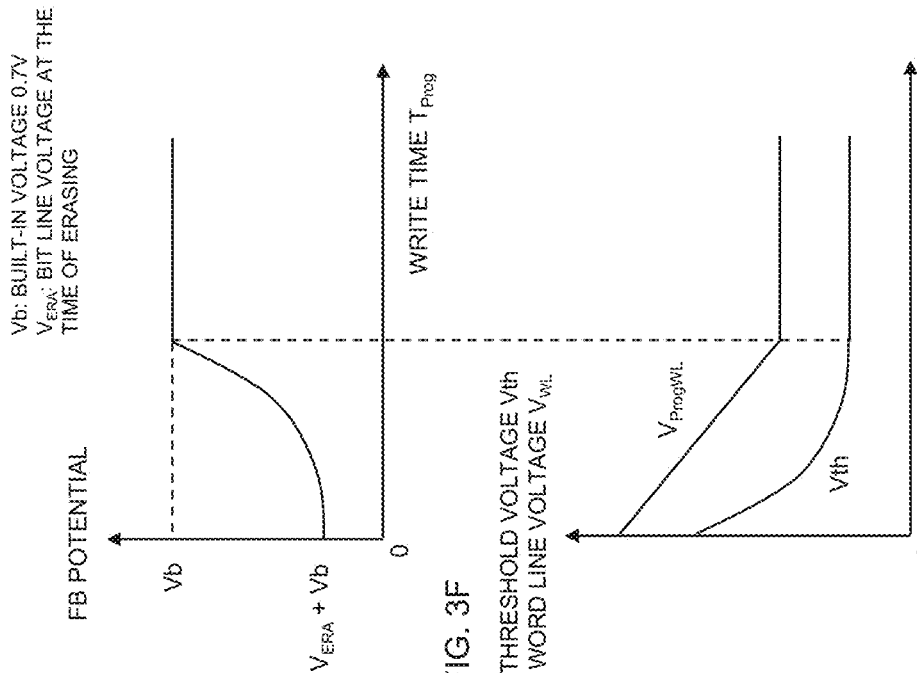
FIG. 3F is a diagram for explaining the write operation mechanism of the memory device including an SGT according to the first embodiment.
Figure 3D:
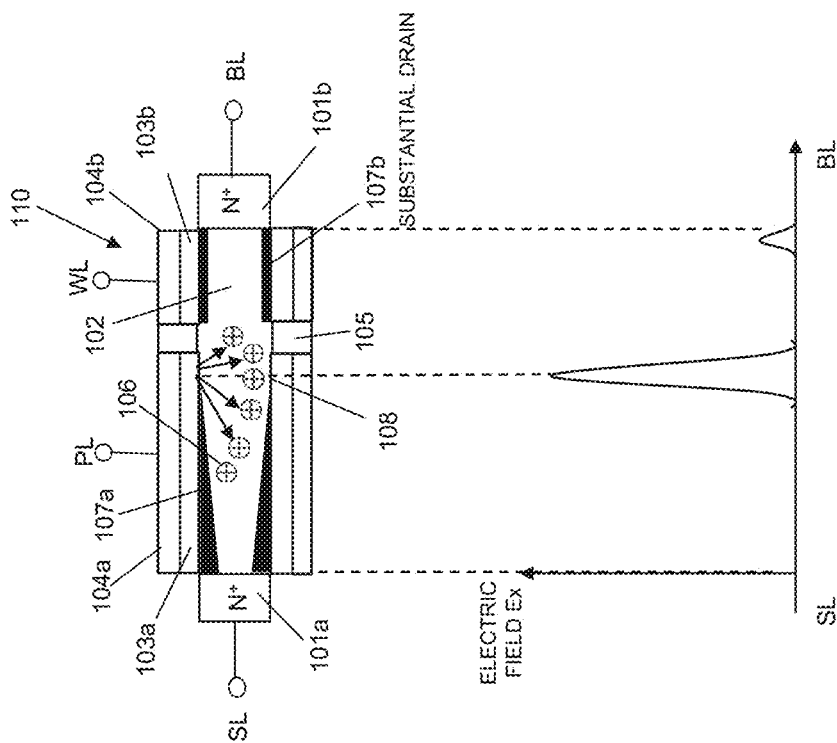
FIG. 3D is a diagram for explaining the write operation mechanism of the memory device including an SGT according to the first embodiment.

FIG. 3D is a diagram for explaining the electric field intensity at the time of a write operation of the dynamic flash memory cell according to the first embodiment of the present invention. FIG. 3D illustrates a state where the electric field intensity becomes maximum between the two gate conductor layers connected in series, that is, the first gate conductor layer 104a to which the plate line PL is connected and the second gate conductor layer 104b to which the word line WL is connected, due to a source-side impact ionization phenomenon. At this time, the electric field intensity slightly increases in the vicinity of the N⁺ layer 101b that is the drain and to which the bit line BL is connected.

FIG. 3E illustrates a state where the channel region 102 that is a floating body is charged at the time of writing and the voltage rises. The channel region 102 is erased before writing, and the initial value thereof is equal to ($V_{ERA}$+Vb). After the start of writing, the voltage of the channel region 102 rises up to Vb in accordance with the write time. When the voltage of the channel region 102 becomes higher than or equal to Vb, the PN junction between the N⁺ layer 101a to which the source line SL is connected and the channel region 102 of the P layer is forward biased, and the group of positive holes 106 generated by a source-side impact ionization phenomenon are released from the channel region 102 of the P layer to the source line SL connected to the N⁺ layer 101a. As a result, charging of the channel region 102 of the P layer is limited, and the potential Vb is maintained. Note that Vb is the built-in voltage of the PN junction between the N⁺ layer 101a to which the source line SL is connected and the channel region 102 of the P layer and is equal to about 0.7 V.

FIG. 3F is a diagram for explaining changes in the threshold voltages of both the second N-channel MOS transistor region to which the word line WL is connected and the first N-channel MOS transistor region to which the plate line PL is connected, in accordance with changes in the potential of the channel region 102 illustrated in FIG. 3E, at the time of a write operation of the dynamic flash memory cell according to the first embodiment of the present invention. FIG. 3F illustrates a state where the threshold voltage of the second N-channel MOS transistor region including the second gate conductor layer 104b to which the word line WL is connected decreases as the potential of the channel region 102 rises. As illustrated in FIG. 3A, in a process in which the state of the floating body of the channel region 102 gradually changes from an erase state "0" to a write state "1", the generated group of positive holes 106 are stored in the channel region 102. That is, the threshold voltages of both the second N-channel MOS transistor region to which the word line WL is connected and the first N-channel MOS transistor region to which the plate line PL is connected decrease. As illustrated in FIG. 3F, the voltage of the word line WL at the time of writing can be decreased as the threshold voltages decrease. As illustrated in FIG. 3G, in the channel region 102 to which "1" is written, the group of positive holes 106 are stored, and the threshold voltages of both the second N-channel MOS transistor region to which the word line WL is connected and the first N-channel MOS transistor region to which the plate line PL is connected decrease. As a result, positive feedback occurs, the current that flows from the bit line BL to the source line SL increases, the impact ionization phenomenon becomes more significant, and the page write operation is accelerated.

Figure 3H:
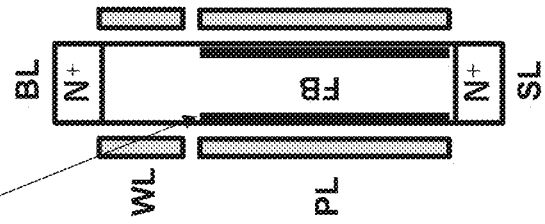
FIG. 3H is a diagram for explaining the write operation mechanism of the memory device including an SGT according to the first embodiment.
Figure 3G:
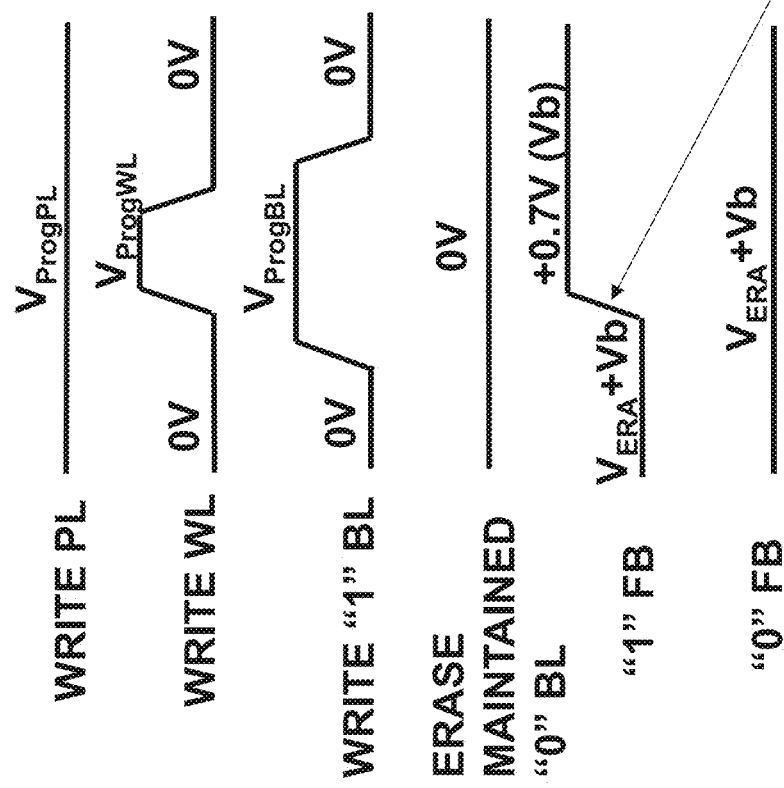
FIG. 3G is a diagram for explaining the write operation mechanism of the memory device including an SGT according to the first embodiment.

As the potential of the channel region 102 changes at the time of a write operation of the dynamic flash memory cell according to the first embodiment of the present invention, an inversion layer is formed on the outer periphery of the channel region 102 at the time of the write operation as illustrated in FIG. 3H. Accordingly, an electric field from the first gate conductor layer 104a to which the plate line PL to which a fixed voltage is continuously applied is connected is blocked, and the performance of retaining the group of positive holes in the channel region 102 increases.

In accordance with changes in the potential of the channel region 102 at the time of a write operation of the dynamic flash memory cell according to the first embodiment of the present invention, the voltage of the word line WL, which is, for example, equal to 5 V and is high at the beginning of writing as illustrated in FIG. 3I in order to make the second N-channel MOS transistor region including the second gate conductor layer 104b be operated in the linear region, can be decreased to, for example, about 2 V as the writing progresses. Here, FIG. 3I illustrates example voltage conditions for respective main node contact points at the time of a write operation. As a result, even when the voltage of the word line WL is reset to, for example, 0 V at the end of writing, an effect of decreasing the potential of the channel region 102 with which the second gate conductor layer 104b is capacitively coupled is reduced.

Figure 3J:
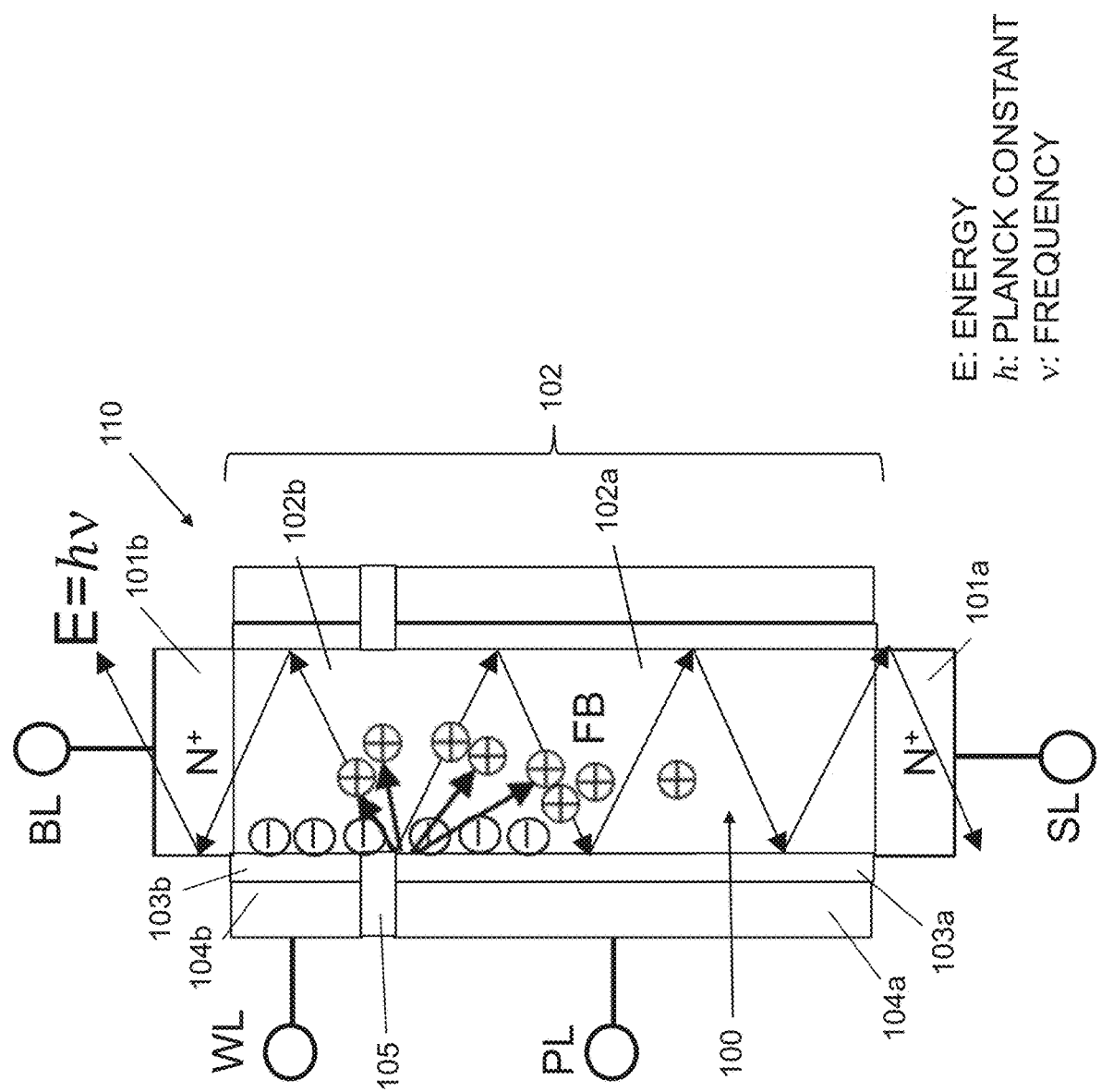
FIG. 3J is a diagram for explaining the write operation mechanism of the memory device including an SGT according to the first embodiment.

Due to an impact ionization phenomenon that occurs at the time of a write operation of the dynamic flash memory cell according to the first embodiment of the present invention, photons are generated in addition to electron-positive hole pairs as illustrated in FIG. 3J. The generated photons are repeatedly reflected by the first gate conductor layer 104a and the second gate conductor layer 104b of the Si pillar 100 and move in the vertical direction of the Si pillar 100. Accordingly, the generated photons are repeatedly reflected by the first gate conductor layer 104a to which the plate line PL is connected and the second gate conductor layer 104b to which the word line WL is connected and move in the vertical direction of the Si pillar 100 while the Si pillar 100 functions as a waveguide. At this time, the first gate conductor layer 104a and the second gate conductor layer 104b have a light block effect such that the photons generated at the time of writing do not corrupt data in the adjacent memory cells.

Figure 4C:
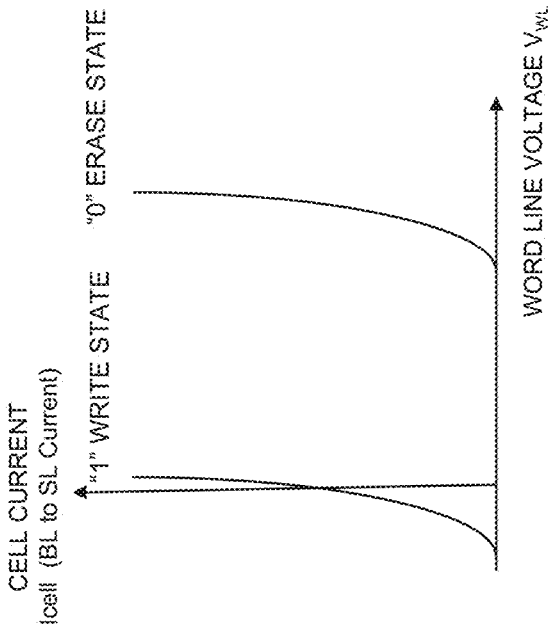
FIG. 4C is a diagram for explaining the read operation mechanism of the memory device including an SGT according to the first embodiment.
Figure 4A:
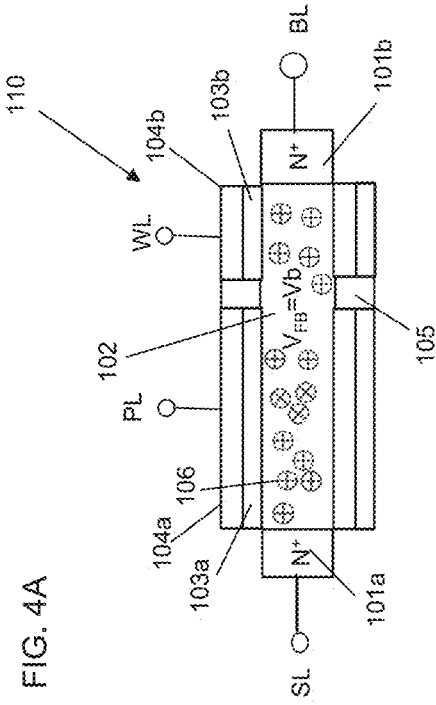
FIG. 4A is a diagram for explaining a read operation mechanism of the memory device including an SGT according to the first embodiment.
Figure 4B:
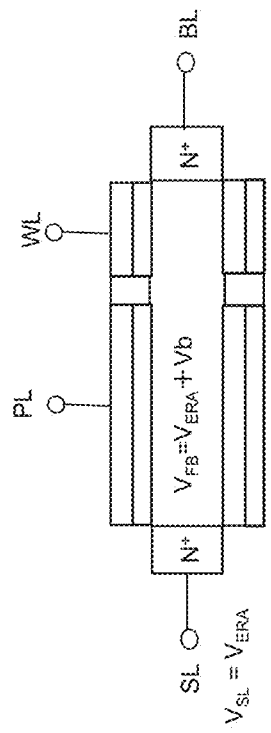
FIG. 4B is a diagram for explaining the read operation mechanism of the memory device including an SGT according to the first embodiment.

FIGS. 4A to 4D are diagrams for explaining a read operation of the dynamic flash memory cell according to the first embodiment of the present invention. As illustrated in FIG. 4A, when the channel region 102 is charged up to the built-in voltage Vb (about 0.7 V), the threshold voltage of the N-channel MOS transistor region decreases due to a substrate bias effect. This state is assigned to logical storage data "1". As illustrated in FIG. 4B, in a case where a memory block selected before writing is in an erase state "0" in advance, the floating voltage $V_{FB}$ of the channel region 102 is equal to $V_{ERA}$+Vb. With a write operation, a write state "1" is stored at random. As a result, logical storage data of logical "0" and that of logical "1" are created for the word line WL. As illustrated in FIG. 4C, the level difference between the two threshold voltages for the word line WL is used to perform reading by a sense amplifier. FIG. 4D illustrates example voltage conditions for respective main node contact points at the time of a read operation.

Figure 4G:
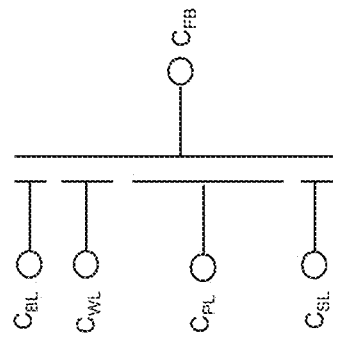
FIG. 4G is a diagram for explaining the read operation mechanism of the memory device including an SGT according to the first embodiment.
Figure 4F:
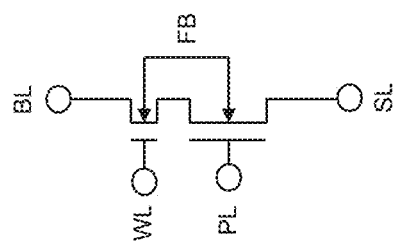
FIG. 4F is a diagram for explaining the read operation mechanism of the memory device including an SGT according to the first embodiment.
Figure 4E:
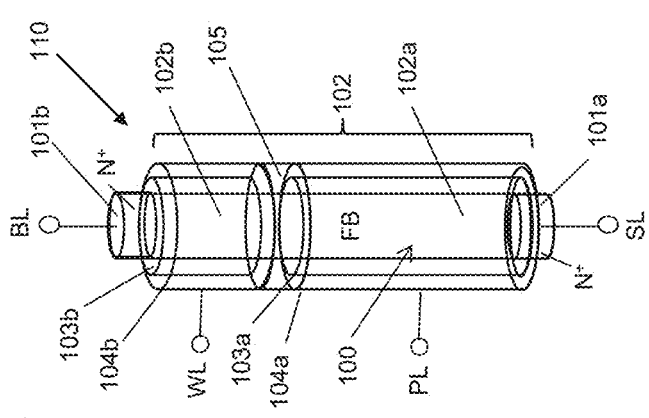
FIG. 4E is a diagram for explaining the read operation mechanism of the memory device including an SGT according to the first embodiment.
Figure 4H:
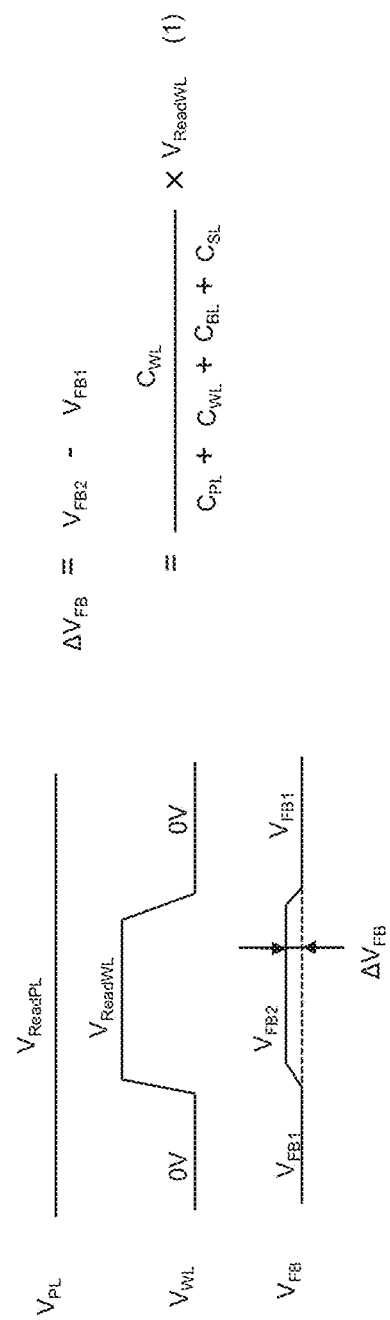
FIG. 4H is a diagram for explaining the read operation mechanism of the memory device including an SGT according to the first embodiment.

FIGS. 4E to 4H include structural diagrams for explaining the magnitude relation between the gate capacitance of the first gate conductor layer 104a and that of the second gate conductor layer 104b at the time of a read operation of the dynamic flash memory cell according to the first embodiment of the present invention. It is desirable to design the gate capacitance of the second gate conductor layer 104b to which the word line WL is connected so as to be smaller than the gate capacitance of the first gate conductor layer 104a to which the plate line PL is connected. As illustrated in FIG. 4E, the length of the first gate conductor layer 104a, in the vertical direction, to which the plate line PL is connected is made longer than the length of the second gate conductor layer 104b, in the vertical direction, to which the word line WL is connected to make the gate capacitance of the second gate conductor layer 104b to which the word line WL is connected smaller than the gate capacitance of the first gate conductor layer 104a to which the plate line PL is connected. FIG. 4F illustrates an equivalent circuit of one dynamic flash memory cell illustrated in FIG. 4E. FIG. 4G illustrates a coupled capacitance relationship of the dynamic flash memory. Here, $C_{WL}$ represents the capacitance of the second gate conductor layer 104b, $C_{PL}$ represents the capacitance of the first gate conductor layer 104a, $C_{BL}$ represents the capacitance of the PN junction between the N$^+$ layer 101b that functions as the drain and the second channel region 102b, and $C_{SL}$ represents the capacitance of the PN junction between the N$^+$ layer 101a that functions as the source and the first channel region 102a. When the voltage of the word line WL changes, this operation affects the channel region 102 as noise. The potential change $\Delta V_{FB}$ of the channel region 102 at this time is expressed by $\Delta V_{FB} = C_{WL}/(C_{PL} + C_{WL} + C_{BL} + C_{SL}) \times V_{ReadWL}$. Here, $V_{ReadWL}$ represents a changing potential of the word line WL at the time of reading. As apparent from expression (1) in FIG. 4H, when the contribution ratio of $C_{WL}$ is made smaller relative to the total capacity $C_{PL} + C_{WL} + C_{BL} + C_{SL}$ of the channel region 102, $\Delta V_{FB}$ decreases. $C_{BL} + C_{SL}$ is the capacitance of the PN junctions and is increased by, for example, increasing the diameter of the Si pillar 100. However, this is not desirable from the viewpoint of miniaturization of the memory cell. In contrast, when the length of the first gate conductor layer 104a, in the vertical direction, to which the plate line PL is connected is further made longer than the length of the second gate conductor layer 104b, in the vertical direction, to which the word line WL is connected, $\Delta V_{FB}$ can be further decreased without compromising the scale of integration of the memory cell in plan view.

It is desirable to make the length of the first gate conductor layer 104a, in the vertical direction, to which the plate line PL is connected further longer than the length of the second gate conductor layer 104b, in the vertical direction, to which the word line WL is connected to attain $C_{PL} > C_{WL}$. However, only when the plate line PL is added, the coupling ratio, in capacitive coupling, of the word line WL to the channel region 102 ($C_{WL}/(C_{PL} + C_{WL} + C_{BL} + C_{SL})$) decreases. As a result, the potential change $\Delta V_{FB}$ of the channel region 102 that is a floating body decreases.

As the voltage $V_{ErasePL}$ of the plate line PL, a fixed voltage of, for example, 2 V may be applied regardless of the operation mode, or as the voltage $V_{ErasePL}$ of the plate line PL, for example, 0 V may be applied only at the time of erasing.

Regardless of whether the cross-sectional shape of the Si pillar 100 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

In FIG. 1, the dynamic flash memory is formed of the Si pillar 100 that stands on the substrate Sub in the vertical direction. In contrast, as found from the explanations of the operations with reference to FIG. 2A to FIG. 5B, even when the dynamic flash memory does not stand on the substrate Sub in the vertical direction but is formed horizontally along the substrate Sub by using the Gate-All-Around (GAA) technology, which is one type of SGT (see, for example, J. Y. Song, W. Y. Choi, J. H. Park, J. D. Lee, and B-G. Park: "Design Optimization of Gate-All-Around (GAA) MOS-FETs", IEEE Trans. Electron Devices, vol. 5, No. 3, pp. 186-191, May 2006, which is incorporated herein by this reference), or the nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017, which is incorporated herein by this reference), the above-described operations of the dynamic flash memory can be performed.

With reference to FIG. 1, the dynamic flash memory element is described by using an example SGT in which the first gate insulating layer 103a and the second gate insulating layer 103b that surround the entire side surface of the Si pillar 100 standing on the substrate Sub in the vertical direction are provided and which includes the first gate conductor layer 104a and the second gate conductor layer 104b that entirely surround the first gate insulating layer 103a and the second gate insulating layer 103b. As illustrated in the description of this embodiment, the dynamic flash memory element needs to have a structure that satisfies the condition that the group of positive holes 106 generated by an impact ionization phenomenon are retained in the channel region 102. For this, the channel region 102 needs to have a floating body structure isolated from the substrate Sub. Accordingly, even when the semiconductor base material of the channel region is formed horizontally along the substrate Sub by using, for example, the GAA technology, which is one type of SGT (see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, No. 3, pp. 186-191, May 2006, which is incorporated herein by this reference), or the nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017, which is incorporated herein by this reference), the above-described operations of the dynamic flash memory can be performed. Alternatively, the dynamic flash memory element may have a device structure using SOI (see, for example, J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain-Leakage (GIDL) Current for Low-Power and High-Speed Embedded Memory", IEEE IEDM (2006), which are incorporated herein by these references). In this device structure, the bottom portion of a channel region is in contact with an insulating layer of an SOI substrate, and another channel region is surrounded by a gate insulating layer and an element isolation insulating layer. Also, with such a structure, the channel regions have a floating body structure. Accordingly, the dynamic flash memory element provided in this embodiment needs to satisfy the condition that the channel region has a floating body structure. Even with a structure in which a Fin transistor (see, for example, H. Jiang, N. Xu, B. Chen, L. Zengl, Y. He, G. Du, X. Liu and X. Zhang: "Experimental investigation of self heating effect (SHE) in multiple-fin SOI FinFETs", Semicond. Sci. Technol. 29 (2014) 115021 (7 pp), which is incorporated herein by this reference) is formed on an SOI substrate, when the channel region has a floating body structure, the dynamic flash operations can be performed. Further, GAA or nanosheet elements may be stacked in multi-stages to form a dynamic flash memory element. Further, a plurality of dynamic flash memory cells each of which is as illustrated in FIG. 1 may be stacked in multi-stages to form a dynamic flash memory element.

In the vertical direction, in a portion of the channel region 102 surrounded by the insulating layer 105, which is the first insulating layer, the potential distribution of the first channel region 102a and that of the second channel region 102b are connected and formed. Accordingly, the first channel region 102a and the second channel region 102b are connected in the vertical direction in a region surrounded by the insulating layer 105, which is the first insulating layer.

In the specification and the claims, the meaning of "cover" in a case of "for example, a gate insulating layer or a gate conductor layer covers, for example, a channel" also includes a case of surrounding entirely as in an SGT or GAA, a case of surrounding except a portion as in a Fin transistor, and a case of overlapping a flat object as in a planar transistor.

Example erase operation conditions are illustrated in FIGS. 2A to 2D. As long as a state where the group of positive holes 106 in the channel region 102 are discharged from any of or both of the N$^+$ layer 101a and the N$^+$ layer 101b can be implemented, voltages applied to the source line SL, the plate line PL, the bit line BL, and the word line WL may be changed.

The first gate conductor layer 104a illustrated in FIG. 1 may be divided into two or more portions and the portions may be operated synchronously or asynchronously at the same driving voltage or at different driving voltages as conductive electrodes for the plate line PL. Similarly, the second gate conductor layer 104b may be divided into two or more portions and the portions may be operated synchronously or asynchronously at the same driving voltage or at different driving voltages as conductive electrodes for the word line WL. Accordingly, the dynamic flash memory operations can also be performed. In a case where the first gate conductor layer 104a is divided into two or more portions, at least one of the divided portions of the first gate conductor layer assumes the roles of the first gate conductor layer 104a described above. Regarding the second gate conductor layer 104b that is divided, at least one of the divided portions of the second gate conductor layer assumes the roles of the second gate conductor layer 104b described above.

The above-described conditions of voltages applied to the bit line BL, the source line SL, the word line WL, and the plate line PL and the voltage of the floating body are examples for performing basic operations including the erase operation, the write operation, and the read operation, and other voltage conditions may be employed as long as these basic operations can be performed.

Even with a structure in which the conductivity type (polarity) of each of the N$^+$ layers 101a and 101b and the Si pillar 100 of the P layer in FIG. 1 is reversed, the dynamic flash memory operations can be performed. In this case, in the Si pillar 100 that is of N-type, the majority carriers are electrons. Therefore, a group of electrons generated by impact ionization are stored in the channel region 102, and a "1" state is set.

This embodiment has the following features.

Feature 1

The dynamic flash memory cell of this embodiment is constituted by the N$^+$ layers 101a and 101b that function as the source and the drain, the channel region 102, the first gate insulating layer 103a, the second gate insulating layer 103b, the first gate conductor layer 104a, and the second gate conductor layer 104b, which are formed in a pillar form as a whole. The N$^+$ layer 101a that functions as the source is connected to the source line SL, the N$^+$ layer 101b that functions as the drain is connected to the bit line BL, the first gate conductor layer 104a is connected to the plate line PL, and the second gate conductor layer 104b is connected to the word line WL. A structure is employed in which the gate capacitance of the first gate conductor layer 104a to which the plate line PL is connected is made larger than the gate capacitance of the second gate conductor layer 104b to which the word line WL is connected, which is a feature. In the dynamic flash memory cell, the first gate conductor layer 104a and the second gate conductor layer 104b are stacked in the vertical direction. Accordingly, even when the structure is employed in which the gate capacitance of the first gate conductor layer 104a to which the plate line PL is connected is made larger than the gate capacitance of the second gate conductor layer 104b to which the word line WL is connected, the memory cell area does not increase in plan view. Accordingly, a high-performance and highly integrated dynamic flash memory cell can be implemented.

Feature 2

As illustrated in FIG. 3D, at the time of a write operation, the first N-channel MOS transistor region, on the side of the source line SL, including the first gate conductor layer 104a to which the plate line PL is connected is operated in the linear region, and the second N-channel MOS transistor region disposed on the side of the N$^+$ layer 101b that functions as the drain and including the second gate conductor layer 104b to which the word line WL is connected is operated in the saturation region. Accordingly, the inversion layer 107b that is formed on the entire inner periphery of the second gate conductor layer 104b to which the word line WL is connected substantially functions as the drain of the second N-channel MOS transistor region including the second gate conductor layer 104b. Accordingly, the electric field between the first N-channel MOS transistor region including the first gate conductor layer 104a and the second N-channel MOS transistor region including the second gate conductor layer 104b that are connected in series becomes maximum, impact ionization occurs in this region, and electron-positive hole pairs are generated. Accordingly, the portion in which impact ionization occurs can be set as a channel between the first N-channel MOS transistor region including the first gate conductor layer 104a and the second N-channel MOS transistor region including the second gate conductor layer 104b that are connected in series.

Feature 3

At the time of a write operation, the first N-channel MOS transistor region disposed on the side of the N$^+$ layer 101a that functions as the source and including the first gate conductor layer 104a to which the plate line PL is connected is operated in the saturation region, the second N-channel MOS transistor region disposed on the side of the N$^+$ layer 101b that functions as the drain and including the second gate conductor layer 104b to which the word line WL is connected is operated in the linear region, and the inversion layer 107b that is accordingly generated substantially functions as a drain portion that is an extension from the N+ layer 101b that functions as the drain. As a result, due to a source-side impact ionization phenomenon, the electric field intensity becomes maximum between the two gate conductor layers connected in series, that is, the first gate conductor layer 104a to which the plate line PL is connected and the second gate conductor layer 104b to which the word line WL is connected. A source-side injection-type flash memory using the above-described operation mechanism is present. For writing to this flash memory, an energy of 3.9 eV or more is necessary in order to inject electrons, which are thermoelectrons generated by an impact ionization phenomenon, into a floating gate across the barrier of an oxidation film. However, in writing to the dynamic flash memory, only a group of positive holes need to be stored in the channel region 102, and therefore, the electric field may be lower than in writing to the flash memory. As a result, unlike the flash memory in which an impact ionization phenomenon is used as a write operation mechanism, simultaneous multi-bit writing can be performed, and faster writing with lower power consumption can be implemented.

Feature 4

As the potential of the channel region 102 rises at the time of a write operation of the dynamic flash memory cell according to the first embodiment of the present invention, the threshold voltage of the second N-channel MOS transistor region including the second gate conductor layer 104b to which the word line WL is connected and the threshold voltage of the first N-channel MOS transistor region including the first gate conductor layer 104a to which the plate line PL is connected decrease. Therefore, the voltage of the word line WL at the time of writing can be decreased as the threshold voltages decrease. Further, as positive holes generated in the channel region 102 at the time of writing are stored, positive feedback occurs, and the page write operation is accelerated. Accordingly, the data write time can be reduced.

Feature 5

As the potential of the channel region 102 rises at the time of a write operation of the dynamic flash memory cell according to the first embodiment of the present invention, an inversion layer is formed on the outer periphery of the channel region 102 of the Si pillar 100 at the time of the write operation. Accordingly, an electric field from the plate line PL to which a fixed voltage is continuously applied is blocked. Accordingly, the performance of retaining the group of positive holes in the channel region 102 increases.

Feature 6

As the potential of the channel region 102 rises at the time of a write operation of the dynamic flash memory cell according to the first embodiment of the present invention, the initial voltage of the word line WL at the start of writing can be decreased while the second N-channel MOS transistor region including the second gate conductor layer 104b is kept operated in the linear region. As a result, even when the voltage of the word line WL is reset to 0 V at the end of writing, an effect of decreasing the potential of the floating body 102 with which the second gate conductor layer 104b is capacitively coupled is reduced. This leads to a stable operation because of an increased operation margin of the dynamic flash memory cell.

Feature 7

Due to an impact ionization phenomenon that occurs at the time of a write operation of the dynamic flash memory cell according to the first embodiment of the present invention, photons are generated in addition to electron-positive hole pairs. The generated photons are repeatedly reflected by the first gate conductor layer 104a and the second gate conductor layer 104b of the Si pillar 100 and move in the vertical direction of the Si pillar 100. At this time, the first gate conductor layer 104a to which the plate line PL is connected has a block effect for the photons such that the photons generated at the time of writing do not corrupt data in memory cells adjacent in the horizontal direction.

Feature 8

The roles of the first gate conductor layer 104a to which the plate line PL is connected in the dynamic flash memory cell according to the first embodiment of the present invention have the following five features (1) to (5).

(1) When the dynamic flash memory cell performs a write operation or a read operation, the voltage of the word line WL changes. At this time, the plate line PL assumes the role of decreasing the capacitive coupling ratio between the word line WL and the channel region 102. As a result, an effect of changes in the voltage of the channel region 102 when the voltage of the word line WL changes can be substantially suppressed. Accordingly, the difference between the threshold voltages of the SGT transistor for the word line WL indicating logical "0" and logical "1" can be increased. This leads to an increased operation margin of the dynamic flash memory cell.

(2) When the dynamic flash memory cell performs an erase operation, a write operation, or a read operation, both the first gate conductor layer 104a to which the plate line PL is connected and the second gate conductor layer 104b to which the word line WL is connected function as gates of the SGT transistor. When a current flows from the bit line BL to the source line SL, a short channel effect of the SGT transistor can be suppressed. Accordingly, a short channel effect is suppressed by the first gate conductor layer 104a to which the plate line PL is connected. Accordingly, the data retaining performance can be increased.

(3) When a write operation of the dynamic flash memory cell is started, a group of positive holes are gradually stored in the channel region 102 and the threshold voltage of the MOS transistor having the first gate conductor layer 104a and the second gate conductor layer 104b as gates decreases. At this time, when the threshold voltage of the first channel semiconductor region portion decreases, an impact ionization phenomenon at the time of a write operation is promoted. Accordingly, the plate line PL causes positive feedback to work at the time of writing, and a write operation can be made faster.

(4) In the dynamic flash memory cell to which "1" is written, the threshold voltage of the first MOS transistor region having the plate line PL decreases. As a result, whenever a positive bias is applied to the plate line PL, an inversion layer is formed on the inner periphery of the first gate conductor layer 104a that is connected to the plate line PL. As a result, a layer of electrons accumulated in the inversion layer formed on the inner periphery of the first gate conductor layer 104a connected to the plate line PL functions as a conductor radio-wave shielding layer. Accordingly, the dynamic flash memory cell to which "1" is written is shielded from disturbance noise from around thereof.

(5) At the time of a write operation of the dynamic flash memory cell, photons are generated by an impact ionization phenomenon. The generated photons are repeatedly reflected by the first gate conductor layer 104a and the second gate conductor layer 104b and move in the vertical direction of the Si pillar 100. At this time, the plate line PL has a light block effect for the photons such that the photons generated at the time of writing do not corrupt data in memory cells adjacent in the horizontal direction.

Second Embodiment

A second embodiment is described with reference to FIG. 5A and FIG. 5B.

Figure 5A:
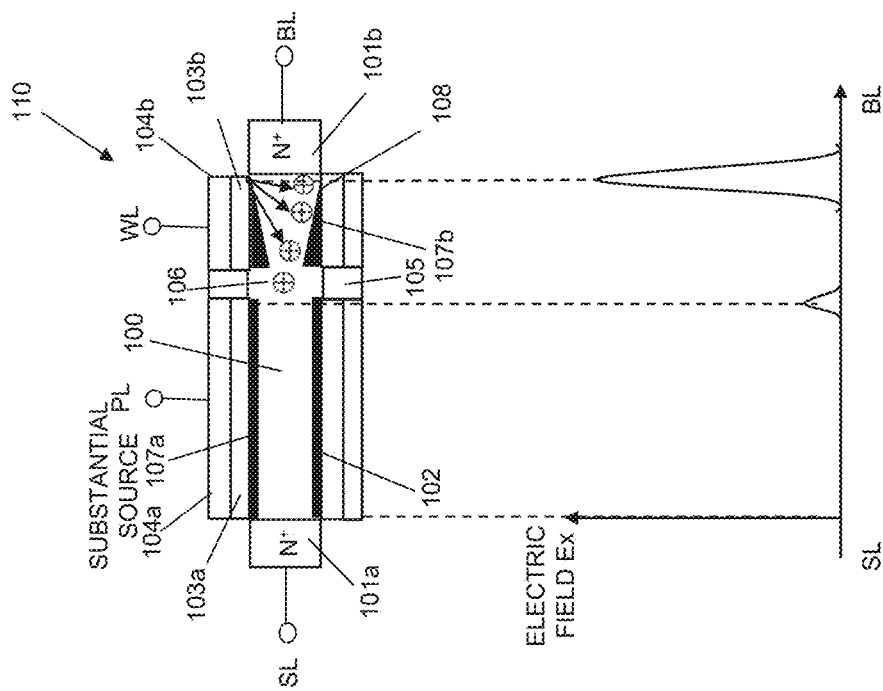
FIG. 5A is a diagram for explaining a write operation mechanism of the memory device including an SGT according to a second embodiment.

FIG. 5A and FIG. 5B illustrate a write operation. As illustrated in FIG. 5A, for example, 0 V is applied to the $N^+$ layer 101a that functions as the source and to which the source line SL is connected, for example, 3 V is applied to the $N^+$ layer 101b that functions as the drain and to which the bit line BL is connected, for example, 5 V is applied to the first gate conductor layer 104a to which the plate line PL is connected, and, for example, 2 V is applied to the second gate conductor layer 104b to which the word line WL is connected. As a result, as illustrated in FIG. 5A, the inversion layer 107a is formed on the entire inner periphery of the first gate conductor layer 104a to which the plate line PL is connected, and the first N-channel MOS transistor region including the first gate conductor layer 104a operates in the linear region. As a result, in the inversion layer 107a formed on the inner periphery of the first gate conductor layer 104a to which the plate line PL is connected, a pinch-off point is not present, and the inversion layer 107a substantially functions as the source of the second N-channel MOS transistor region including the second gate conductor layer 104b. On the other hand, the second N-channel MOS transistor region including the second gate conductor layer 104b to which the word line WL is connected operates in the saturation region. As a result, the inversion layer 107b in which the pinch-off point 108 is present is formed on the inner periphery of the second gate conductor layer 104b to which the word line WL is connected. As a result, the electric field becomes maximum in the vicinity of the $N^+$ layer 101b that functions as the drain of the second N-channel MOS transistor region including the second gate conductor layer 104b to which the word line WL is connected, and impact ionization occurs in this region. Due to the impact ionization phenomenon, the floating body 102 is charged to Vb, which results in a write state "1".

FIG. 5B illustrates example voltage conditions for respective main node contact points at the time of this write operation. For example, the voltage of the plate line PL is set to a high voltage of 5 V, and the voltage of the word line WL is set to a fixed voltage of 2 V lower than the voltage of the plate line PL.

This embodiment has the following feature.

In the first embodiment, as illustrated in FIG. 3D, impact ionization occurs in a region, adjacent to the word line WL, of the first channel region 102a. In contrast, in this embodiment, impact ionization occurs in the second channel region 102b in the vicinity of the $N^+$ layer 101b. Accordingly, as in the first embodiment, the dynamic flash memory operations can be performed.

Third Embodiment

A third embodiment is described with reference to the structural diagram illustrated in FIG. 6.

Figure 6:
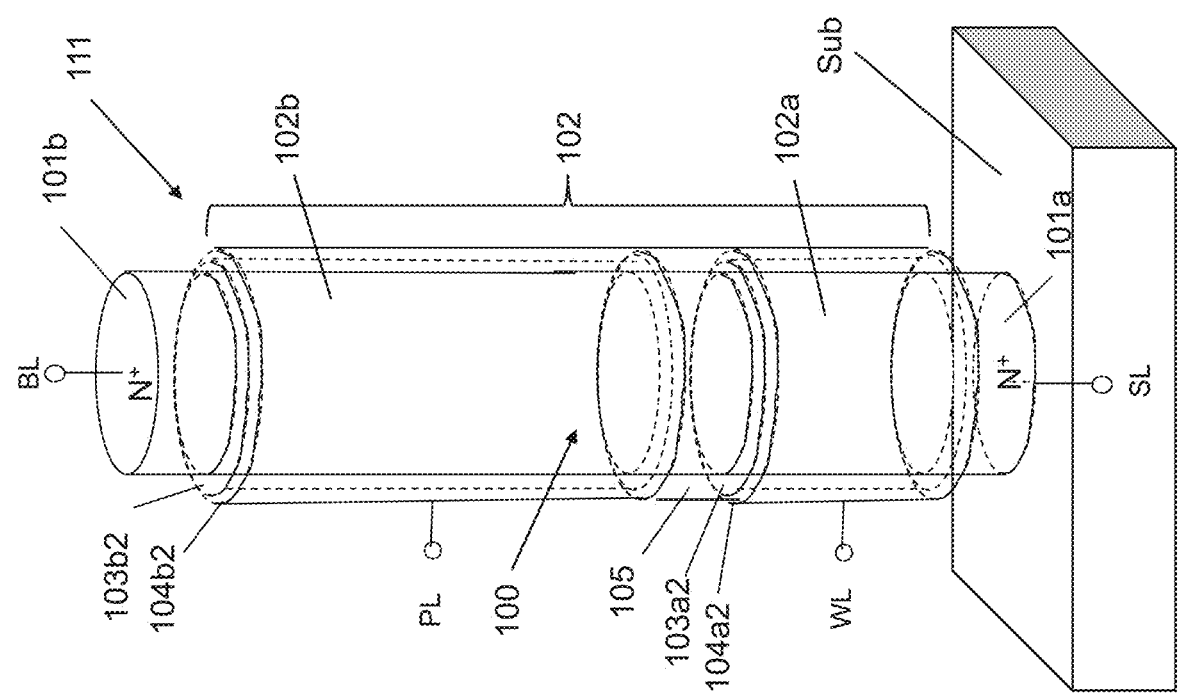
FIG. 6 is a structural diagram of a memory device including an SGT according to a third embodiment.

As illustrated in FIG. 6, the connection position relationship between the word line WL and the plate line PL relative to the Si pillar 100 is upside down relative to the structure illustrated in FIG. 1. Here, a portion of the Si pillar 100 between the $N^+$ layers 101a and 101b that function as the source and the drain functions as the channel region 102. Around the channel region 102, a first gate insulating layer 103a2 and a second gate insulating layer 103b2 are formed. Around the first gate insulating layer 103a2 and the second gate insulating layer 103b2, a first gate conductor layer 104a2 and a second gate conductor layer 104b2 are formed respectively. The dynamic flash memory cell is constituted by the $N^+$ layers 101a and 101b that function as the source and the drain, the channel region 102, the first gate insulating layer 103a2, the second gate insulating layer 103b2, the first gate conductor layer 104a2, and the second gate conductor layer 104b2, which are formed in a pillar form as a whole. Between the first gate conductor layer 104a2 and the second gate conductor layer 104b2, the insulating layer 105 for isolating the first and second gate conductor layers 104a2 and 104b2 from each other is formed. The $N^+$ layer 101a that functions as the source is connected to the source line SL, the $N^+$ layer 101b that functions as the drain is connected to the bit line BL, the first gate conductor layer 104a2 is connected to the word line WL, and the second gate conductor layer 104b2 is connected to the plate line PL.

As illustrated in FIG. 6, a structure is employed in which the gate capacitance of the second gate conductor layer 104b2 to which the plate line PL is connected is made larger than the gate capacitance of the first gate conductor layer 104a2 to which the word line WL is connected, which is a feature. Here, the gate lengths are made different such that the gate length of the second gate conductor layer 104b2 is longer than the gate length of the first gate conductor layer 104a2.

This embodiment has the following feature.

In the first embodiment, as illustrated in FIG. 1, the first N-channel MOS transistor region disposed on the side of the $N^+$ layer 101a that functions as the source and including the first gate conductor layer 104a to which the plate line PL is connected and the second N-channel MOS transistor region disposed on the side of the $N^+$ layer 101b that functions as the drain and including the second gate conductor layer 104b to which the word line WL is connected are connected in series. In this embodiment, as illustrated in FIG. 6, the connection position relationship between the word line WL and the plate line PL relative to the Si pillar 100 is upside down relative to the structure illustrated in FIG. 1. Further, as illustrated in FIG. 6, a structure is employed in which the gate lengths are made different such that the gate length of the second gate conductor layer 104b2 is longer than the gate length of the first gate conductor layer 104a2 to make the gate capacitance of the second gate conductor layer 104b2 to which the plate line PL is connected larger than the gate capacitance of the first gate conductor layer 104a2 to which the word line WL is connected, which is a feature.

Fourth Embodiment

With reference to FIG. 7AA to FIG. 7MC, a production method for a dynamic flash memory according to a fourth embodiment is described. In each figure, (a) is a plan view, (b) is a cross-section structural view cut along line X-X' in (a), and (c) is a cross-section structural view cut along line Y-Y' in (a). In this embodiment, a case where a memory cell region formed of nine memory cells in three rows and three columns is formed is described.

As illustrated in FIGS. 7AA, 7AB and 7AC, a P-layer substrate 1 is made ready.

Figure 7B:
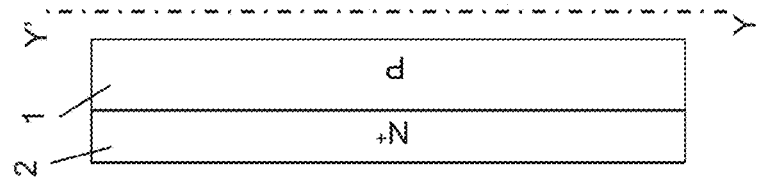
FIGS. 7BA, 7BB and 7BC show a plan view and cross-section structural views for explaining the production method for a memory device including SGTs according to the fourth embodiment.
Figure 7B:
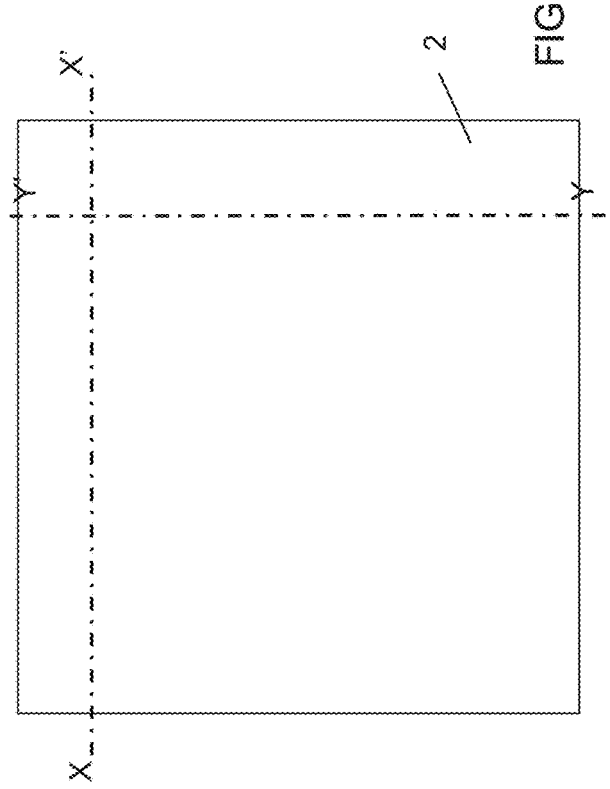
Figure 7B:
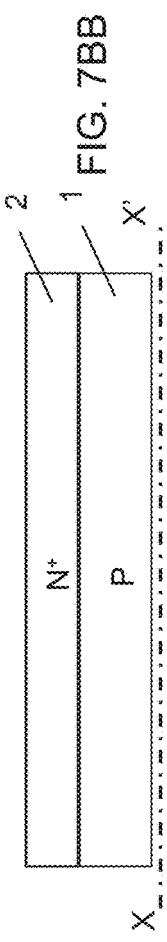

Next, as illustrated in FIGS. 7BA, 7BB and 7BC, an $N^+$ layer 2 is formed on top of the P-layer substrate 1.

Next, as illustrated in FIGS. 7CA, 7CB and 7CC, a P-layer 3 is formed with the epitaxial growth method.

Figure 7D:
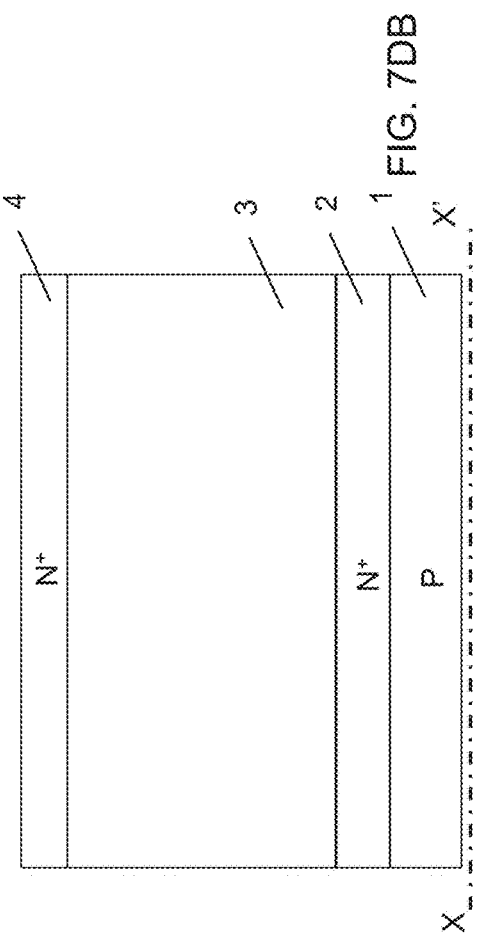
FIGS. 7DA, 7DB and 7DC show a plan view and cross-section structural views for explaining the production method for a memory device including SGTs according to the fourth embodiment.
Figure 7D:
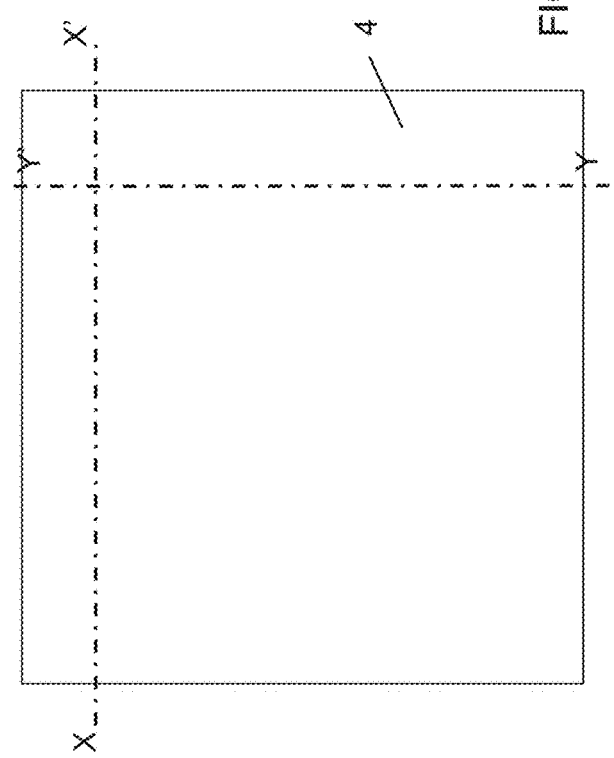
Figure 7D:
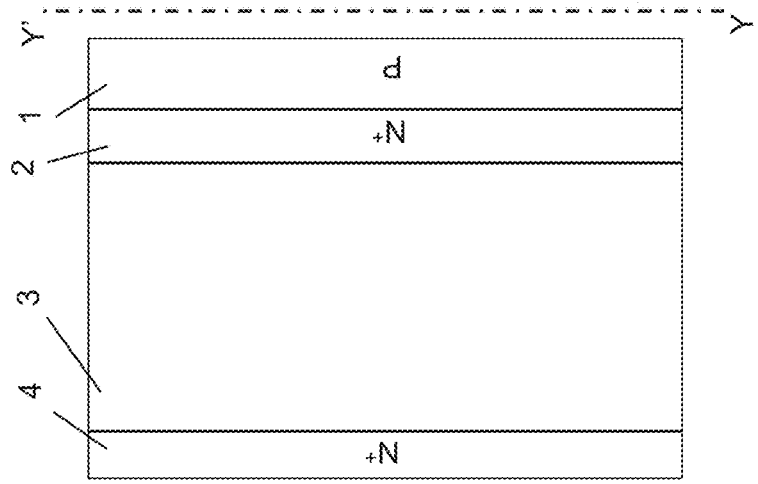

Next, as illustrated in FIGS. 7DA, 7DB and 7DC, an $N^+$ layer 4 is formed on top of the P-layer 3 that is epitaxially grown.

Figure 7E:
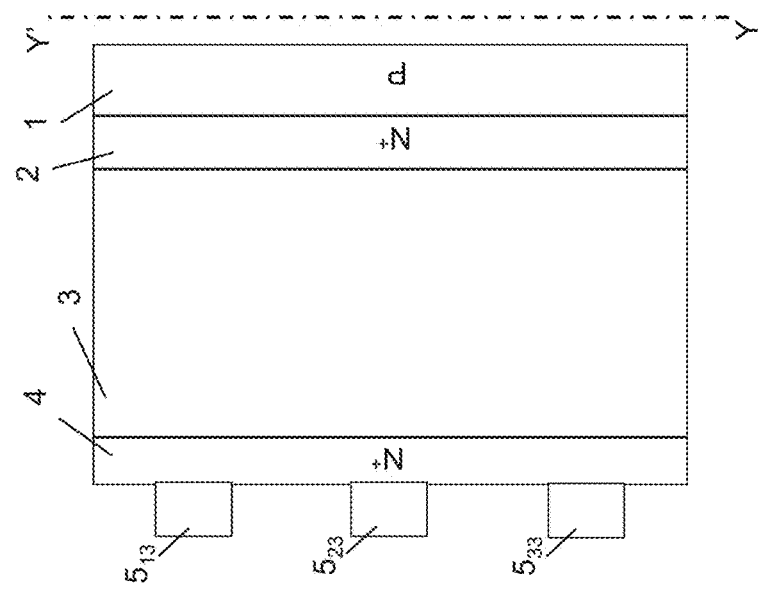
FIGS. 7EA, 7EB and 7EC show a plan view and cross-section structural views for explaining the production method for a memory device including SGTs according to the fourth embodiment.
Figure 7E:
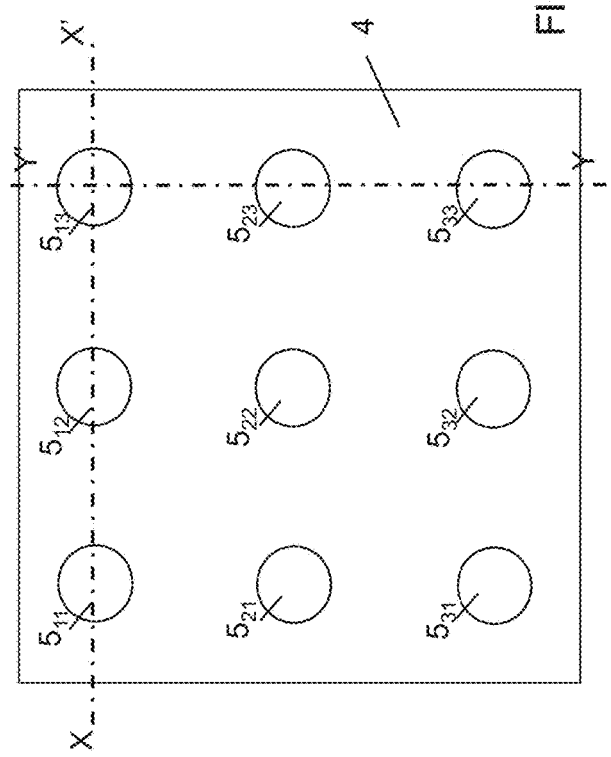
Figure 7E:
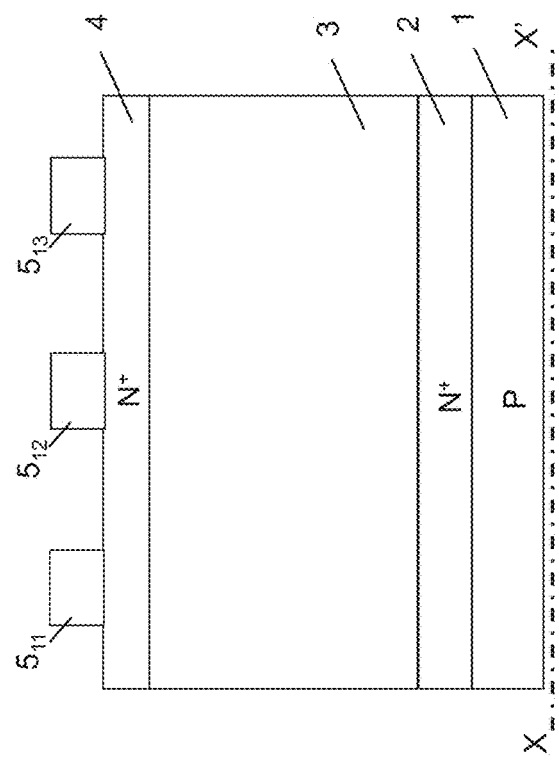

Next, as illustrated in FIGS. 7EA, 7EB and 7EC, a mask material layer (not illustrated) is deposited on top of the $N^+$ layer 4 and mask material layers $5_{11}$ to $5_{33}$ are left by patterning in regions in which Si pillars are formed. The mask material layers $5_{11}$ to $5_{33}$ may be formed by etching with, for example, the Reactive Ion Etching (RIE) method.

Figure 7F:
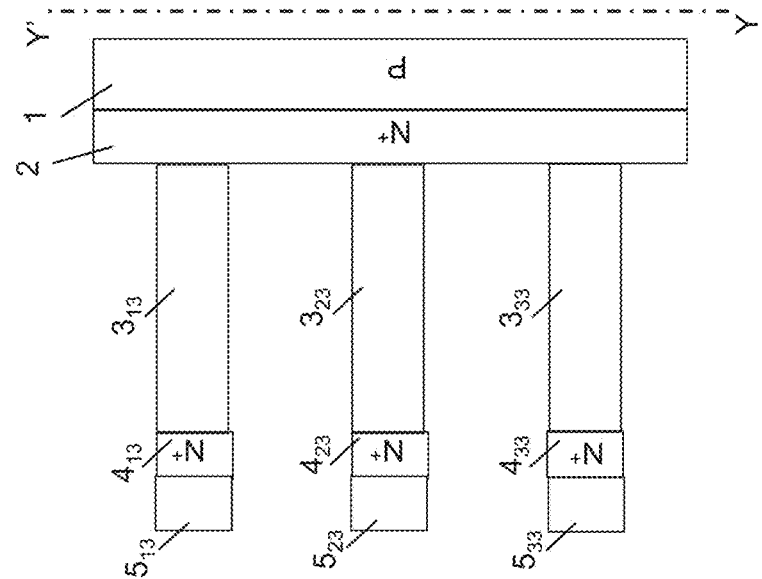
FIGS. 7FA, 7FB and 7FC show a plan view and cross-section structural views for explaining the production method for a memory device including SGTs according to the fourth embodiment.
Figure 7F:
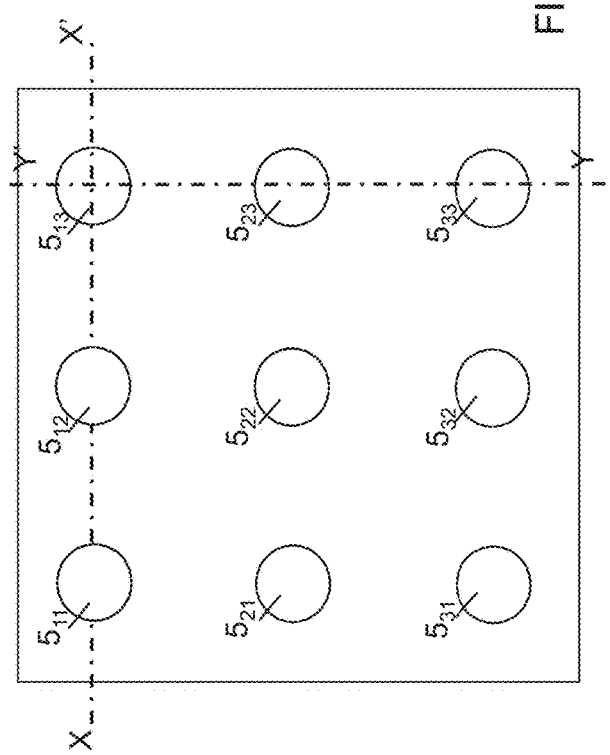
Figure 7F:
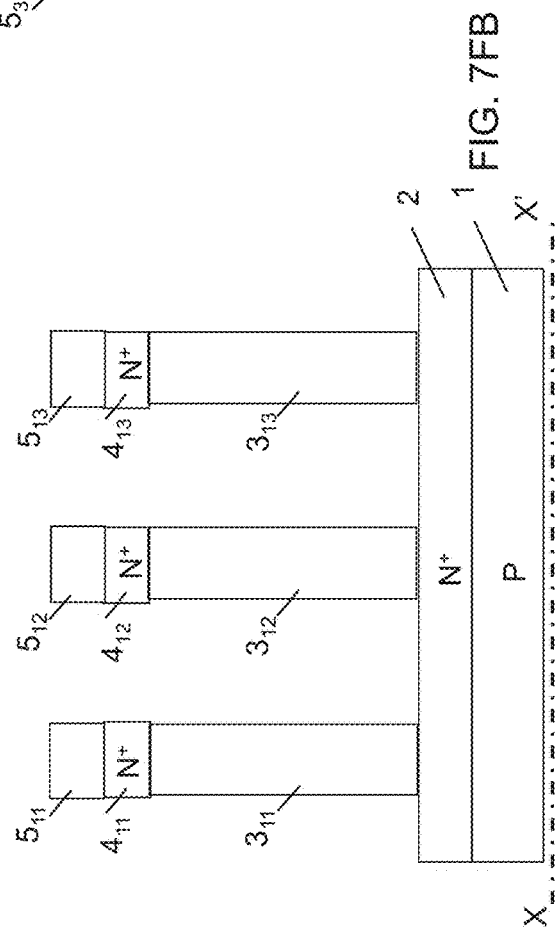

Next, as illustrated in FIGS. 7FA, 7FB and 7FC, etching is performed down to the P-layer 3 that is epitaxially grown with, for example, the RIE method so as to leave the regions covered by the mask material layers $5_{11}$ to $5_{33}$, thereby forming P-layer Si pillars $3_{11}$ to $3_{33}$ respectively having $N^+$ layers $4_{11}$ to $4_{33}$ on top thereof.

Next, as illustrated in FIGS. 7GA, 7GB and 7GC, hafnium oxide ($HfO_2$) layers $6_{11}$ to $6_{33}$, which function as gate insulating layers, are formed around the Si pillars $3_{11}$ to $3_{33}$ respectively with, for example, the Atomic Layer Deposition (ALD) method. The $HfO_2$ layers $6_{11}$ to $6_{33}$ may be formed so as to be connected onto the $N^+$ layer 2 in the outer periphery portions of the P-layer Si pillars $3_{11}$ to $3_{33}$ respectively. The $HfO_2$ layers $6_{11}$ to $6_{33}$ of the Si pillars $3_{11}$ to $3_{33}$ need not be isolated from each other and may be formed so as to be connected to each other on the upper surface of the $N^+$ layer 2.

Figure 7H:
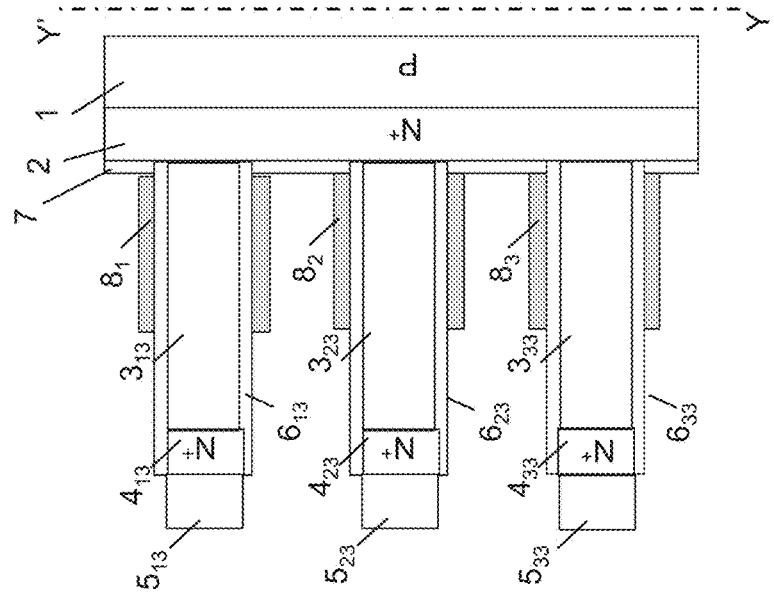
FIGS. 7HA, 7HB and 7HC show a plan view and cross-section structural views for explaining the production method for a memory device including SGTs according to the fourth embodiment.
Figure 7H:
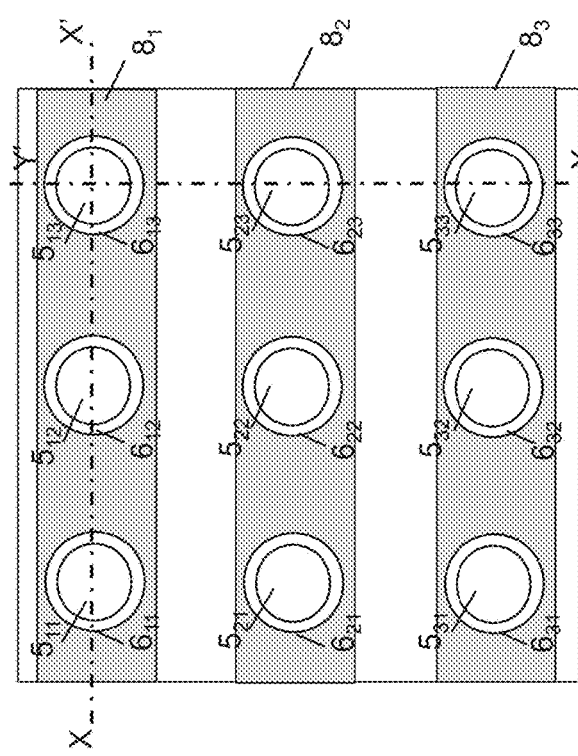
Figure 7H:
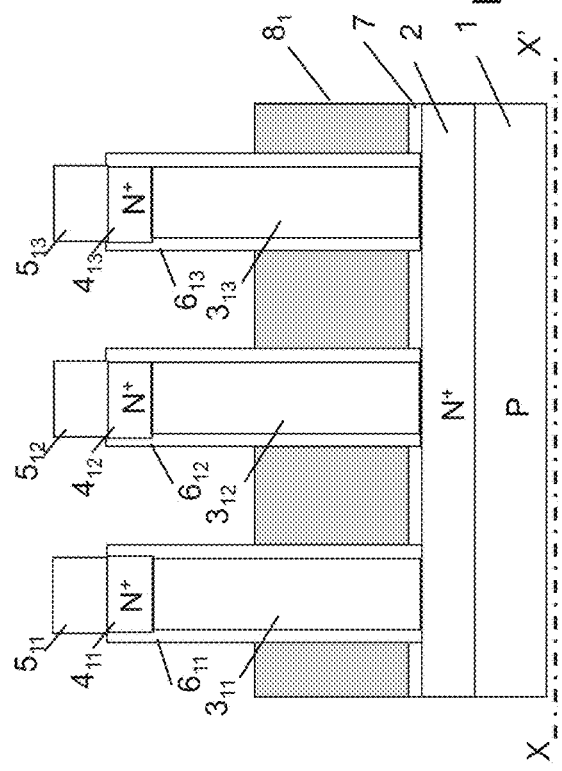
Figure 71C:
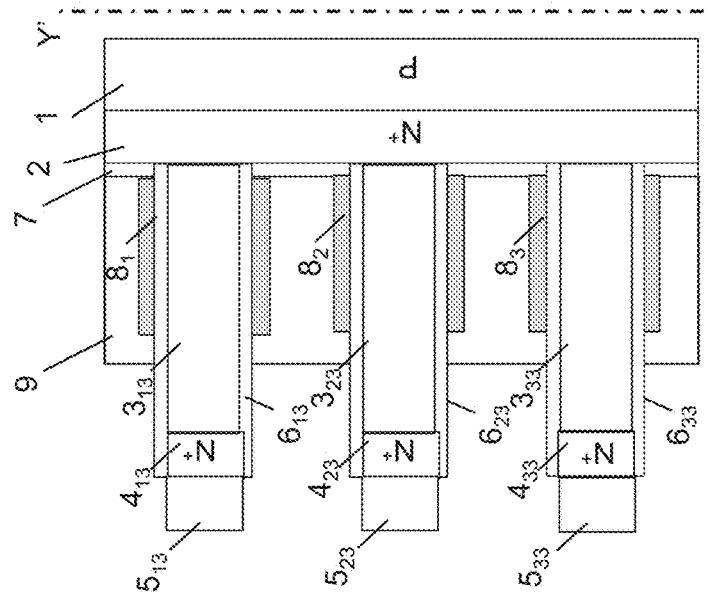
Figure 71A:
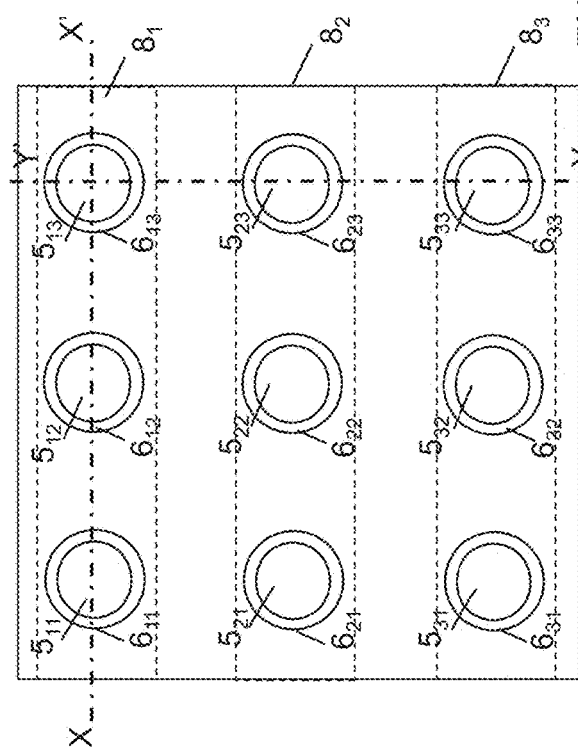
Figure 71B:
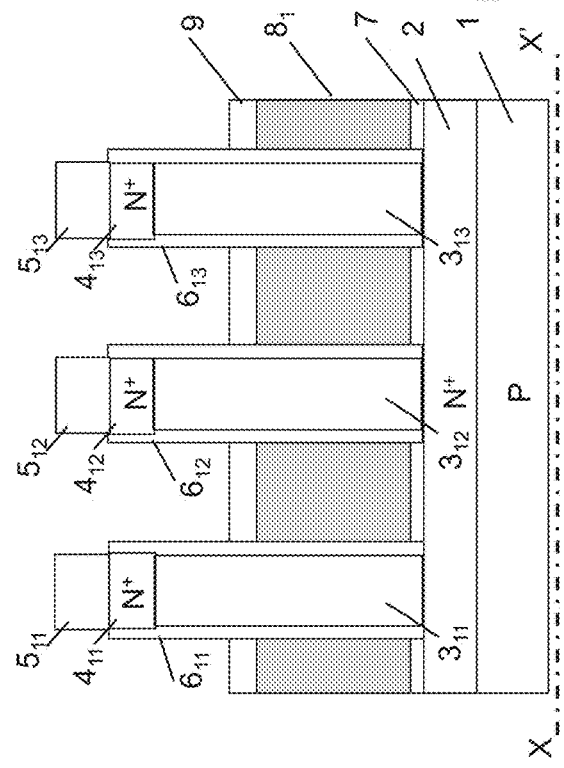

Next, as illustrated in FIGS. 7HA, 7HB and 7HC, a $SiO_2$ layer 7 is laid, and thereafter, a TiN layer (not illustrated) that covers the $HfO_2$ layers $6_{11}$ to $6_{33}$ and functions as gate conductor layers is formed. The TiN layer is etched with the RIE method to form TiN layers $8_1$, $8_2$, and $8_3$, which are first gate conductor layers. The TiN layers $8_1$, $8_2$, and $8_3$, which are first gate conductor layers, form the plate lines PL.

Next, as illustrated in FIGS. 7IA, 7IB and 7IC, a $SiO_2$ layer 9 is laid. The $SiO_2$ layer 9 functions as an inter-layer insulating layer between the plate line PL and the word line WL. On the bottom of the $SiO_2$ layer 9, the TiN layers $8_1$, $8_2$, and $8_3$ and a TiN layer or a different conductor layer may be formed.

Figure 7J:
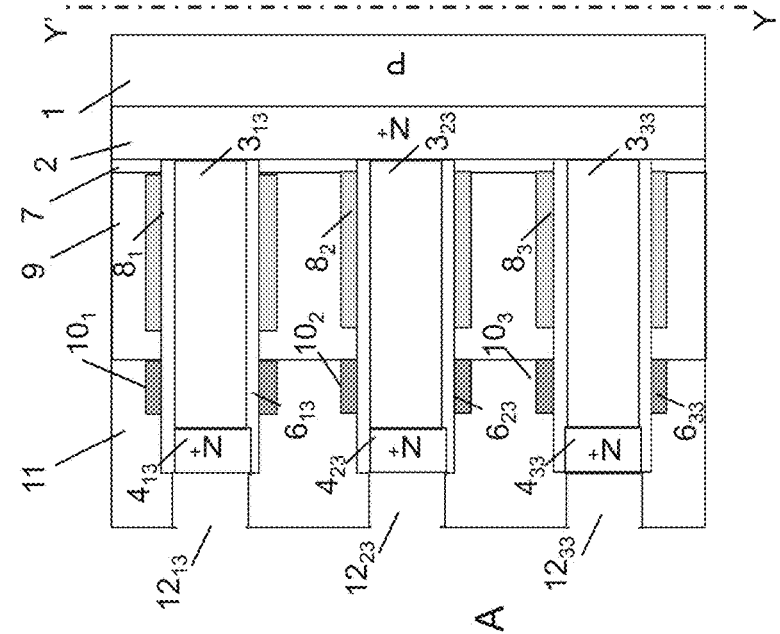
FIGS. 7JA, 7JB and 7JC show a plan view and cross-section structural views for explaining the production method for a memory device including SGTs according to the fourth embodiment.
Figure 7J:
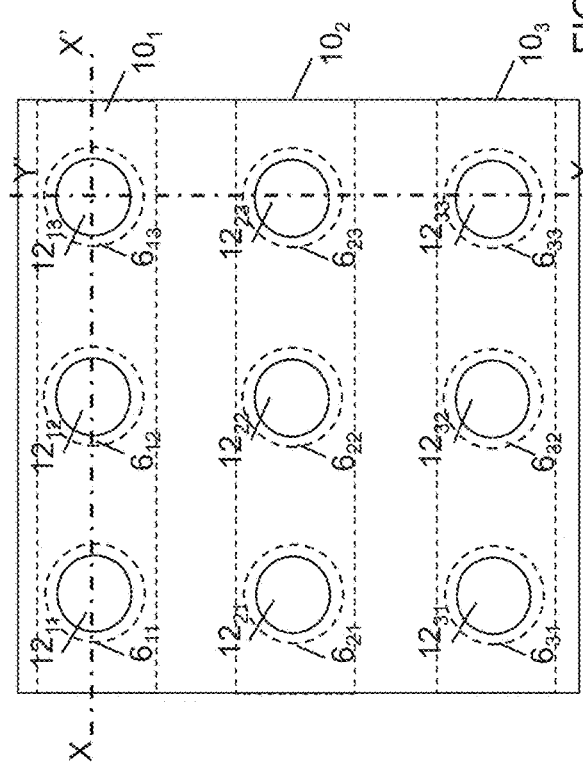
Figure 7J:
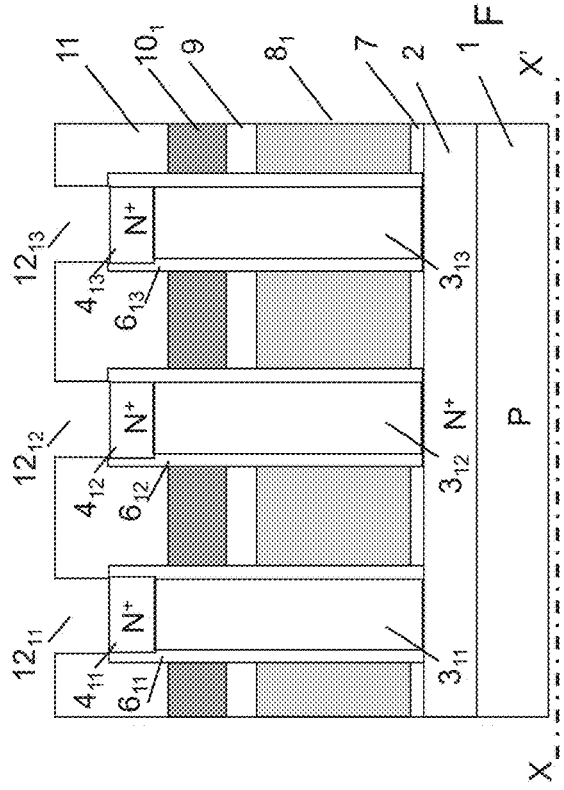

Next, as illustrated in FIGS. 7JA, 7JB and 7JC, a TiN layer (not illustrated) that covers the $HfO_2$ layers $6_{11}$ to $6_{33}$ and functions as second gate conductor layers is formed. The TiN layer is etched with the RIE method to form TiN layers $10_1$, $10_2$, and $10_3$, which are second gate conductor layers. The TiN layers $10_1$, $10_2$, and $10_3$, which are second gate conductor layers, form the word lines WL. Then, a $SiO_2$ layer 11 is laid. Next, the mask material layers $5_{11}$ to $5_{33}$ are etched and removed to make holes $12_{11}$ to $12_{33}$.

Figure 7K:
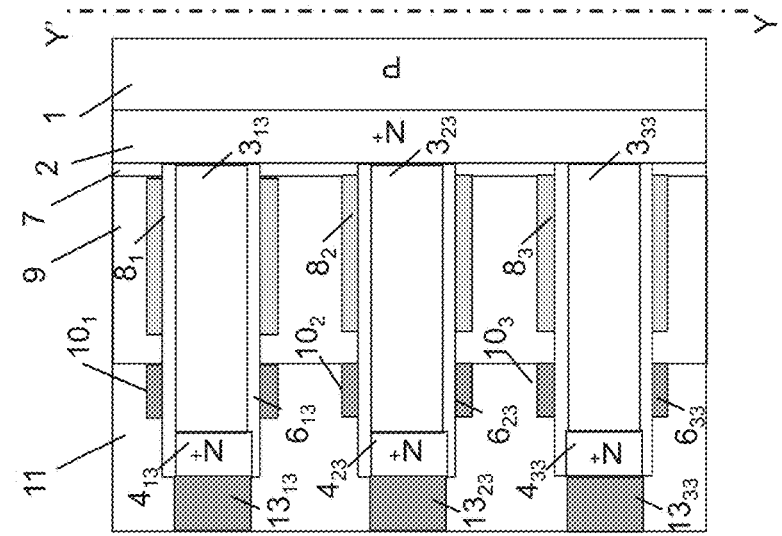
FIGS. 7KA, 7KB and 7KC show a plan view and cross-section structural views for explaining the production method for a memory device including SGTs according to the fourth embodiment.
Figure 7K:
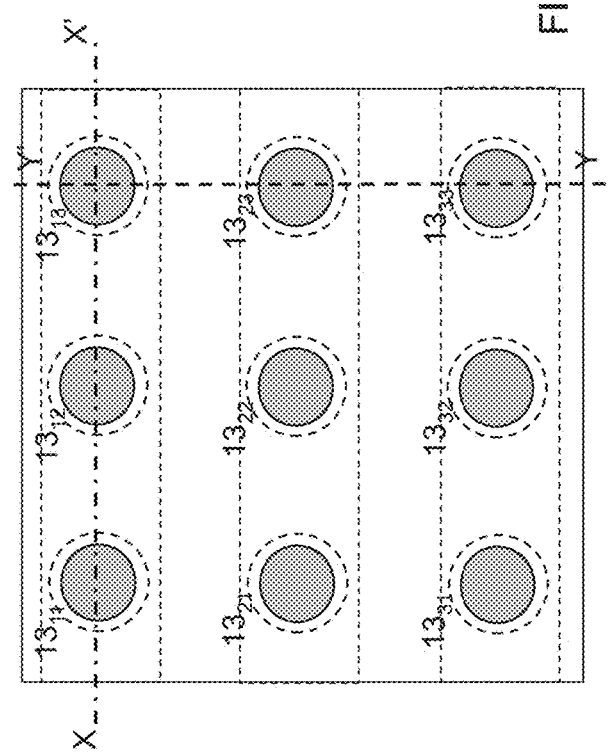
Figure 7K:
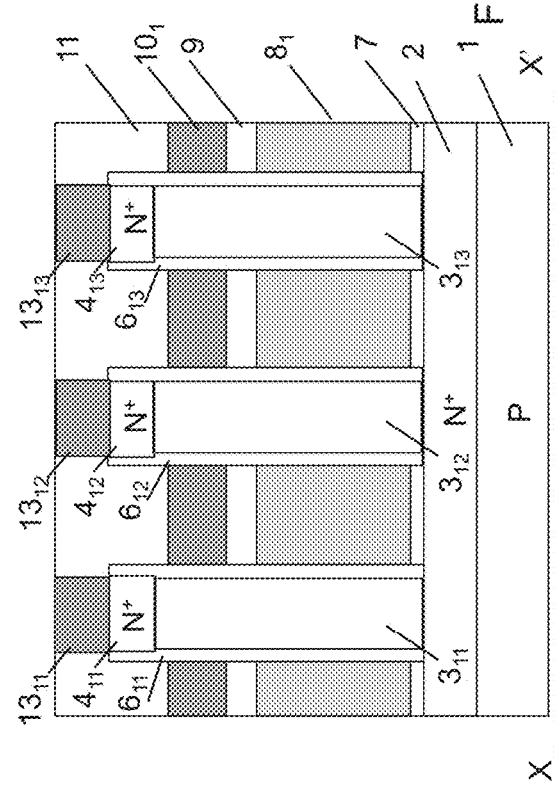

Next, as illustrated in FIGS. 7KA, 7KB and 7KC, the holes $12_{11}$ to $12_{33}$ are filled with conductor layers that are, for example, tungsten W $13_{11}$ to $13_{33}$, with a damascene process.

Next, as illustrated in FIGS. 7LA, 7LB and 7LC, for example, a copper Cu conductor layer (not illustrated) is formed. The copper Cu layer is etched with the RIE method to form, for example, copper Cu layers $14_1$, $14_2$, and $14_3$, which are wiring conductor layers. The copper Cu layers $14_1$, $14_2$, and $14_3$, which are wiring conductor layers, form the bit lines BL. The copper Cu layers $14_1$, $14_2$, and $14_3$ may each be another conductor layer formed of a single layer or a plurality of layers. Further, the tungsten W $13_{11}$ to $13_{33}$ and the copper Cu layers $14_1$, $14_2$, and $14_3$ may be simultaneously formed by using another metal conductor layer.

Last, as illustrated in FIGS. 7MA, 7MB and 7MC, a $SiO_2$ layer 15, which functions as a protective film, is laid, and the dynamic flash memory cell region is completed. In (a), the area of one cell region UC outlined by a dashed line is $4F^2$ when the diameter of the Si pillars $3_{11}$ to $3_{33}$ and the distance between the Si pillars $3_{11}$ to $3_{33}$ adjacent to each other are F. In this dynamic flash memory cell, both the TiN layers $8_1$, $8_2$, and $8_3$ connected to the respective plate lines PL and the TiN layers $10_1$, $10_2$, and $10_3$ connected to the respective word lines WL extend in the direction of X-X' line. The copper Cu layers $14_1$, $14_2$, and $14_3$ connected to the respective bit lines BL extend in the direction of Y-Y' line orthogonal to the word lines WL and the bit lines BL.

This embodiment has the following features.

Feature 1

In this embodiment, as illustrated in FIG. 7AA to FIG. 7MC, the $N^+$ layer 2 is formed on top of the P-layer substrate 1, the P-layer 3 is subsequently formed with the epitaxial growth method, the $N^+$ layer 4 is formed on top of the P-layer 3 that is epitaxially grown, the mask material layer is deposited on top of the $N^+$ layer 4 and etching is performed with the RIE method while the mask material layers $5_{11}$ to $5_{33}$ are left by patterning in the regions in which Si pillars are formed to thereby form the Si pillars. Next, etching is performed with, for example, the RIE method down to the P-layer 3 that is epitaxially grown while the regions covered by the mask material layers $5_{11}$ to $5_{33}$ are left to form the P-layer Si pillars $3_{11}$ to $3_{33}$ respectively having the $N^+$ layers $4_{11}$ to $4_{33}$ on top thereof. Accordingly, the P-layer Si pillars $3_{11}$ to $3_{33}$ having the $N^+$ layer 2 on the bottom thereof and the $N^+$ layers $4_{11}$ to $4_{33}$ on the top thereof can be simultaneously formed. This leads to a simplified production method for the dynamic flash memory.

Feature 2

In this embodiment, the hafnium oxide ($HfO_2$) layers $6_{11}$ to $6_{33}$ that function as gate insulating layers are formed around the Si pillars $3_{11}$ to $3_{33}$ respectively with, for example, the ALD method. Next, the $SiO_2$ layer 7 is laid, and thereafter, the TiN layer that covers the $HfO_2$ layers $6_{11}$ to $6_{33}$ and functions as first gate conductor layers is formed. Then, the TiN layer is etched with the RIE method to form the TiN layers $8_1$, $8_2$, and $8_3$, which are first gate conductor layers. The TiN layers $8_1$, $8_2$, and $8_3$, which are first gate conductor layers, form the plate lines PL. Accordingly, one cell region UC having an area of $4F^2$ when the distance between the Si pillars $3_{11}$ to $3_{33}$ adjacent to each other is F, which is the minimum processing length, is formed.

Fifth Embodiment

With reference to FIGS. 8A to 8E, a block erase operation of a dynamic flash circuit according to a fifth embodiment is described.

FIG. 8A is a circuit diagram illustrating a memory block selected for block erasing. Although nine memory cells $CL_{11}$ to $CL_{33}$ in three rows and three columns are illustrated, the actual memory block is larger than this matrix. To each memory cell, a corresponding one of the source lines $SL_1$ to $SL_3$, a corresponding one of the bit lines $BL_1$ to $BL_3$, a corresponding one of the plate lines $PL_1$ to $PL_3$, and a corresponding one of the word lines $WL_1$ to $WL_3$ are connected. As illustrated in FIG. 8B to FIG. 8E, to the source lines $SL_1$ to $SL_3$ of the memory block selected for block erasing, an erase voltage $V_{ERA}$ is applied. At this time, the voltage applied to the bit lines $BL_1$ to $BL_3$ is $V_{SS}$, and the voltage applied to the word lines $WL_1$ to $WL_3$ is $V_{SS}$. $V_{SS}$ is equal to, for example, 0 V. Although a fixed voltage $V_{ErasePL}$ is applied to the plate lines $PL_1$ to $PL_3$ regardless of whether the block is selected for erasing, $V_{ErasePL}$ may be applied to the plate lines $PL_1$ to $PL_3$ of a selected block and $V_{SS}$ may be applied to the plate lines $PL_1$ to $PL_3$ of a non-selected block. When voltage settings of the signal lines are thus controlled, logical storage data "1" or logical storage data "0" stored in the floating body FB of each memory cell is set to "0". Therefore, whether the logical storage data is in a write state "1" or an erase state "0" is not considered. The potential of the channel region 102 that is the floating body in an erase state "0" becomes equal to $V_{ERA}$+Vb. In a case of, for example, $V_{ERA}$=−3 V and Vb=0.7 V, the potential of the channel region 102 that is the floating body is equal to −2.3 V. Note that Vb is the built-in voltage of the PN junction between the N+ layer that forms the source line SL and the channel region 102 that is the floating body, and is equal to about 0.7 V. When the channel region 102 is negative biased to −2.3 V, the threshold voltage of the second N-channel MOS transistor region to which the word line WL is input rises due to a back-bias effect.

Erasing is performed on a per memory block basis, and therefore, a cash memory for temporarily storing data of the memory block and a logical address-physical address conversion table for the memory block are necessary. These may be provided in the dynamic flash memory device or in a system that handles the dynamic flash memory device.

This embodiment has the following feature.

To the source lines $SL_1$ to $SL_3$ of the memory block selected for block erasing, the erase voltage $V_{ERA}$ is applied. As a result, logical storage data "1" or logical storage data "0" stored in the channel region 102 that is a floating body of each memory cell in the selected block is set to "0". The potential of the channel region 102 in an erase state "0" becomes equal to $V_{ERA}$+Vb. Here, Vb is the built-in voltage of the PN junction between the N+ layer that forms the source line SL and the channel region 102. When the channel region 102 is negative biased, the threshold voltage of the second N-channel MOS transistor region to which the word line WL is input rises due to a back-bias effect. Accordingly, a block erase operation can be easily implemented.

Sixth Embodiment

With reference to FIGS. 9A to 9C, a page write operation of a dynamic flash circuit according to a sixth embodiment is described.

FIG. 9A is a circuit diagram of a memory block selected for page writing. To the bit line $BL_2$ via which "1" is written, $V_{ProgBL}$ is applied, and to the bit lines $BL_1$ and $BL_3$ via which writing is not performed and that is kept in an erase state "0", $V_{SS}$ is applied. Here, for example, $V_{ProgBL}$ is equal to 3 V, and $V_{SS}$ is equal to 0 V. To the word line $WL_2$ via which page writing is performed, $V_{ProgWL}$ is applied, and to the word lines $WL_1$ and $WL_3$ via which page writing is not performed, $V_{SS}$ is applied. Here, for example, $V_{ProgWL}$ is equal to 5 V, and $V_{SS}$ is equal to 0 V. To the plate lines $PL_1$ to $PL_3$, $V_{ProgPL}$ is applied regardless of selection or non-selection for page writing. Here, for example, $V_{ProgPL}$ is equal to 2 V. Voltage settings of the signal lines are thus controlled to thereby perform page writing. For the memory cell $CL_{22}$, $V_{ProgBL}$ is applied to the bit line $BL_2$ connected to the memory cell $CL_{22}$, $V_{ProgWL}$ is applied to the word line $WL_2$ connected thereto, and $V_{ProgPL}$ is applied to the plate line $PL_2$ connected thereto. Therefore, between the two layers of gates to which the word line $WL_2$ and the plate line $PL_2$ are input respectively, a source-side impact ionization phenomenon occurs. As a result, in the channel region 102 that is the floating body of the memory cell $CL_{22}$, among electron-positive hole pairs generated by the source-side impact ionization phenomenon, a group of positive holes that are majority carriers in the channel region 102 are stored, the voltage of the channel region 102 rises up to Vb, and "1" is written. Here, Vb is the voltage of the PN junction between the source N+ layer to which the source line SL is connected and the channel region 102 and is equal to, for example, 0.7 V. When the channel region 102 is positive biased to 0.7 V, the threshold voltage of the second N-channel MOS transistor region to which the word line WL is input decreases due to a back-bias effect. In the same selected page, to the bit lines $BL_1$ and $BL_3$ respectively connected to the memory cells $CL_{21}$ and $CL_{23}$ to which "1" is not written and that are kept in an erase state, $V_{SS}$ is applied. Therefore, in each of the memory cells $CL_{21}$ and $CL_{23}$, a current does not flow from the drain to the source, a source-side impact ionization phenomenon does not occur, and logical storage data representing an erase state "0" is maintained.

This embodiment has the following feature.

When a page write operation is started, to the bit line $BL_2$ via which "1" is written, $V_{ProgBL}$ is applied, and to the bit lines $BL_1$ and $BL_3$ via which writing is not performed and that are kept in an erase state "0", $V_{SS}$ is applied. For the memory cell $CL_{22}$, $V_{ProgBL}$ is applied to the bit line $BL_2$ connected to the memory cell $CL_{22}$, $V_{ProgWL}$ is applied to the word line $WL_2$ connected thereto, and $V_{ProgPL}$ is applied to the plate line $PL_2$ connected thereto. Therefore, between the two layers of gates to which the word line $WL_2$ and the plate line $PL_2$ are input respectively, a source-side impact ionization phenomenon occurs. As a result, in the channel region 102 that is the floating body of the memory cell $CL_{22}$, among electron-positive hole pairs generated by the source-side impact ionization phenomenon, positive holes that are majority carriers in the channel region 102 are stored, the voltage of the channel region 102 rises up to Vb, and "1" is written. Here, Vb is the voltage of the PN junction between the N+ layer that functions as the source and to which the source line SL is connected and the channel region 102. When the channel region 102 is positive biased, the threshold voltage of the second N-channel MOS transistor region to which the word line WL is input decreases due to a back-bias effect. In the same selected page, to the bit lines $BL_1$ and $BL_3$ respectively connected to the memory cells $CL_{21}$ and $CL_{23}$ to which "1" is not written and that are kept in an erase state, $V_{SS}$ is applied. Therefore, in each of the memory cells $CL_{21}$ and $CL_{23}$, a current does not flow from the drain to the source, a source-side impact ionization phenomenon does not occur, and logical storage data representing an erase state "0" is maintained.

Seventh Embodiment

With reference to FIGS. 10A to 10C, a page read operation of a dynamic flash circuit according to a seventh embodiment is described.

To the source lines $SL_1$ to $SL_3$, $V_{SS}$ is applied, and to the bit lines $BL_1$ to $BL_3$, $V_{ReadBL}$ is applied. Here, for example, $V_{SS}$ is equal to 0 V, and $V_{ReadBL}$ is equal to 1 V. To the word line $WL_2$ selected for page reading, $V_{ReadWL}$ is applied. Here, for example, $V_{ReadWL}$ is equal to 2 V. To the plate lines $PL_1$ to $PL_3$, $V_{ReadPL}$ is applied regardless of selection or non-selection for page reading. Here, for example, $V_{ReadPL}$ is equal to 2 V. Voltage settings of the signal lines are thus controlled to thereby perform page reading. In a memory cell in which the potential of the channel region 102 is equal to $V_{ERA}$+Vb and that is in an erase state "0", the threshold voltage is high, and therefore, a current does not flow through the memory cell, the bit line BL is not discharged, and $V_{ReadBL}$ is maintained. On the other hand, in a memory cell in which the potential of the channel region 102 is equal to Vb and that is in a write state "1", the threshold voltage is low, and therefore, a current flows through the memory cell, the bit line BL is discharged, and the voltage changes from $V_{ReadBL}$ to $V_{SS}$. The potential states of these two bit lines BL are read by a sense amplifier, and it is determined whether logical storage data in each memory cell is "1" or "0" (not illustrated).

This embodiment has the following feature.

When a page read operation is started, in a memory cell in which the potential of the floating body FB is equal to $V_{ERA}$+Vb and that is in an erase state "0", the threshold voltage is high, and therefore, a current does not flow through the memory cell, the bit line BL is not discharged, and $V_{ReadBL}$ is maintained. On the other hand, in a memory cell in which the potential of the floating body FB is equal to Vb and that is in a write state "1", the threshold voltage is low, and therefore, a current flows through the memory cell, the bit line BL is discharged, and the voltage changes from $V_{ReadBL}$ to $V_{SS}$. The potential states of these two bit lines BL are read by a sense amplifier. Accordingly, it can be determined whether logical storage data in each memory cell is "1" or "0".

Eighth Embodiment

Figure 11B:
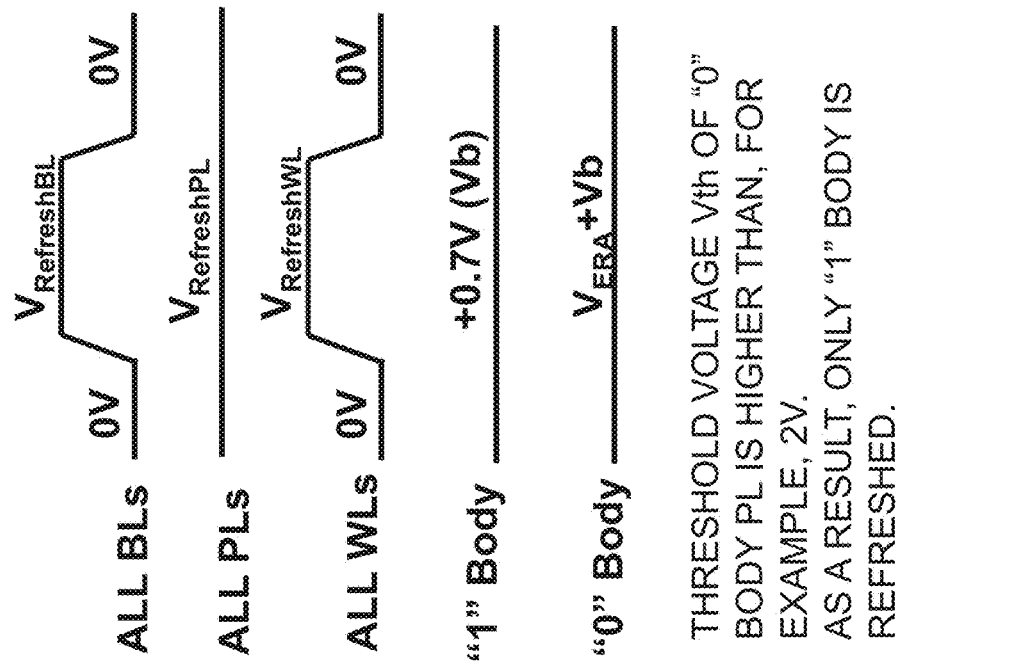
FIG. 11B includes a circuit block diagram or a timing operation waveform diagram for explaining the block refresh operation of a memory device including SGTs according to the eighth embodiment.
Figure 11A:
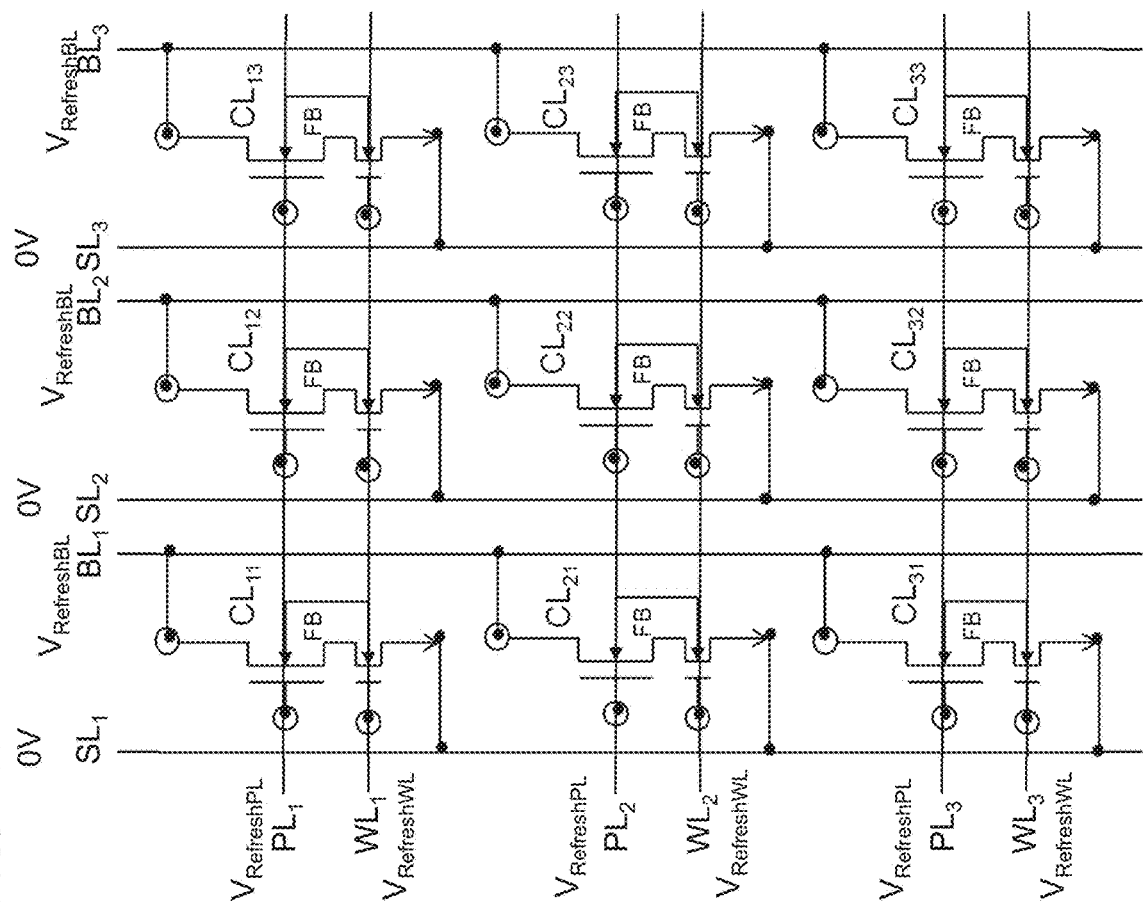
FIG. 11A includes a circuit block diagram or a timing operation waveform diagram for explaining a block refresh operation of a memory device including SGTs according to an eighth embodiment.

With reference to FIGS. 11A to 11C, a block refresh operation of a dynamic flash circuit according to an eighth embodiment is described.

As illustrated in FIG. 11A and FIG. 11B, $V_{SS}$ is applied to the source lines $SL_1$ to $SL_3$ of a memory block selected for refreshing, and $V_{RefreshBL}$ is applied to the bit lines $BL_1$ to $BL_3$ thereof. Here, for example, $V_{SS}$ is equal to 0 V, and $V_{RefreshBL}$ is equal to 3 V. To the plate lines $PL_1$ to $PL_3$, a fixed voltage $V_{RefreshPL}$ is applied regardless of whether the block is selected for refreshing; however, $V_{RefreshPL}$ may be applied to the plate lines $PL_1$ to $PL_3$ of a selected block and $V_{SS}$ may be applied to the plate lines $PL_1$ to $PL_3$ of a non-selected block. To the word lines $WL_1$ to $WL_3$ of a memory block to be refreshed, $V_{RefreshWL}$ is applied. Here, for example, $V_{RefreshPL}$ is equal to 2 V, and $V_{RefreshWL}$ is equal to 3 V. When voltage settings of the signal lines are thus controlled, for logical storage data "1" stored in the channel region 102 that is the floating body of a memory cell, the threshold voltage of the first N-channel MOS transistor region to which the plate line PL is connected and the threshold voltage of the second N-channel MOS transistor region to which the word line WL is connected are low, and therefore, even when the voltages applied to the respective lines are $V_{RefreshPL}$ and $V_{RefreshWL}$ that are lower than the page write voltage, a current flows through the memory cell, a source-side impact ionization phenomenon occurs between the two gates, and generated positive holes are stored in the channel region 102. As a result, the memory cells in a write state "1" are refreshed on a per memory block basis. FIG. 11C illustrates example voltage conditions for respective main node contact points at the time of block refreshing.

Although refreshing of memory cells in an erase state "0" on a per memory block basis is not possible, refreshing can be performed by temporarily storing memory block data in a cash in the memory chip or in a system, erasing the memory block, and rewriting the logical storage data. Alternatively, a conversion table for conversion between logical block addresses and physical block addresses may be provided in the memory chip or in a system, and data after refreshing may be stored at a physical block address different from the previous one.

This embodiment has the following feature.

When a block refresh operation is started, for logical storage data "1" stored in the channel region 102 that is the floating body of a memory cell, the threshold voltage of the first N-channel MOS transistor region to which the plate line PL is connected and the threshold voltage of the second N-channel MOS transistor region to which the word line WL is connected are low, and therefore, even when the voltages applied to the respective lines are $V_{RefreshPL}$ and $V_{RefreshWL}$ that are lower than the page write voltage, a current flows through the memory cell, a source-side impact ionization phenomenon occurs between the two gates, and generated positive holes are stored in the channel region 102 that is the floating body. As a result, the memory cells in a write state "1" are refreshed on a per memory block basis.

Ninth Embodiment

With reference to FIGS. 12A to 12C, a page erase operation of a dynamic flash circuit according to a ninth embodiment is described.

As illustrated in FIG. 12A and FIG. 12B, when a page erase operation is started, the voltage of the plate line PL other than the plate line PL connected to memory cells for which page erasing is performed decreases from a continuously applied fixed voltage to $V_{SS}$. The gate capacitance of the gate to which the plate line PL is connected is large, and therefore, the voltage of the floating body FB of a memory cell that stores "1" data or "0" data decreases due to capacitive coupling. As a result, the memory cell is protected such that already written "1" data is not rewritten by page erasing. Only to the plate line $PL_2$ connected to memory cells for which page erasing is performed, $V_{PageErasePL}$ is applied. $V_{PageErasePL}$ is equal to, for example, 2 V. At this time, to the word line $WL_2$ connected to the memory cells for which page erasing is performed, $V_{PageEraseWL}$ is applied. $V_{PageEraseWL}$ is equal to $V_{SS}$ and, for example, is 0 V. To the source lines $SL_1$ to $SL_3$, $V_{ERAPage}$ is applied. $V_{ERAPage}$ is set to a voltage higher than $V_{ERA}$, which is a voltage applied to the bit line for block erasing. For example, $V_{ERA}$ is equal to −3 V while $V_{ERAPage}$ is equal to −1 V. This is for protection to prevent rewriting of data in a memory cell to which "1" is already written and data in a memory cell for which "0" erasing is maintained in the same block for which page erasing is performed.

When a page write operation of a dynamic flash circuit according to the sixth embodiment illustrated in FIGS. 9A to 9C is performed after page erasing, new data can be written to the page after page erasing. FIG. 12C illustrates example voltage conditions for respective main node contact points at the time of page erasing.

This embodiment has the following feature.

When a page erase operation is started, the voltage of the plate line PL other than the plate line PL connected to memory cells for which page erasing is performed decreases from a continuously applied fixed voltage to $V_{SS}$. The gate capacitance of the gate to which the plate line PL is connected is large, and therefore, the voltage of the floating body FB of a memory cell that stores "1" data or "0" data decreases due to capacitive coupling. As a result, the memory cell is protected such that already written "1" data is not rewritten by page erasing. Only to the plate line $PL_2$ connected to memory cells for which page erasing is performed, $V_{PageErasePL}$ is applied. To the source lines $SL_1$ to $SL_3$, $V_{ERAPage}$ is applied. Accordingly, page erasing can be performed with certainty.

Tenth Embodiment

Figure 13A:
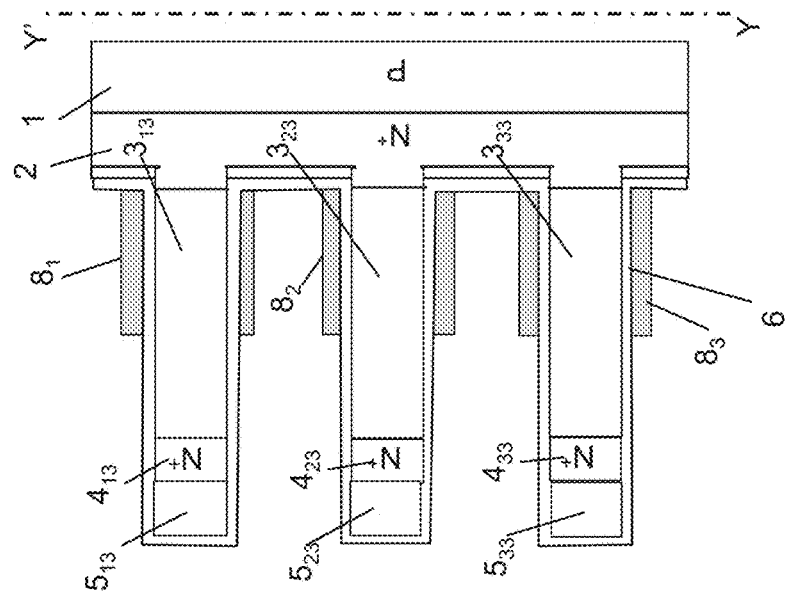
FIGS. 13AA, 13AB and 13AC show a plan view and cross-section structural views for explaining a production method for a memory device including SGTs according to a tenth embodiment.
Figure 13A:
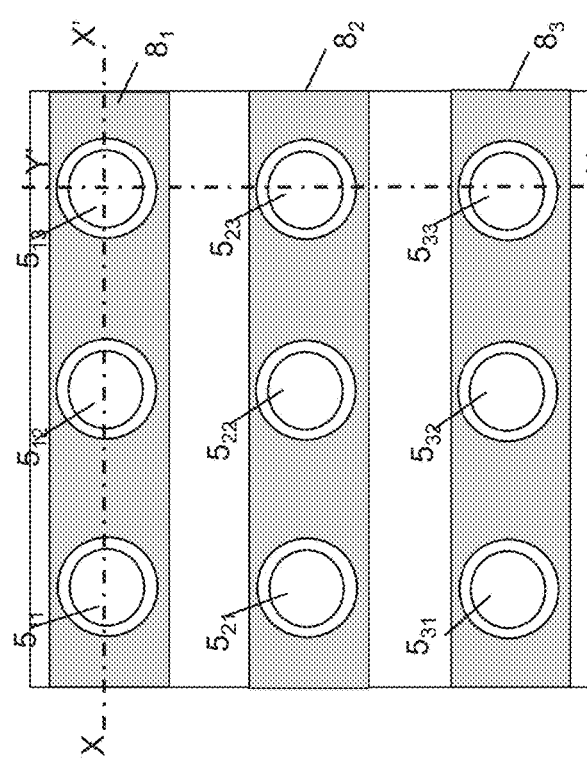
Figure 13A:
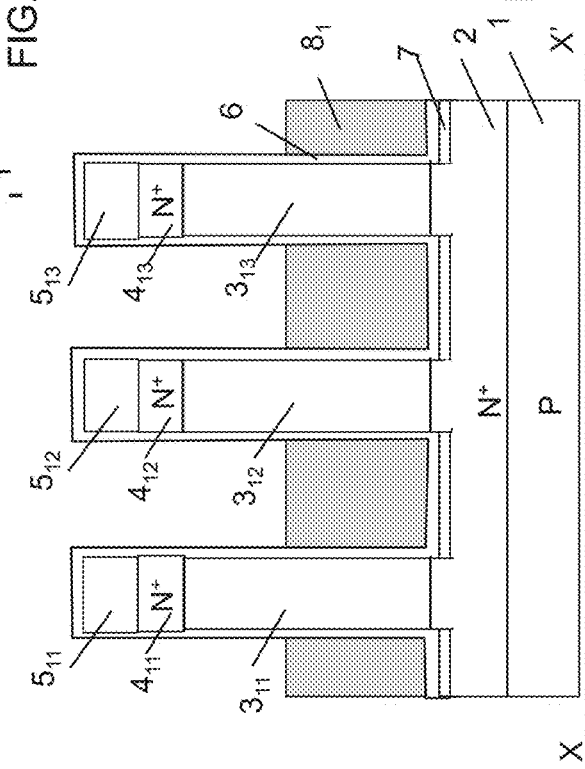

With reference to FIGS. 13AA to FIG. 13EC, a production method for a dynamic flash memory according to a tenth embodiment is described. Each of 13AA, 13BA, 13CA, 13DA and 13EA is a plan view, each of 13AB, 13BB, 13CB, 13DB and 13EB is a cross-section structural view cut along line X-X' in 13AA, 13BA, 13CA, 13DA and 13EA, and each of 13AC, 13BC, 13CC, 13DC and 13EC is a cross-section structural view cut along line Y-Y' in 13AA, 13BA, 13CA, 13DA and 13EA. In this embodiment, a case where a memory cell region formed of nine memory cells in three rows and three columns is formed is described. In an actual memory device, memory cells need not be in three rows and three columns, and a plurality of dynamic flash memory cells are formed in two dimensions.

The processes illustrated in FIG. 7AA to FIG. 7FC are performed. Then, the $SiO_2$ layer 7 is formed as illustrated in FIGS. 13AA, 13AB and 13AC, and thereafter, a $HfO_2$ layer 6 is laid over the entire region with, for example, the ALD method. Then, the TiN layers $8_1$, $8_2$, and $8_3$ that surround the $HfO_2$ layer 6, extend in the direction of X-X' line, and are first gate conductor layers are formed as in FIGS. 7HA, 7HB and 7HC.

Figure 13B:
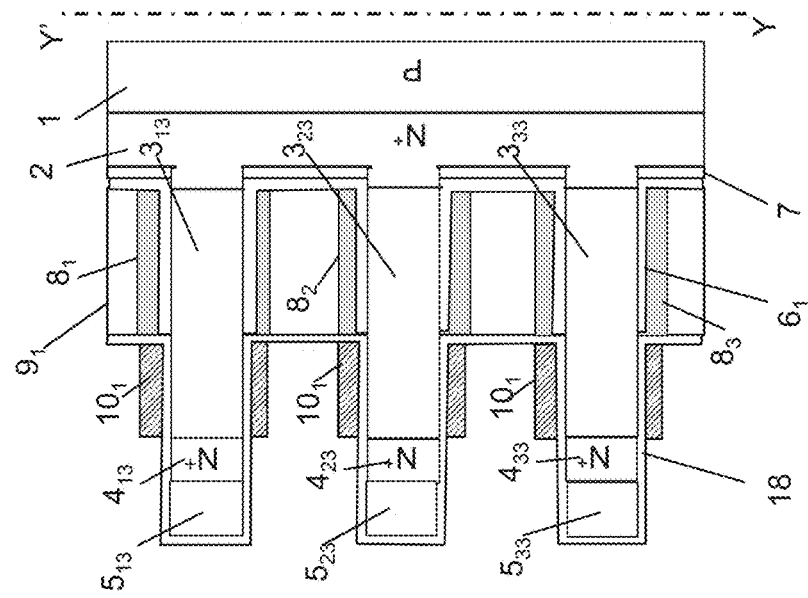
FIGS. 13BA, 13BB and 13BC show a plan view and cross-section structural views for explaining the production method for a memory device including SGTs according to the tenth embodiment.
Figure 13B:
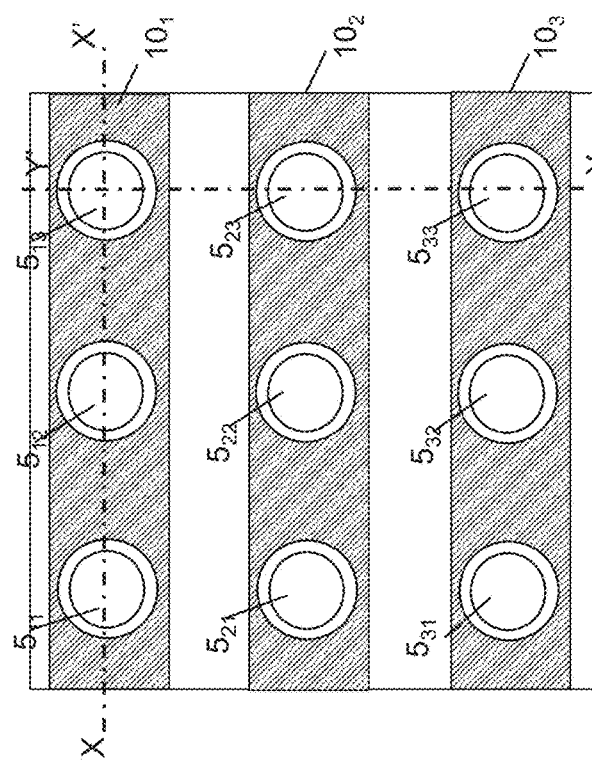
Figure 13B:
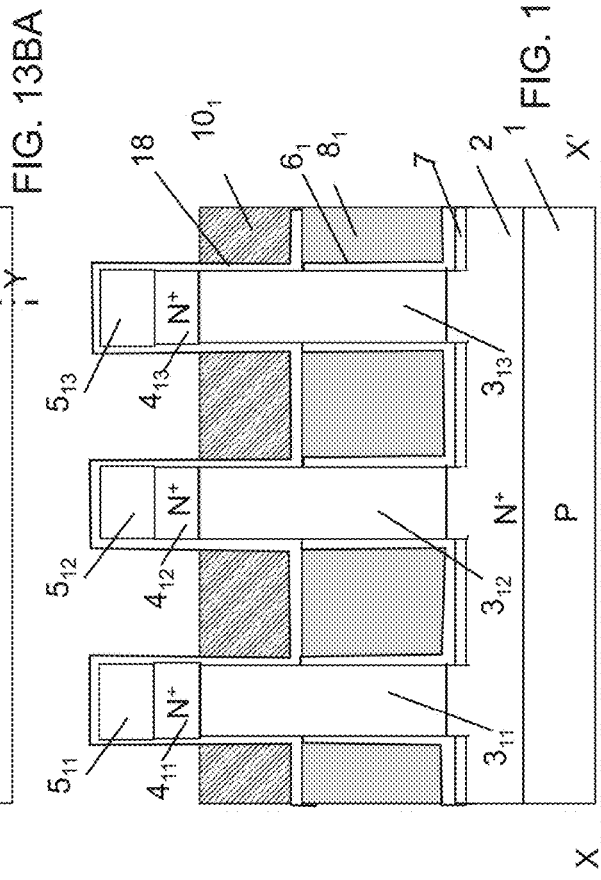

Next, as illustrated in FIGS. 13BA, 13BB and 13BC, a $SiO_2$ layer $9_1$ is formed in the outer periphery portions of the TiN layers $8_1$, $8_2$, and $8_3$. Then, portions of the $HfO_2$ layer 6 above the upper ends of the TiN layers $8_1$, $8_2$, and $8_3$ are entirely removed to form a $HfO_2$ layer $6_1$, which form first gate insulating layers. Then, a $HfO_2$ layer 18 is laid over the entire region. Then, as in the process illustrated in FIGS. 7JA, 7JB and 7JC, the TiN layers $10_1$, $10_2$, and $10_3$ that extend in the direction of X-X' line and are second gate conductor layers are formed. By washing before forming the $HfO_2$ layer 18, each of the Si pillars $3_{11}$ to $3_{33}$ becomes thinner in a portion above the upper end of the $HfO_2$ layer $6_1$. A process may be performed in which the exposed surface of each of the Si pillars $3_{11}$ to $3_{33}$ may be oxidized to form a thin oxidation film, and the thin oxidation film is removed.

Next, as illustrated in FIGS. 13CA, 13CB and 13CD, a $SiO_2$ layer 19 having an upper surface that is on a level with the upper surfaces of the mask material layers $5_{11}$ to $5_{33}$ is formed by using the chemical vapor deposition (CVD) method and the chemical mechanical polish (CMP) method. Then, contact holes $19_1$ and $19_2$ that are respectively positioned between the TiN layers $8_1$ and $8_2$ and between the TiN layers $8_2$ and $8_3$ and extend in the direction of X-X' line in plan view are made on the $N^+$ layer 2.

Figure 13D:
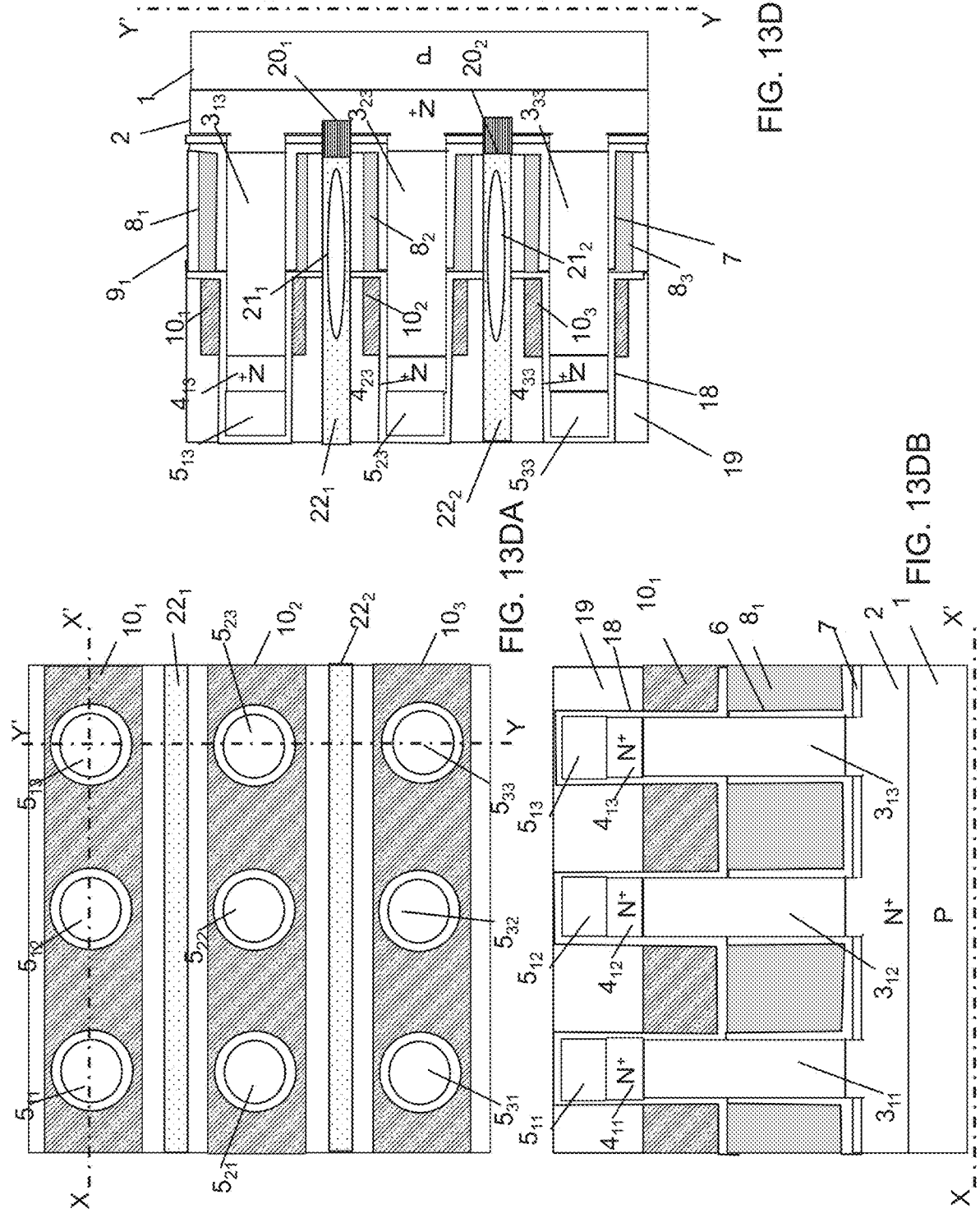
FIGS. 13DA, 13DB and 13DC show a plan view and cross-section structural views for explaining the production method for a memory device including SGTs according to the tenth embodiment.

Next, as illustrated in FIGS. 13DA, 13DB and 13DC, in the bottom portions of the contact holes $19_1$ and $19_2$, W layers $20_1$ and $20_2$ are formed respectively so as to be in contact with the $N^+$ layer 2. On the W layers $20_1$ and $20_2$, $SiO_2$ layers $22_1$ and $22_2$ having holes $21_1$ and $21_2$ that extend in the X-X' direction are formed respectively. Note that the W layers $20_1$ and $20_2$ need not be formed.

Next, processes similar to the processes illustrated in FIG. 7IA to FIG. 7KC are performed to form a $SiO_2$ layer $11_1$ that surrounds the TiN layers $10_1$, $10_2$, and $10_3$ and a $SiO_2$ layer $11_2$ that covers the $N^+$ layers $4_{11}$ to $4_{33}$ as illustrated in FIGS. 13EA, 13EB and 13EC. On the $N^+$ layers $4_{11}$ to $4_{33}$, W layers $13_{11}$ to $13_{33}$ are formed respectively. Then, for example, the Cu layers $14_1$, $14_2$, and $14_3$ that form bit lines BL are formed with a damascene method. In the outer periphery portions of the Cu layers $14_1$, $14_2$, and $14_3$, the $SiO_2$ layer 15 is formed. Then, insulating layers $17_1$ and $17_2$ that are respectively between the Cu layers $14_1$ and $14_2$ and between the Cu layers $14_2$ and $14_3$ and extend in the Y-Y' direction in plan view and that respectively have holes $16_1$ and $16_2$ are formed. The hole $16_1$ is between the side surfaces of the $N^+$ layers $4_{11}$ to $4_{31}$ and the side surfaces of the $N^+$ layers $4_{12}$ to $4_{32}$, between the side surfaces of the W layers $13_{11}$ to $13_{31}$ and the side surfaces of the W layers $13_{12}$ to $13_{32}$, and between the side surface of the Cu layer $14_1$ and the side surface of the Cu layer $14_2$. The hole $16_2$ is between the side surfaces of the $N^+$ layers $4_{12}$ to $4_{32}$ and the side surfaces of the $N^+$ layers $4_{13}$ to $4_{33}$, between the side surfaces of the W layers $13_{12}$ to $13_{32}$ and the side surfaces of the W layers $13_{13}$ to $13_{33}$, and between the side surface of the Cu layer $14_2$ and the side surface of the Cu layer $14_3$. Accordingly, the dynamic flash memory is formed on the P-layer substrate.

Note that the $SiO_2$ layers $22_1$ and $22_2$ that respectively have the holes $21_1$ and $21_2$ may be formed of low-dielectric-constant material layers not having the holes $21_1$ and $21_2$. The $SiO_2$ layers $22_1$ and $22_2$ may be formed of other insulating material layers.

It is desirable that the upper ends of the holes $21_1$ and $21_2$ be at a level lower than the upper ends of the TiN layers $10_1$, $10_2$, and $10_3$, which are the second gate conductor layers, in the vertical direction. Further, the upper ends of the holes $21_1$ and $21_2$ may be at a level lower than the upper ends of the TiN layers $8_1$, $8_2$, and $8_3$, which are the first gate conductor layers, in the vertical direction.

Further, the holes $16_1$ and $16_2$ may be made so as to face the side surface of any of the W layers $13_{11}$ to $13_{33}$ or the Cu layers $14_1$ to $14_3$ or the side surfaces of any two continuous layers.

This embodiment has the following features.

Feature 1

In the fourth embodiment, as illustrated in FIG. 7GA to FIG. 7JC, the $HfO_2$ layers $6_{11}$ to $6_{33}$, which function as gate insulating layers, are continuously formed between the $N^+$ layers $4_{11}$ to $4_{33}$ on the top portions of the Si pillars $3_{11}$ to $3_{33}$ and the $N^+$ layer 2 on the bottom. Accordingly, gate insulating layers for the TiN layers $8_1$, $8_2$, and $8_3$, which form PL-line gates, and gate insulating layers for the TiN layers $10_1$, $10_2$, and $10_3$, which form WL-line gates, are formed of the same $HfO_2$ layers $6_{11}$ to $6_{33}$. In contrast, in this embodiment, the PL-line gate conductor layers $8_1$, $8_2$, and $8_3$, the WL-line gate conductor layers $10_1$, $10_2$, and $10_3$, and the gate insulating layers 6 and 18 are separately formed. Accordingly, for example, different thicknesses and different materials can be selected for the gate insulating layer 6 and the gate insulating layer 18 to make the capacitance $C_{PL}$ between the PL line and the floating body larger than the capacitance $C_{WL}$ between the WL line and the floating body more effectively. This contributes to more stable operations of the dynamic flash memory.

Feature 2

In the fourth embodiment, as illustrated in FIGS. 7IA, 7IB and 7IC, as an inter-layer insulating layer between the TiN layers $8_1$, $8_2$, and $8_3$, which are PL-line gates, and the TiN layers $10_1$, $10_2$, and $10_3$, which are WL-line gates, the $SiO_2$ layer 9 is formed. The $SiO_2$ layer 9 is formed by, for example, forming the TiN layers $8_1$, $8_2$, and $8_3$ as illustrated in FIGS. 7HA, 7HB and 7HC, subsequently laying the $SiO_2$ layer over the entire region, polishing the $SiO_2$ layer with the CMP method such that the upper surface thereof is on a level with the upper surfaces of the mask material layers $5_{11}$ to $5_{33}$, and performing etching back with RIE. In contrast, in this embodiment, as the inter-layer insulating layer corresponding to the $SiO_2$ layer 9, the $HfO_2$ layer 18 is formed as the second gate insulating layer and simultaneously as the inter-layer insulating layer corresponding to the $SiO_2$ layer 9 as illustrated in FIGS. 13BA, 13BB and 13BC. Accordingly, the production process is simplified.

Feature 3

As illustrated in FIG. 13CA and FIG. 13DC, in the contact holes $19_1$ and $19_2$, the holes $21_1$ and $21_2$ and the W layers $20_1$ and $20_2$ are formed respectively. Accordingly, the holes $21_1$ and $21_2$ and the W layers $20_1$ and $20_2$ are formed by self-aligning. The W layers $20_1$ and $20_2$ lower the resistance in the region of the $N^+$ layer 2 of the SL line to thereby contribute to more stable operations of the dynamic flash memory. The holes $21_1$ and $21_2$ can reduce the parasitic capacitances among the PL-line TiN layers $8_1$, $8_2$, and $8_3$ and the WL-line TiN layers $10_1$, $10_2$, and $10_3$. This reduction in the parasitic capacitances can contribute to an increase in the operation margin of the dynamic flash memory. The holes $21_1$ and $21_2$ and the W layers $20_1$ and $20_2$ are formed by self-aligning, which contributes to higher integration of the dynamic flash memory. Note that the W layers $20_1$ and $20_2$ need not be formed in the memory cell region, and an SL-line metal wiring portion that is connected to the $N^+$ layer 2 may be formed in a periphery portion of the memory cell region. In this case, the SL-line resistance becomes higher than in a case where the W layers $20_1$ and $20_2$ are present. However, the effect of reducing the parasitic capacitances among the PL-line TiN layers $8_1$, $8_2$, and $8_3$ and the WL-line TiN layers $10_1$, $10_2$, and $10_3$ remains unchanged, and a highly precise production process for connecting the W layers $20_1$ and $20_2$ to the $N^+$ layer 2 with certainty is not necessary. Accordingly, whether to form the W layers $20_1$ and $20_2$ can be determined by taking into consideration lowering of the SL-line resistance and simplification of the production process.

Feature 4

The hole $16_1$ formed between the side surfaces of the $N^+$ layers $4_{11}$ to $4_{31}$ and the side surfaces of the $N^+$ layers $4_{12}$ to $4_{32}$, between the side surfaces of the W layers $13_{11}$ to $13_{31}$ and the side surfaces of the W layers $13_{12}$ to $13_{32}$, and between the side surface of the Cu layer $14_1$ and the side surface of the Cu layer $14_2$, and the hole $16_2$ formed between the side surfaces of the $N^+$ layers $4_{12}$ to $4_{32}$ and the side surfaces of the $N^+$ layers $4_{13}$ to $4_{33}$, between the side surfaces of the W layers $13_{12}$ to $13_{32}$ and the side surfaces of the W layers $13_{13}$ to $13_{33}$, and between the side surface of the Cu layer $14_2$ and the side surface of the Cu layer $14_3$ illustrated in FIGS. 13EA, 13EB and 13EC can reduce the parasitic capacitance between the bit lines BL. This can contribute to more stable operations of the dynamic flash memory.

Eleventh Embodiment

Figure 14:
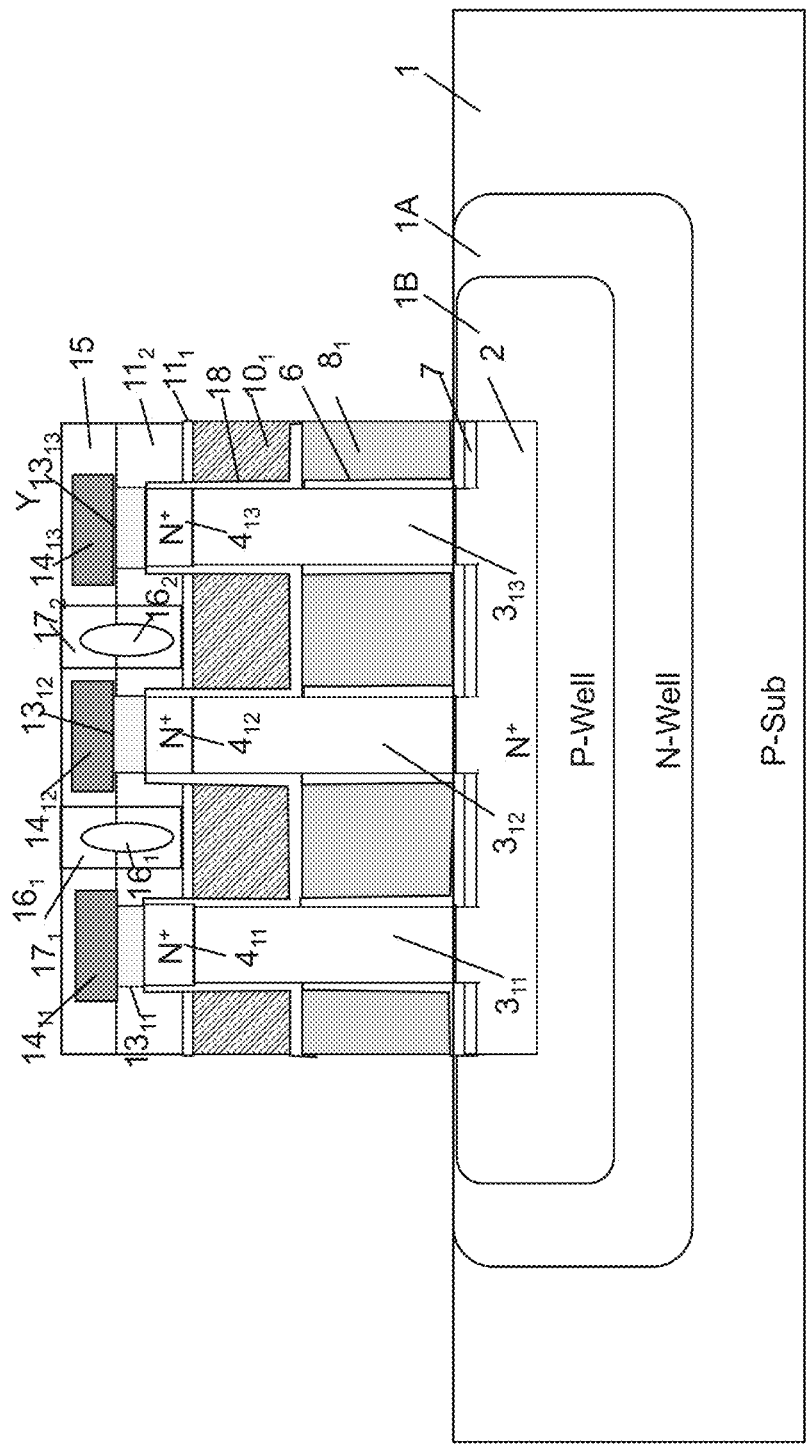
FIG. 14 is a cross-section structural view for explaining a production method for a two-layer well structure provided in a P-layer substrate of a dynamic flash memory according to an eleventh embodiment.
Figure 15B:
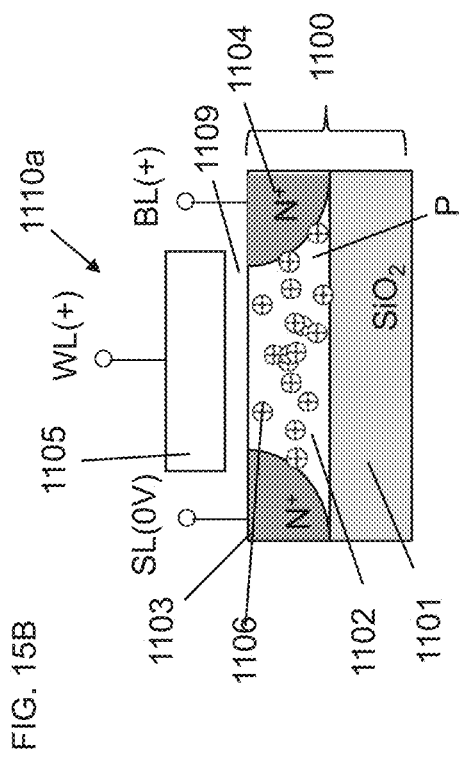
FIG. 15B is a diagram illustrating the write operation of a DRAM memory cell including no capacitor in the related art.
Figure 15D:
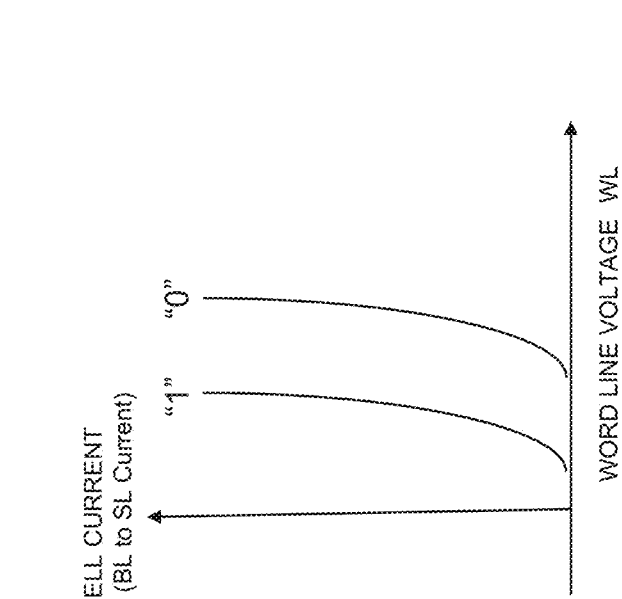
FIG. 15D is a diagram illustrating the write operation of a DRAM memory cell including no capacitor in the related art.
Figure 15A:
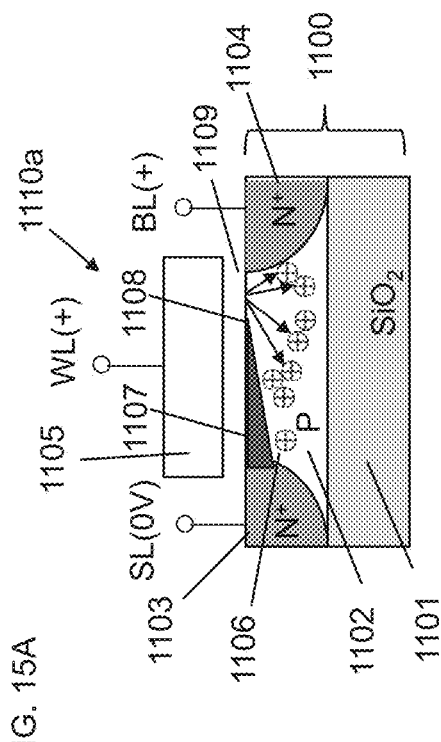
FIG. 15A is a diagram illustrating a write operation of a DRAM memory cell including no capacitor in the related art.
Figure 15C:
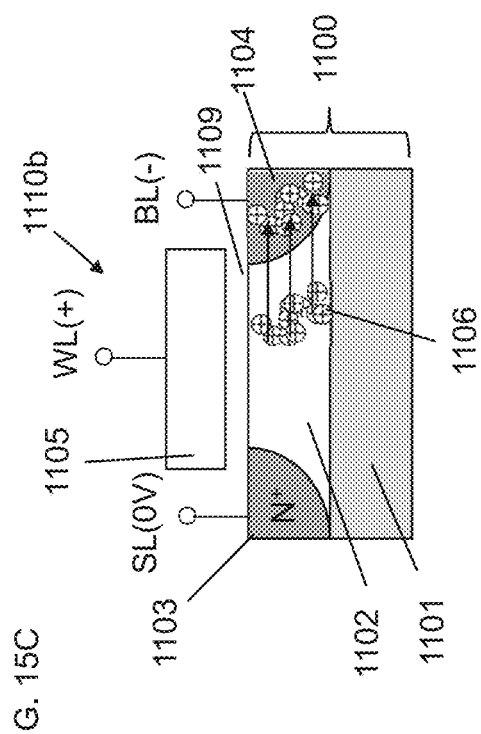
FIG. 15C is a diagram illustrating the write operation of a DRAM memory cell including no capacitor in the related art.
Figures 16A, 16B:
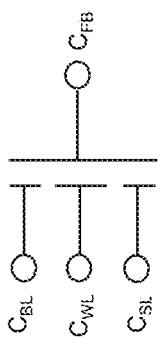
FIG. 16A is a diagram for explaining problems in the operation of the DRAM memory cell including no capacitor in the related art.
FIG. 16B is a diagram for explaining problems in the operation of the DRAM memory cell including no capacitor in the related art.

With reference to FIG. 14, a production method for a two-layer well structure provided in the P-layer substrate 1 of a dynamic flash memory according to an eleventh embodiment is described.

As illustrated in FIG. 14, for example, phosphorus P or arsenic As is ion-implanted into the P-layer substrate 1 to form an N-well layer 1A. Subsequently, for example, boron B is ion-implanted into the N-well layer 1A to form a P-well layer 1B. This two-layer well structure is a solution for allowing application of a negative bias to the source line SL at the time of an erase operation of the dynamic flash memory of the present application. Such a two-layer well structure is employed so that a negative bias applied to the source line SL does not affect a PN junction of another peripheral circuit or a transistor circuit.

Subsequently, the processes illustrated in FIG. 7AA to FIG. 7FC and the processes illustrated in FIG. 13AA to FIG. 13EC are performed.

This embodiment has the following feature.

In an erase operation of the dynamic flash memory of the present application, a negative bias is applied to the source line SL. When the two-well structure is provided in the P-layer substrate 1 in the memory cell region, the other circuits can be shielded from the negative bias.

Other Embodiments

In the present invention, Si pillars are formed; however, semiconductor pillars made of a semiconductor material other than Si may be formed. The same applies to other embodiments of the present invention.

The $N^+$ layers 101a and 101b, in the first embodiment, that function as the source and the drain may be formed of Si containing a donor impurity or other semiconductor material layers. The $N^+$ layers 101a and 101b that function as the source and the drain may be formed of different semiconductor material layers. The same applies to other embodiments of the present invention.

As the $N^+$ layer 101b formed on the top of each Si pillar 100 in the fourth embodiment, the $N^+$ layer 4 that is an $N^+$ layer formed with the epitaxial crystal growth method on top of the epitaxially grown P-layer 3 as illustrated in FIGS. 7DA, 7DB and 7DC may be used. The $N^+$ layer may be formed with other methods. The same applies to other embodiments of the present invention.

In the fourth embodiment, as illustrated in FIGS. 7GA, 7GB and 7GC, the hafnium oxide ($HfO_2$) layers $6_{11}$ to $6_{33}$, which function as gate insulating layers, are formed around the Si pillars $3_{11}$ to $3_{33}$ respectively. However, the hafnium oxide ($HfO_2$) layers $6_{11}$ to $6_{33}$ may be formed of other material layers containing an organic material or an inorganic material and each formed of a single layer or a plurality of layers as long as the material is suitable for the object of the present invention. The same applies to other embodiments of the present invention.

In the fourth embodiment, as illustrated in FIGS. 7EA, 7EB and 7EC, the mask material layers $5_{11}$ to $5_{33}$ deposited on top of the $N^+$ layer 4 are left by patterning in regions in which Si pillars are formed. The mask material layers $5_{11}$ to $5_{33}$ may be formed of other material layers containing an organic material or an inorganic material, such as $SiO_2$ layers or aluminum oxide (also called $Al_2O_3$ or AlO) layers, and each formed of a single layer or a plurality of layers as long as the material is suitable for the object of the present invention. The same applies to other embodiments of the present invention.

In the fourth embodiment, the mask material layers $5_{11}$ to $5_{33}$ are formed such that the positions of the upper surfaces thereof in the vertical direction are the same and the positions of the bottom portions thereof in the vertical direction are the same; however, the positions of the upper surfaces in the vertical direction may be different and the positions of the bottom portions in the vertical direction may be different as long as such differences are suitable for the object of the present invention. The same applies to other embodiments of the present invention.

In the fourth embodiment, the thicknesses and the forms of the mask material layers $5_{11}$ to $5_{33}$ change due to polishing with CMP, RIE etching, and washing. This change may have no problem as long as the change occurs to a certain degree that is suitable for the object of the present invention. The same applies to other embodiments of the present invention.

In the fourth embodiment, each of the wiring metal layers WL, PL, BL, and SL need not be made of a metal material and may be formed of a single conductive material layer, such as a semiconductor layer, containing an alloy and an acceptor or donor impurity in high concentrations or a combination of a plurality of such conductive material layers. The same applies to other embodiments of the present invention.

In the fourth embodiment, as the gate conductor layers, TiN layers are used. Each TiN layer can be formed by using a material layer formed of a single layer or a plurality of layers as long as the material is suitable for the object of the present invention. The TiN layer can be formed of a conductive layer having at least a desired work function and formed of, for example, a single metal layer or a plurality of metal layers. On the outer side of the TiN layer, another conductive layer, such as a W layer, may be formed. Other than the W layer, a single metal layer or a plurality of metal layers may be used. In this case, the W layer assumes a role as a metal wiring layer that connects the gate metal layer. As the gate insulating layers, the hafnium oxide ($HfO_2$) layers $6_{11}$ to $6_{33}$, which function as the gate insulating layers, are formed around the Si pillars $3_{11}$ to $3_{33}$. Each of the $HfO_2$ layers $6_{11}$ to $6_{33}$ may be formed by using another material layer formed of a single layer or a plurality of layers. The same applies to other embodiments of the present invention.

In the fourth embodiment, the Si pillars $3_{11}$ to $3_{33}$ have a round shape in plan view. Some or all of the Si pillars $3_{11}$ to $3_{33}$ may have, for example, a round shape, an elliptic shape, or a shape elongated in one direction in plan view. Also, in a logic circuit region formed apart from the dynamic flash memory cell region, Si pillars having different shapes in plan view may be mixed and formed in accordance with the logic circuit design. The same applies to other embodiments of the present invention.

In the fourth embodiment, after the Si pillars $3_{11}$ to $3_{33}$ are formed in FIGS. 7FA, 7FB and 7FC, an alloy layer made of, for example, metal or silicide may be formed on the upper surface of the $N^+$ layer 2 in the outer periphery portions of the Si pillars $3_{11}$ to $3_{33}$. Alternatively, a metal layer or an alloy layer that is in contact with and extends from the $N^+$ layer 2 may be formed. The same applies to other embodiments of the present invention.

In the fourth embodiment, dynamic flash memory cells are formed on the P-layer substrate 1; however, an SOI substrate may be used instead of the P-layer substrate 1. Alternatively, a substrate made of other materials may be used as long as the substrate assumes the role as the substrate. The same applies to other embodiments of the present invention.

In the first embodiment, a dynamic flash memory cell in which the source and the drain are formed by using the $N^+$ layers 101a and 101b having conductivity of the same polarity and formed on the bottom and the top of the Si pillar 100 is described. The present invention is applicable to a tunnel-type device having a source and a drain of different polarities. The same applies to other embodiments of the present invention.

In the fourth embodiment, after the $N^+$ layers $4_{11}$ to $4_{33}$ are formed as illustrated in FIGS. 7FA, 7FB and 7FC, the hafnium oxide ($HfO_2$) layers $6_{11}$ to $6_{33}$, which function as the gate insulating layers, are formed around the Si pillars $3_{11}$ to $3_{33}$, the TiN layer is etched with the RIE method to form the TiN layers $8_1$, $8_2$, and $8_3$, which are the first gate conductor layers, and the TiN layer is etched with the RIE method to form the TiN layers $10_1$, $10_2$, and $10_3$, which are the second gate conductor layers. In contrast, the hafnium oxide ($HfO_2$) layers $6_{11}$ to $6_{33}$, which function as the gate insulating layers, may be formed around the Si pillars $3_{11}$ to $3_{33}$, the TiN layer may be etched with the RIE method to form the TiN layers $8_1$, $8_2$, and $8_3$, which are the first gate conductor layers, and the TiN layers $10_1$, $10_2$, and $10_3$, which are the second gate conductor layers, may be formed, and thereafter, the $N^+$ layers $4_{11}$ to $4_{33}$ may be formed. The same applies to other embodiments of the present invention.

In the fourth embodiment, the P-layer 3 is formed with the epitaxial growth method as illustrated in FIGS. 7CA, 7CB and 7CC. In contrast, a thin single-crystal Si layer may be formed with the ALD method, and thereafter, a $P^+$ layer containing an acceptor impurity may be formed with the epitaxial crystal growth method. The thin single-crystal Si layer is a material layer for obtaining the P-layer 3 of high crystallinity. Another material layer formed of a single layer or a plurality of layers may be used as long as the P-layer 3 of high crystallinity can be obtained with the material layer.

In the fourth embodiment, the $HfO_2$ layers are used as the gate insulating layers; however, each of the $HfO_2$ layers may be formed by using another material layer formed of a single layer or a plurality of layers. The same applies to other embodiments of the present invention.

In the first embodiment, the Si pillar 100 has a round shape in plan view. The Si pillar 100 may have a round shape, a rectangular shape, or an elliptic shape in plan view. The same applies to other embodiments of the present invention.

In the first embodiment and the fifth embodiment, a negative bias is applied to the source line SL at the time of an erase operation to remove the group of positive holes in the floating body FB; however, instead of applying a negative bias to the source line SL, a negative bias may be applied to the bit line BL or a negative bias may be applied to the source line SL and the bit line BL to perform an erase operation. The same applies to other embodiments of the present invention.

In FIGS. 7AA to 7MC and FIGS. 13AA to 13EC, the Si pillars $3_{11}$ to $3_{33}$ are arranged in a square lattice in plan view. In contrast, the Si pillars $3_{11}$ to $3_{33}$ may be arranged in a diagonal lattice. The same applies to other embodiments of the present invention.

In FIGS. 13DA, 13DB and 13DC, the W layers $20_1$ and $20_2$ are formed so as to be in contact with the $N^+$ layer 2. In contrast, the W layers $20_1$ and $20_2$ need not be formed adjacent to the Si pillars $3_{11}$ to $3_{33}$ and may be formed outside the region in which the plurality of Si pillars are provided in plan view. The same applies to other embodiments of the present invention.

Various embodiments and modifications can be made to the present invention without departing from the spirit and scope of the present invention in a broad sense. The above-described embodiments are intended to explain examples of the present invention and not intended to limit the scope of the present invention. Any of the above-described embodiments and modifications can be combined. Further, the above-described embodiments from which some of the constituent requirements are removed as needed are also within the scope of the technical spirit of the present invention.

With the memory device according to the present invention, a high-performance and highly integrated dynamic flash memory can be obtained.

What is claimed is:

1. A semiconductor memory device comprising:
   a columnar semiconductor body being extensive for a length and supported by a substrate, the columnar semiconductor body connecting to a first impurity region and a second impurity region located, respectively, at end portions of the length of the columnar semiconductor body, wherein the first and second impurity regions are doped with impurities to have an identical conductivity type;
   a first gate conductor layer and a second gate conductor layer formed separately from each other along the length of the columnar semiconductor body and arranged at least partially around the columnar semiconductor body; and
   at least one gate insulator provided to insulate the first and second gate conductor layers from the semiconductor columnar body,
   wherein the first and second gate conductor layers, the first impurity region and the second impurity region individually provide terminals of the semiconductor memory device, a set of data write biases is applied across the terminals to generate majority carriers, as memory data charges, inside the columnar semiconductor body by either an occurrence of an impact ionization phenomenon or by means a gate-induced drain leakage current, and a set of data erase biases is applied across the terminals to draw the majority carriers out of the columnar semiconductor body.

2. The semiconductor memory device according to claim 1, wherein a first inversion layer is formed in an outer periphery portion of a first region of the columnar semiconductor body surrounded by the first gate conductor layer to operate the first region in a saturation region and to form a pinch-off point in a vicinity of an end portion of the first inversion layer,
   a second inversion layer is formed in an outer periphery portion of a second region of the columnar semiconductor body surrounded by the second gate conductor layer to operate the second region linearly, and
   the second inversion layer functions as a drain to cause the impact ionization phenomenon to occur in a boundary between the first inversion layer and the second inversion layer.

3. The semiconductor memory device according to claim 1, further comprising a first PN junction between the first impurity region and the columnar semiconductor body and a second PN junction between the second impurity region and the columnar semiconductor body, wherein application of the set of data erase biases to the terminal turns the first and second PN junctions into a reverse bias state.

4. The semiconductor memory device according to claim 2, wherein the first impurity region is connected to a source line, the second impurity region is connected to a bit line, and the first conductor layer and the second conductor layer are connected, separately, to a word line and a first driving control line, and
   the set of data write biases or data erase biases is applied to the source line, the bit line, the first driving control line, and the word line to selectively perform a data erase operation or a data write operation.

5. The semiconductor memory device according to claim 4, wherein the source line is orthogonal to the bit line and the first driving control line in plan view.

6. The semiconductor memory device according to claim 1, wherein the first gate conductor layer and the columnar semiconductor body have a first gate capacitance between them that is larger than a second gate capacitance between the second gate conductor layer and the columnar semiconductor body.

7. The semiconductor memory device according to claim 6, wherein the first gate capacitance is made larger than the second gate capacitance by means of any or any combination of:
   (a) making a first channel length of the first gate conductor layer longer than a second channel length of the second gate conductor layer;
   (b) making a first gate insulator covered with the first gate conductor layer thinner than a second gate insulator covered with the second gate conductor layer; and
   (c) making a relative dielectric constant of the first gate insulator larger than a relative dielectric constant of the second gate insulator.

8. The semiconductor memory device according to claim 1, wherein the first impurity region and the second impurity region are N-type semiconductor layers, and the columnar semiconductor body is a P-type semiconductor layer or a neutral semiconductor layer.

9. The semiconductor memory device according to claim 1, wherein application of the set of data write biases to the terminals causes a group of positive holes to be generated by the impact ionization phenomenon and stored within the columnar semiconductor body, and
   increase of the positive holes stored in the columnar body causes a threshold voltage of the first or second gate conductor layer to decrease in a way that allows a bias applied to either the first or second gate conductor layer to decrease.

10. The semiconductor memory device according to claim 1, wherein application of the set of data write biases to the terminals causes a group of positive holes to be generated by the impact ionization phenomenon and stored in the columnar semiconductor body, and
    increase of the positive holes stored in the columnar semiconductor body causes a current flowing through the columnar semiconductor body to increase, and causes the impact ionization phenomenon to become more significant to enhance data writing by a positive feedback.

11. The semiconductor memory device according to claim 4, wherein application of the set of data write biases or the set of data read biases to the terminals causes an inversion layer to be formed in the outer periphery portion of the first or second region of the columnar semiconductor body connected to the first driving control line.

12. The semiconductor memory device according to claim 1, wherein the columnar semiconductor body is formed horizontally along the substrate.

13. The semiconductor memory device according to claim 1, wherein the columnar semiconductor body is formed perpendicular to the substrate.

14. The semiconductor memory device according to claim 1, wherein the at least one gate insulator is formed of an identical material to insulate both the first and second gate conductor layers from the semiconductor columnar body.

15. The semiconductor memory device according to claim 1, wherein the at least one gate insulator is formed of different material layers to insulate the first gate conductor layer and the second gate conductor layer, respectively.

16. The semiconductor memory device according to claim 13, further comprising a first insulating material layer disposed adjacent to the first gate conductor layer and the second gate conductor layer and configured to extend in a vertical direction relative to the substrate, wherein the first insulating material layer is formed with or without a hole.

17. The semiconductor memory device according to claim 16, wherein the first insulating material layer is formed of a low-dielectric-constant material.

18. The semiconductor memory device according to claim 13, further comprising a second insulating material layer disposed adjacent to at least one of a first wiring conductor layer connected to the first impurity region and a second wiring conductor layer connected to the second impurity region, wherein the second insulating material layer is formed with or without a hole.

19. The semiconductor memory device according to claim 18, wherein the second insulating material layer is formed of a low-dielectric-constant material.

20. The semiconductor memory device according to claim 16, further comprising a first conductor layer extending in a horizontal direction, wherein the first conductor layer is disposed at a bottom of the first insulating material layer and connected to the first gate conductor layer.

21. The semiconductor memory device according to claim 1, further comprising a first impurity well layer formed in the substrate, and a second impurity well layer formed in the first impurity well layer, wherein the columnar semiconductor body is formed on the second impurity well layer in parallel to or in perpendicular to the substrate.

22. The semiconductor memory device according to claim 21, wherein the substrate is formed of a P-type semiconductor, the first impurity well layer is formed of an N-type semiconductor, and the second impurity well layer is formed of a P-type semiconductor, and a negative bias is applied to the second impurity well layer when a data erase operation is performed.

23. The semiconductor memory device according to claim 1, wherein the first gate conductor layer is divided into a plurality of portions, and an identical driving bias or different driving biases are applied to the plurality of portions of the first gate conductor layer, either synchronously or asynchronously.

24. The semiconductor memory device according to claim 1, wherein the second gate conductor layer is divided into a plurality of portions, and an identical driving bias or different driving biases are applied to the plurality of portions of the second gate conductor layer, either synchronously or asynchronously.

* * * * *